United States Patent
Ohyu et al.

(10) Patent No.: US 6,573,546 B2
(45) Date of Patent: Jun. 3, 2003

(54) SEMICONDUCTOR INTEGRATED CIRCUIT DEVICE AND PROCESS FOR MANUFACTURING THE SAME

(75) Inventors: Kiyonori Ohyu, Ohme (JP); Makoto Ohkura, Fuchu (JP); Aritoshi Sugimoto, Tokyo (JP); Yoshitaka Tadaki, Hannou (JP); Makoto Ogasawara, Akishima (JP); Masashi Horiguchi, Kanagawa (JP); Norio Hasegawa, Hinode-machi (JP); Shinichi Fukada, Hino (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/922,673

(22) Filed: Aug. 7, 2001

(65) Prior Publication Data

US 2002/0000595 A1 Jan. 3, 2002

Related U.S. Application Data

(62) Division of application No. 09/159,754, filed on Sep. 24, 1998, now Pat. No. 6,291,847.

(30) Foreign Application Priority Data

Sep. 24, 1997 (JP) .............................. 9-259105

(51) Int. Cl.$^7$ ................ H01L 27/108; H01L 29/76; H01L 29/94; H01L 31/119

(52) U.S. Cl. ................................................ 257/296
(58) Field of Search ......................... 257/295–310; 438/253–254

(56) References Cited

U.S. PATENT DOCUMENTS 5,422,839 A * 6/1995 Ishibashi et al. .............. 365/51
5,684,316 A 11/1997 Lee

FOREIGN PATENT DOCUMENTS

| JP | 1-213900 | | 8/1989 |
|----|----------|---|--------|
| JP | 403263697 A | * | 11/1991 |
| JP | 4-67669 | | 3/1992 |
| JP | 4-232688 | | 8/1992 |
| JP | 7-244997 | | 9/1995 |

* cited by examiner

Primary Examiner—Cuong Quang Nguyen
(74) Attorney, Agent, or Firm—Antonelli, Terry, Stout & Kraus, LLP

(57) ABSTRACT

A field oxide film 3 in a region where relief cells are formed is made wider than the field oxide film 3 in a region where normal memory cells are formed thereby to make a field relaxation layer 8r of the relief cells deeper than the field relaxation layer 8 of the normal cells, and the depletion layer of the sources and drains (n-type semiconductor regions) of the relief cells is widened to weaken the junction field.

3 Claims, 49 Drawing Sheets

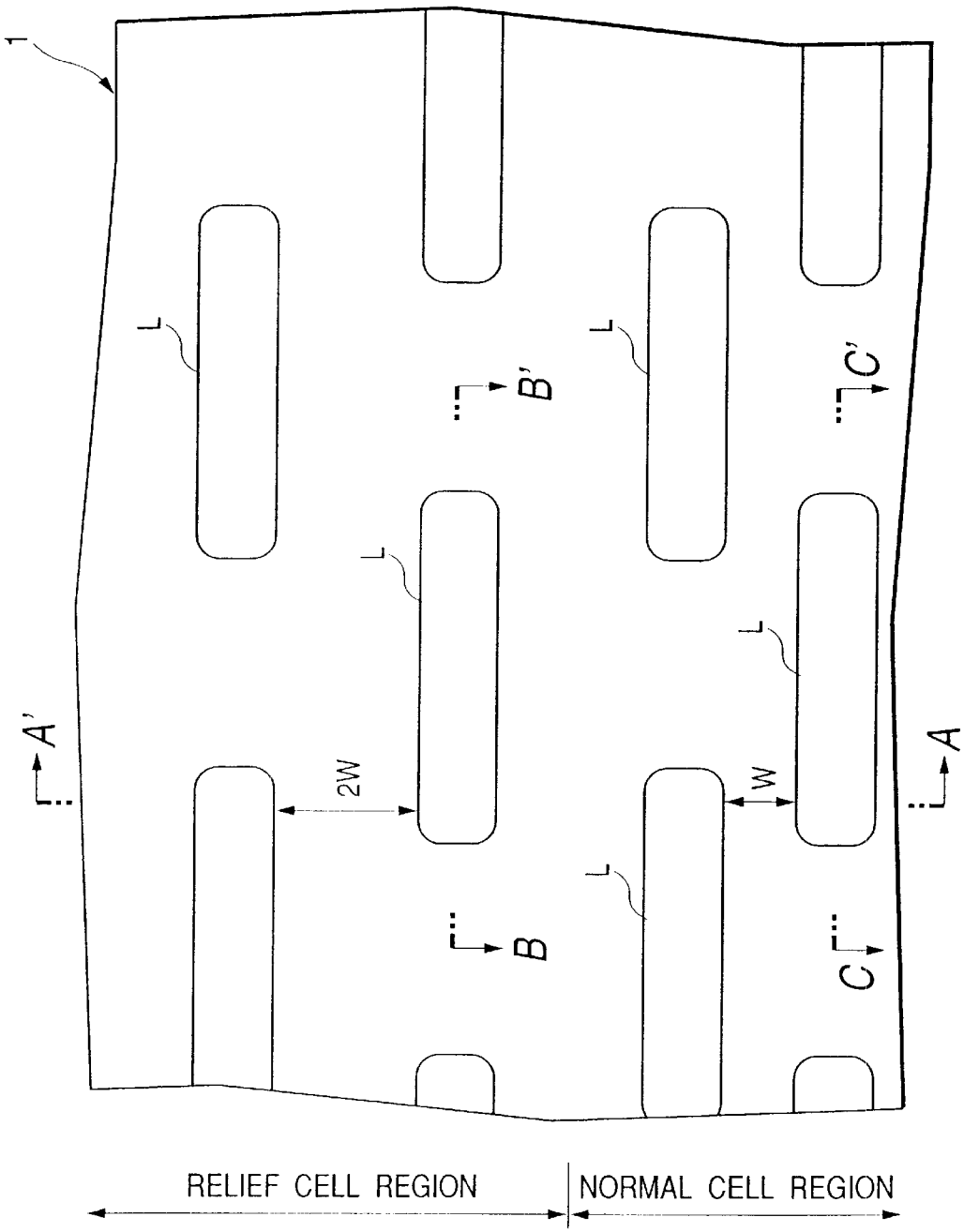

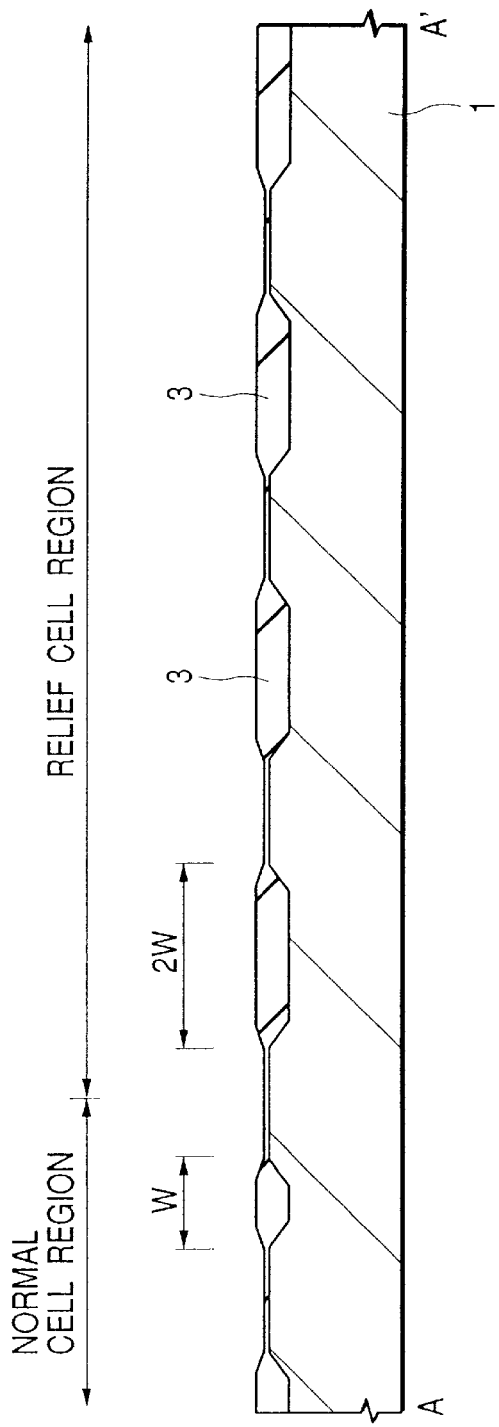
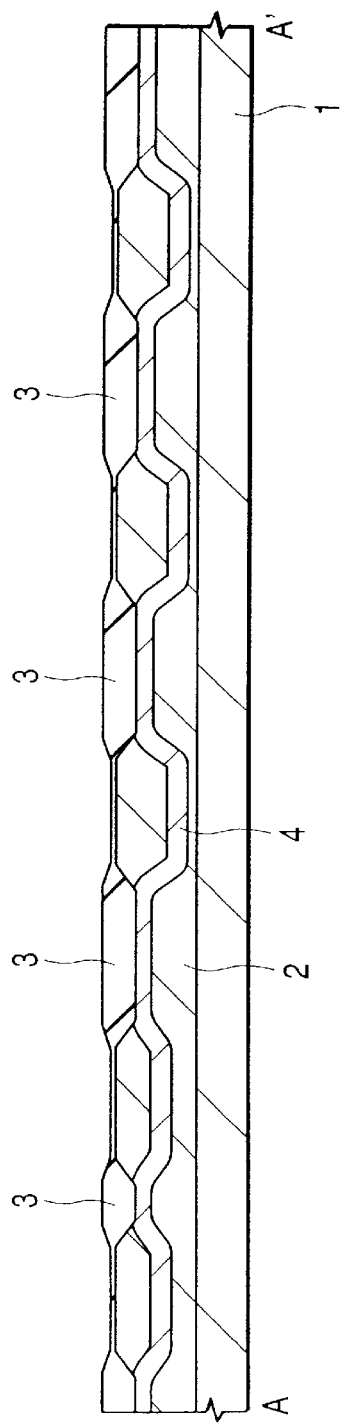

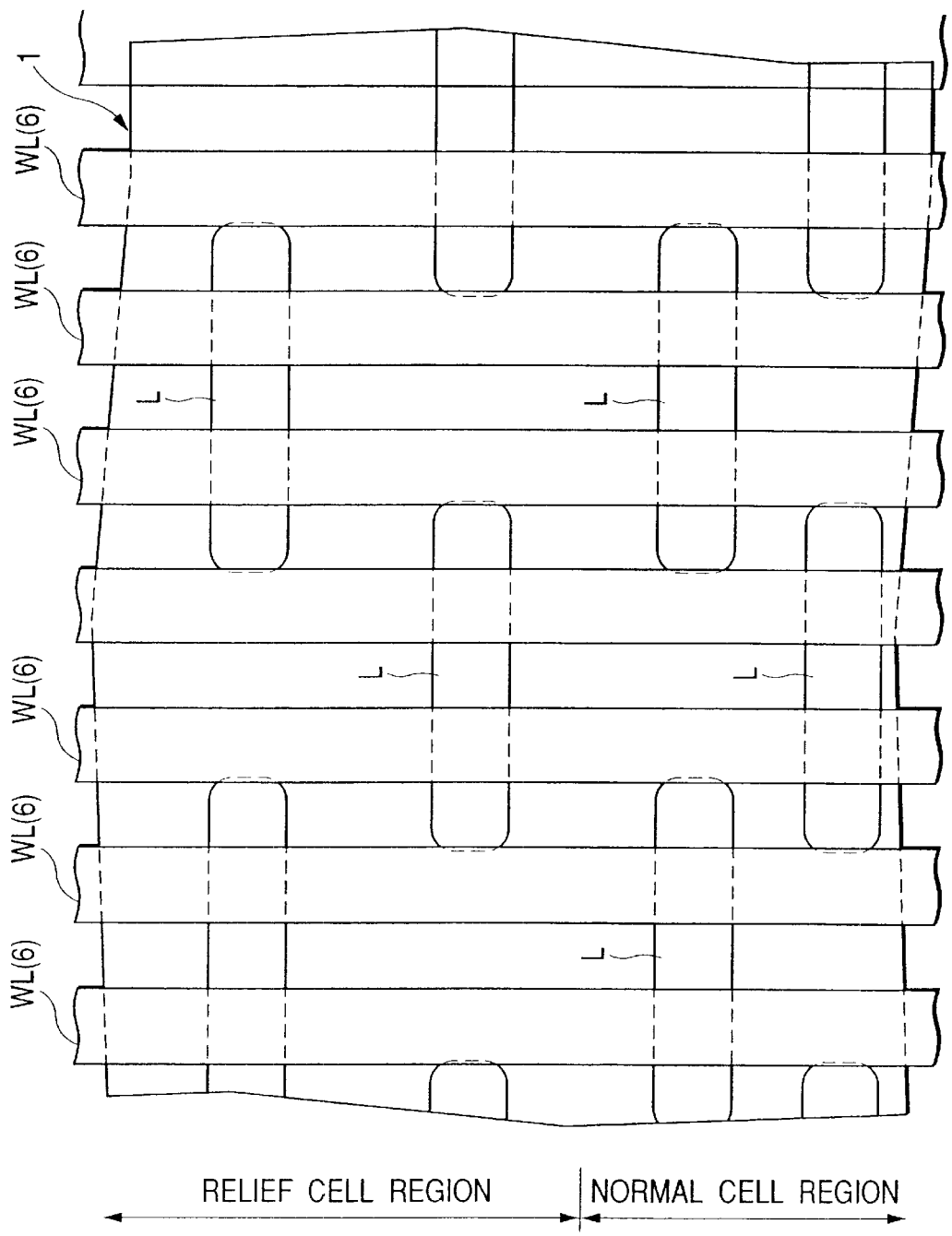

SOLID LINES : INVENTION
BROKEN LINES : BEFORE COUNTERMEASURES

RELIEF CELL REGION | NORMAL CELL REGION

RELIEF CELL REGION | NORMAL CELL REGION

SEMICONDUCTOR INTEGRATED CIRCUIT DEVICE AND PROCESS FOR MANUFACTURING THE SAME

CROSS-REFERENCE TO RELATED APPLICATION

This application is a divisional of Ser. No. 09/159,754, filed on Sep. 24, 1998, U.S. Pat. No. 6,291,847, the entire disclosure of which is hereby incorporated by reference.

BACKGROUND OF THE INVENTION

The present invention relates to a semiconductor integrated circuit device and a process for manufacturing the same and, more particularly, to a technique effective when applied to a structure for relieving a fault of a DRAM (Dynamic Random Access Memory).

A DRAM, which is provided with a memory array including a plurality of word lines and a plurality of bit lines so arranged as to intersect each other at a right angle, and a plurality of memory cells arranged at the individual intersections, is equipped with a preparatory redundancy circuit including cells in a portion of the memory array and having the same structure and size as those of normal memory cells, so that a faulty product percentage may be reduced by replacing the lines (word lines or bit lines), for which defective cells are detected at a wafer testing time, by redundant lines.

Japanese Patent Laid-Open No. 4-232688/1992 has disclosed a DRAM which is intended to elongate a refresh cycle. This DRAM includes a plurality of redundant memory cells, a decoder for fetching the addresses of the memory cells and a switch circuit, and the refresh cycle is so adjusted as to become longer for the normal memory cells than that for the defective cells having inferior information holding characteristics. The decoder generates a first output when the fetched address is the one of a normal memory cell, and a second output when the fetched address is the one of a defective cell. The switch circuit is adapted to block an access to the defective cell by allowing the access to the relief cells in response to the first output.

Japanese Patent Laid-Open No. 7-244997/1995 has disclosed a DRAM which can use word lines (word lines connected with a defective cell having inferior information holding characteristics) having a leakage trouble, without increasing the chip size. This DRAM is equipped in its redundancy address decoder with memory means (fuse) for indicating that a trouble of a word line assigned to a redundant one is a leakage trouble, and is given a function to bring the word line and the redundant word line simultaneously into a selected state if the trouble of the word line assigned to the redundant one is the leakage trouble. Consequently even when the redundant word line assigned to the word line having the leakage trouble has a similar leakage trouble, this trouble can be relieved by doubling the substantial information storage capacity of the memory cells.

Japanese Patent Laid-Open No. 1-213900/1989 has disclosed a semiconductor memory device which is equipped with a redundancy circuit having a high-performance sense amplifier connected with relief cells so as to relieve the sense amplifier fault, caused by an erroneous operation due to noise. This sense amplifier is hardly influenced by noise because it is so constructed as to include MOS transistors of high driving ability, which have a larger gate length and width than those of MOS transistors constituting a sense amplifier connected with normal memory cells. As a result, the sense amplifier, connected with the normal memory cells, can be reliably relieved even if it is erroneously operated because of noise.

Japanese Patent Laid-Open No. 4-67669/1992 has disclosed a semiconductor memory device in which the degree of miniaturization (the sizes and spacings of transistors, bit lines and word lines constituting a redundancy circuit) of a redundancy circuit is set larger than that of a main circuit part so as to avoid the fault of the redundancy circuit, as might otherwise be caused by dust or the like.

SUMMARY OF THE INVENTION

According to our investigations, the above-specified defect relieving techniques of the prior art have the following problems.

The refresh time period of the DRAM becomes longer as the degree of integration becomes higher in accordance with the JEDEC (Joint Electron Device Engineering Council) standards. As the degree of integration rises, the memory cell size is more miniaturized to shorten the element isolation length, so that the junction field intensity is raised because the substrate density is set high. As a result, the leakage current due to the electric field increases to shorten the information holding time period of the memory cells. With the increase in the degree of integration, the number of defective cells having information holding time periods shorter than the standards increases, so that the number of relief cells has to be enlarged.

When the structure and size of the relief cells are identical to those of the normal memory cells, however, the probability that cells having short information holding time periods are contained even after the relief is enhanced if the number of relief cells is enlarged for every increase in the degree of integration. Assume that relief of several tens of bits is necessary for a DRAM of 64 Mbits (mega bits), relief of several hundreds of bits is necessary for a DRAM of 256 Mbits, and relief of several thousands of bits is necessary for a DRAM of 1 Gbits (giga bits). Four bit lines are replaced for relieving 1 bit, so that about one thousand bits (256 bits×4) must be replaced. In DRAMs of 64 Mbits, 256 Mbits and 1 Gbits, therefore, several tens Kbits, several hundreds of Kbits and several Mbits must be respectively replaced. As the degree of integration rises, therefore, the probability that faulty bits are contained in the relief cells even after the relief rises. The drops in the production yield due to this fault are 1% or less, several % to about 10%, and several tens % to 100%, respectively, for DRAMs of 64 Mbits, 256 Mbits and 1 Gbits. In other words, arises a problem that the production yield becomes lower for every increase in degree of integration.

The defect relieving structure disclosed in Japanese Patent Laid-Open No. 4-232688/1992 leads to a complicated manufacture process because it has to be additionally equipped with a circuit (nonvolatile memory) for storing the addresses of the normal cells and the defective cells. Moreover, the chip area is enlarged because the structure has to be additionally equipped with a peripheral circuit for making an access to the relief cells in a circuit manner. Likewise, the defect relieving structure disclosed in Japanese Patent Laid-Open No. 7-244997/1995, cannot be free from the increase in the chip area because it also has to be additionally equipped with a peripheral circuit for selecting a word line and a redundant word lines doubly.

The structure (disclosed in Japanese Patent Laid-Open No. 1-213900/1989), in which a high-performance sense amplifier is connected with the relief cells, cannot be a countermeasure against the aforementioned problem that the probability of containing the cells having a short information holding time period even after the relief becomes higher as the number of relief cells is increased more for every increase in degree of integration.

The structure (disclosed in Japanese Patent Laid-Open No. 4-67669/1992), in which the degree of miniaturization of the redundancy circuit is made higher than that of the main circuit part, raises no problem in fabrication and layout when applied to an SRAM (Static Random Access Memory), for example. However, there arises a serious problem in constructing the cells when applied to a DRAM. Moreover, the extension of the information holding time period or the problem intrinsic to DRAMs cannot be realized even if only the sizes and spacings of the transistors, bit lines and word lines constituting the redundancy circuit are made larger than those of the main circuit part.

An object of the invention is to provide a technique capable of extending the refresh time period of the relief cells of a DRAM with inviting neither a drastic increase in the chip area nor a complexity of the process.

The above-specified object and other objects and novel features of the invention will become apparent from the following description with reference to the accompanying drawings.

The summary of representatives of the aspects of the invention to be disclosed herein will be briefly described in the following.

(1) According to the invention, there is provided a semiconductor integrated circuit device comprising a DRAM having a plurality of memory cells and a plurality of relief cells formed in a memory array, wherein the element isolation width of the region having the relief cells is made larger than that of the region having the memory cells.

(2) In a semiconductor integrated circuit device, the impurity concentration of a semiconductor substrate under an element isolation region in the region having the relief cells is lower than that of a semiconductor substrate under an element isolation region in the region having the memory cells.

(3) In a semiconductor integrated circuit device, the spacings of bit lines to be connected with the relief cells are larger than those of bit lines to be connected with the memory cells.

(4) In a semiconductor integrated circuit device, each of the memory cells and the relief cells includes a memory cell selecting MISFET and an information storing capacitive element connected in series with the MISFET, and the lower electrodes of the information storing capacitive element in the relief cells have a larger occupation area than that of the lower electrodes of the information storing capacitive elements in the memory cells.

(5) In a semiconductor integrated circuit device, each of the memory cells and the relief cells includes a memory cell selecting MISFET and an information storing capacitive element connected in series with the MISFET, and under the sources and drains of the memory cell selecting MISFETs in the memory cells and under the sources and drains of the memory cell selecting MISFETs in the relief cells, there are formed field relaxation layers of the same conductivity type as that of the sources and drains.

(6) In a semiconductor integrated circuit device, the element isolation is achieved by a field oxide film which is formed by a local oxidation method.

(7) In a semiconductor integrated circuit device, the element isolation width of the region having the relief cells is 1.5 to 2 times as large as that of the region having the memory cells.

(8) According to the invention, there is provided a semiconductor integrated circuit device comprising a DRAM having a plurality of memory cells and a plurality of relief cells formed in a memory array, wherein the width of the active region having the relief cells is larger than the active region having the memory cells.

(9) In a semiconductor integrated circuit device, each of the memory cells and the relief cells includes a memory cell selecting MISFET and an information storing capacitive element connected in series with the MISFET, and a through hole for connecting one of the source and drain of each memory cell selecting MISFET in the relief cells to the lower electrode of the information storing capacitive element has mutually different diameters in a first direction and in a second direction perpendicular to the first direction.

(10) According to the invention, there is provided a semiconductor integrated circuit device comprising a DRAM having a plurality of memory cells and a plurality of relief cells formed in a memory array, wherein the element isolation width of the region having the relief cells is larger than that of the region having the memory cells, and wherein the width of the active region having the relief cells is larger than the active region having the memory cells.

(11) According to the invention, there is provided a semiconductor integrated circuit device comprising a DRAM having a plurality of memory cells and a plurality of relief cells formed in a memory array, wherein side wall spacers formed on the side walls of the gate electrode of the MISFET included in each of the relief cells are thicker than side wall spacers formed on the side walls of the gate electrode of the MISFET included in each of the memory cells.

(12) According to the invention, there is provided a semiconductor integrated circuit device comprising a DRAM having a plurality of memory cells and a plurality of relief cells formed in a memory array, wherein a gate insulating film of the MISFET included in each of the relief cells is thicker than a gate oxide film of the MISFET included in each of the memory cells.

(13) According to the invention, there is provided a semiconductor integrated circuit device comprising a DRAM having a plurality of memory cells and a plurality of relief cells formed in a memory array, wherein the number of the relief cells to be connected with one redundant bit line is smaller than that of the memory cells to be connected with one bit line.

(14) According to the invention, there is provided a semiconductor integrated circuit device comprising a DRAM having a plurality of memory cells formed in a memory array and including relief cells, wherein a sense amplifier to be used for relief is connected with a first bit line or a signal line of the information of a noted bit and a second bit line or a signal line of the opposit information of the noted bit, and wherein one of two cells to be selected by a predetermined word line is connected with the first bit line whereas the other cell is connected with the second bit line.

(15) According to the invention, there is provided a semiconductor integrated circuit device comprising a DRAM having a plurality of memory cells formed in a memory array and including relief cells, wherein a sense amplifier to be used for relief is connected with a first bit line or a signal line of the information of a noted bit and a second bit line or a signal line of the opposit information of the noted bit, and wherein one of two word lines to be simultaneously selected selects the cell connected with the first bit line whereas the other selects the cell connected with the second bit line.

(16) According to the invention, there is provided a semiconductor integrated circuit device comprising a DRAM having a plurality of memory cells formed in a memory array and including relief cells, wherein a sense amplifier to be used for relief is connected with two first bit lines or signal lines of the information of a noted bit and two second bit lines or signal lines of the opposit information of the noted bit, and wherein one of two word lines to be simultaneously selected selects the cell connected with one of the two first bit lines whereas the other selects the cell connected with one of the two second bit lines.

(17) According to the invention, there is provided a process for manufacturing a DRAM having a plurality of normal cells and a plurality of relief cells formed in a memory array, comprising:
(a) thermally treating a semiconductor substrate to form a first gate insulating film on the surface thereof and then selectively removing the first gate insulating film of the normal cell region;
(b) thermally treating the semiconductor substrate again to form a second gate insulating film in the normal cell region, and making the first gate insulating film in the relief cell region thicker than the second gate insulating film;
(c) forming gate electrodes of the normal cells over the second gate insulating film of the normal cell region and gate electrodes of the relief cells over the first gate insulating film of the relief cell region by patterning the first conductive film deposited on the semiconductor substrate;
(d) forming sources and drains of the normal cells over the semiconductor substrate in the normal cell region and sources and drains of the relief cells over the semiconductor substrate in the relief cell region;
(e) forming first side wall spacers on the side walls of the gate electrodes in the normal cell region by depositing a first insulating film on the semiconductor substrate, and by etching the first insulating film in the normal cell region selectively;
(f) forming second side wall spacers thicker than the first the wall spacers on the side walls of the gate electrodes in the relief cell region by depositing a second insulating film on the semiconductor substrate, and by etching the second insulating film;
(g) forming contact holes individually over either the sources or drains of said normal cells and over either the sources or drains of the relief cells by etching a third insulating film deposited on the semiconductor substrate; and
(h) forming capacitive elements for storing the information stored in the normal cells and capacitive elements for storing the information stored in the relief cells individually over the third insulating film.

(18) In a semiconductor integrated circuit device manufacturing process, after the contact holes are individually formed over either the sources or drains of the normal cells and over either the sources or drains of the relief cells by etching a third insulating film deposited on the semiconductor substrate, a polycrystalline silicon film containing an impurities of the same conductivity type as that of the sources and drains is buried in the contact holes.

BRIEF DESCRIPTION OF THE DRAWINGS

FIGS. 6 to 24 are top plan views showing a process for manufacturing the DRAM of Embodiment 1 of the invention;

DESCRIPTION OF THE PREFERRED EMBODIMENTS

Figure 1:
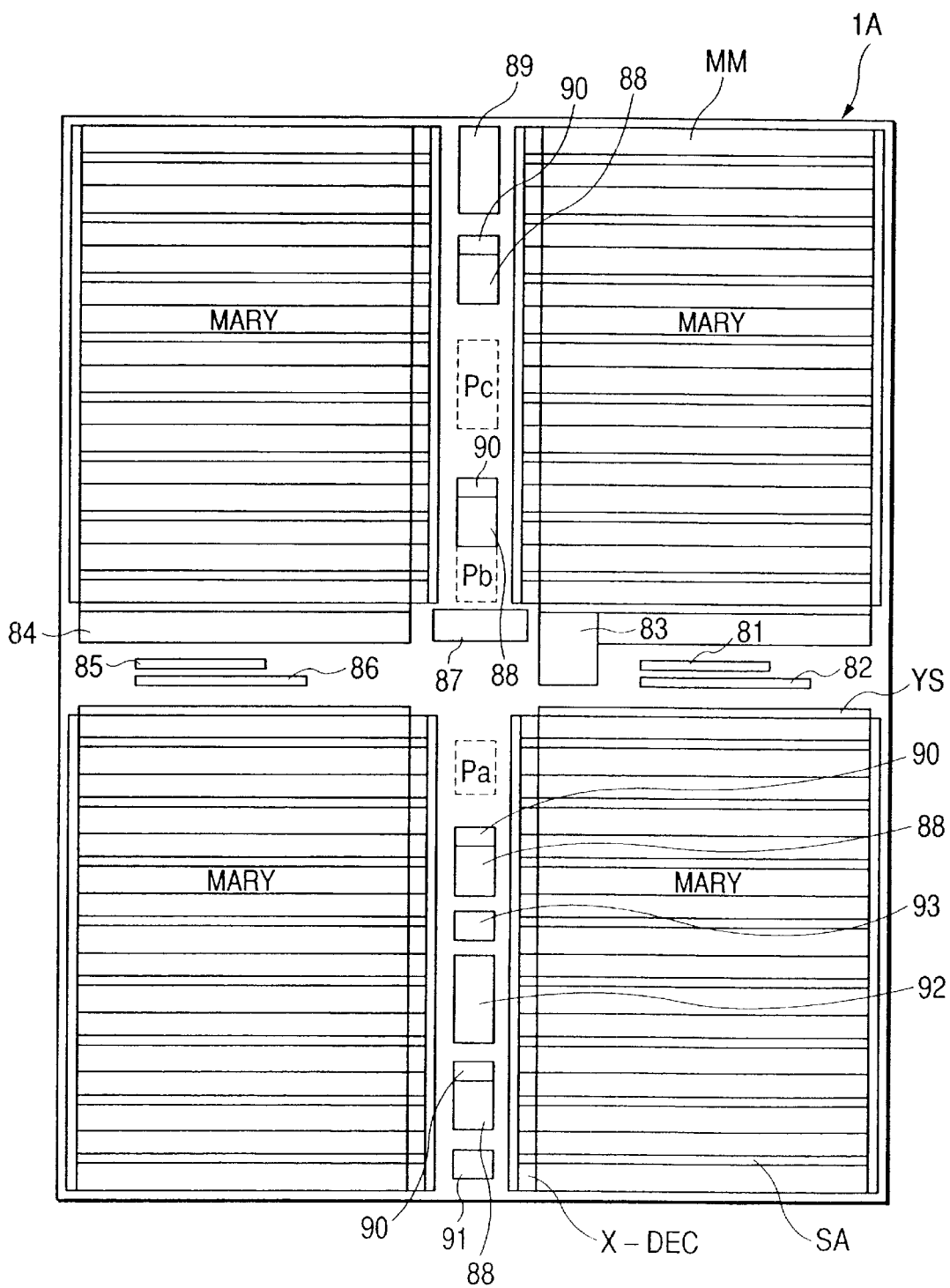
FIG. 1 is a block diagram showing a DRAM of Embodiment 1 of the invention.

The invention will be described in connection with its embodiments with reference to the accompanying drawings. Throughout all the drawings for illustrating the embodiments, members having identical functions are designated by common reference numerals, and their repeated description will be omitted.

(Embodiment 1)

FIG. 1 is a block diagram showing a DRAM of Embodiment 1 of the invention. The individual circuit blocks of this DRAM are formed over a semiconductor chip 1A made of single crystalline silicon.

In FIG. 1, at the longitudinal center portion and at the transverse center portion of the semiconductor chip 1A, there are arranged peripheral circuits dividing the semiconductor chip 1A into four regions, in which memory arrays (MARY) are individually arranged. The memory arrays (MARY) have a large storage capacity of about 256 Mbits as a whole, although not especially limited to this. In one memory mat MM, word lines are transversely extended whereas bit lines are longitudinally extended. The memory mats MM are paired and arranged across a sense amplifier SA. This sense amplifier SA is a so-called "shared sense amplifier" used shared by the paired memory mats arranged transversely. Of the memory arrays (MARY) quartered by the peripheral circuits, Y-select circuits YS are arranged on the center side. Y-select lines are extended from the Y-select circuit to the portion over the plurality of mats of the corresponding memory array (MARY) thereby to switch column switch MISFETs of each memory mat.

The semiconductor chip 1A is provided on the righthand side of the transverse center portion with an X-circuit 80 including an X-address buffer, an X-redundancy circuit and an X-address driver (logic stage), a RAS control signal circuit 81, a WE-signal control circuit 82 and a reference voltage generator 83. This reference voltage generator 83 is disposed close to the center of this region for generating a constant voltage VL (3.3 V, for example) to be fed to an internal circuit, on receiving an external power supply voltage Vcc (5 V, for example). On the lefthand side, there are provided a Y-circuit 84 including a Y-address buffer, a Y-redundancy circuit and a Y-address buffer (logic stage), a CAS control signal circuit and a test circuit. At the chip center portion, moreover, there is provided an internal voltage step-down circuit for feeding a power voltage VCL to peripheral circuits such as an address buffer and a decoder.

When the redundancy circuit including the address buffer and a corresponding address comparator, and the CAS and RAS control signal circuits 81 and 85 for generating control clocks are concentratedly arranged, as described above, a high integration can be made, and the signals can be transmitted at high speeds to the address driver (logic stage), for example, by dividing the clock generator and other circuits on both sides of the wiring channel, that is, by sharing the wiring channel.

The RAS control signal circuit 81 is used to activate the X-address buffer on receiving a signal RAS. The address signal fetched by the X-address buffer is fed to an X-address redundancy circuit for relieving faults for every word line, in which the address signal is compared with a faulty address stored in the redundancy circuit thereby to decide whether or not switching to the redundancy circuit should be made. This decision result and the address signal fetched by the X-address buffer are fed to the X-address predecoder. The predecode signal generated is fed through the X-address driver provided correspondingly to each memory array to the X-decoder provided for the memory mat.

The internal signal of the RAS line is fed to the WE control circuit and the CAS control circuit, the input order of, e.g., the RAS signal, a CAS signal and a WE signal is decided to discriminate an automatic refresh mode (CBR), a test mode (WCBR) and so on. At the test mode time, a test circuit 86 is activated to set up a test function in accordance with the specific address signal fed at that time.

The CAS control signal circuit 85 is used to generate various Y-control signals on receiving the CAS signal. The address signal fetched by the Y-address buffer in synchronism with the change of the signal CAS to the low level is fed to the Y-redundancy circuit for the fault relief at the bit line unit, in which the address signal is compared with the faulty address to decide whether or not switching to the redundancy circuit should be made. This result and the address signal are fed to the y-predecoder to generate the predecode signal. This predecode signal is fed to the individual Y-decoders through the Y-address drivers provided for the individual memory cells, whereas the CAS control circuit decides the test mode from the decision of the input order on receiving the RAS signal and the WE signal, as described above, to activate the adjoining test circuit 86.

On the upper side of the longitudinal center portion of the chip, there are arranged totally sixteen memory mats and totally eight sense amplifiers which are symmetric with respect to the center axis of the upper side portion. Four main amplifiers 88 are provided for the four sets of right and left memory mats and sense amplifiers. On the upper side of the longitudinal center, there are additionally provided a boost voltage generator 89 for selecting the word lines on receiving the internal fall voltage, and input pad areas Pb and Pc corresponding to input signals such as the address signals and the control signals. For each of the memory blocks quartered into the four right and left sets, there is provided an internal voltage step-down circuit for generating the voltage to activate the sense amplifier SA.

With this construction in which the eight memory mats and the four sense amplifiers SA are arranged for one block and in which the totally sixteen memory mats and the totally eight sense amplifiers SA are arranged transversely symmetrically with respect to the longitudinal axis, the amplified signals from the individual sense amplifiers SA can be transmitted to the main amplifiers 88 via the short signal transmission paths by using a small number (four) of main amplifiers 88.

On the lower side of the longitudinal center portion of the chip, there are also arranged totally sixteen memory mats and totally eight sense-amplifiers SA which are symmetric with respect to the center axis of the lower side portion. The four main amplifiers 88 are provided for the four sets of right and left memory mats and sense amplifiers SA. On the lower side of the longitudinal center, there are additionally provided a substrate voltage generator 91 for generating a substrate back-bias voltage to be fed to the substrate on receiving the internal step-down voltage, and an input pad area Pa, a data output buffer circuit 92 and a data input buffer circuit 93 corresponding to the input signals such as the address signals and the control signals. For each of the memory blocks quartered into the four right and left sets, there is provided an internal voltage step-down circuit 90 for generating the voltage to activate the sense amplifier SA. As a result, the amplified signals from the individual sense amplifiers can be transmitted to the main amplifiers SA via the short signal transmission paths by using a small number (four) of main amplifiers.

Of the above-specified internal voltages, the voltage VCL is a power supply voltage of 3.3 V for the peripheral circuits and is commonly generated by the internal voltage step-down circuit. A voltage VDL is a power voltage of 3.3 V to be fed to the memory array (MARY), i.e., the sense amplifier SA and is generated for each of the four memory blocks. A voltage VDH is a boost power voltage for selecting the selected level of the word line, which is boosted to 5.2 V, for example, on receiving the internal voltage VDL, and the shared switch MISFET. A voltage VBB is a substrate bias voltage of −2 V, for example: a voltage VPL is a plate voltage of the memory cells; and the voltage VL is a constant voltage of 3.3 V to be fed to the internal voltage step-down circuit 90.

At the central portion of the chip, there is arranged one column of a plurality of bonding pads, although not shown, in the longitudinal direction. These bonding pads are electrically connected with the lead frame of the LOC (Lead On Chip) type through Au wires, for example.

Figure 2:
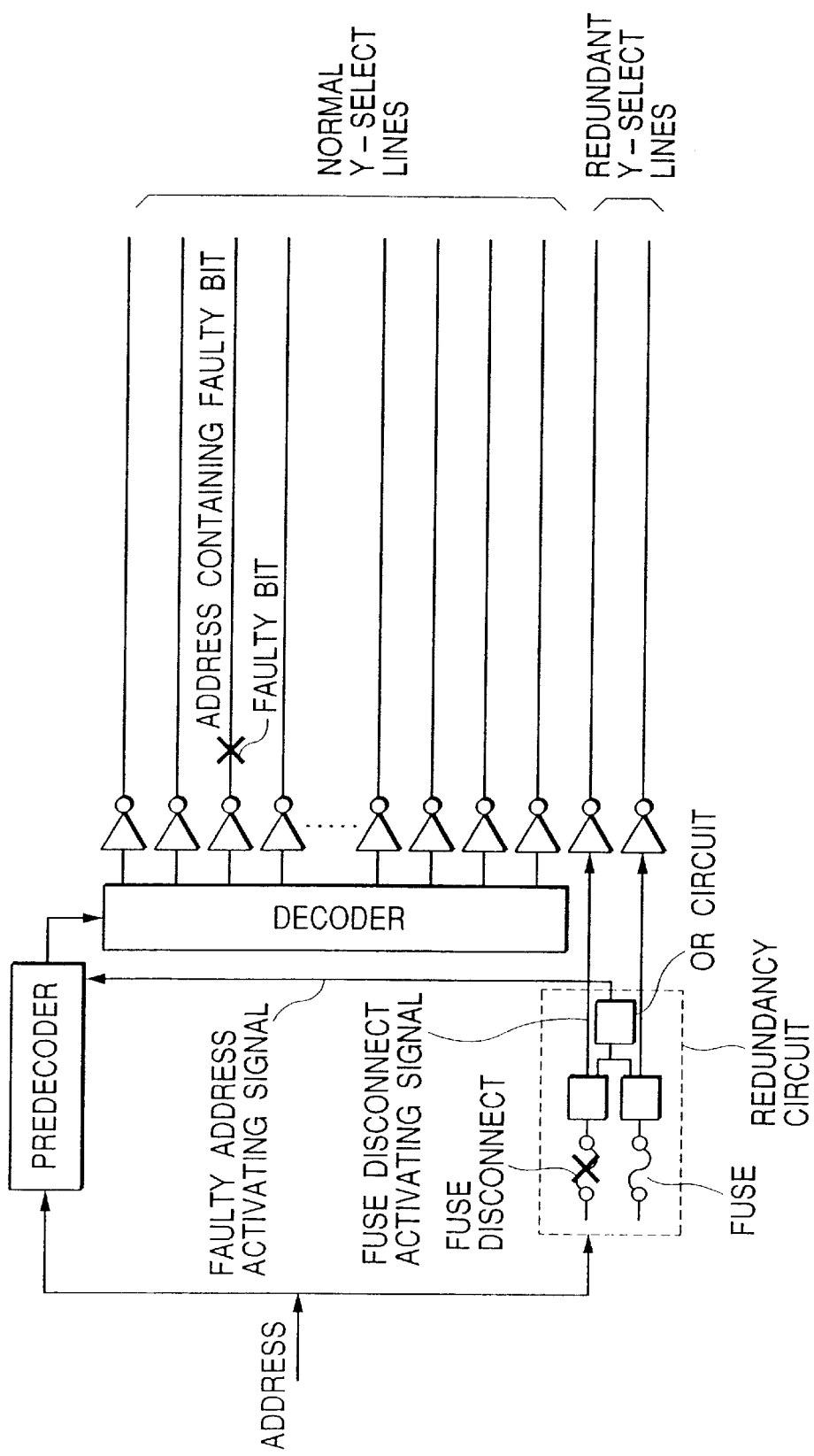
FIG. 2 is a diagram for explaining a fault relieving method of the DRAM of Embodiment 1 of the invention.

One example of the DRAM fault relieving method will be described with reference to FIG. 2. Here, complementary bit lines are connected with the normal Y-select lines through switch MOSFETs whereas normal cells are connected with the bit lines, although not shown. Moreover, complementary bit lines are connected with redundant Y-select lines through the switch MOSFETs whereas redundant cells are connected with the bit lines.

When an address containing a faulty cell is detected at a wafer testing time, the connection is switched to a relief cell when the address is selected, by disconnecting the fuse of a predetermined redundancy circuit, and a signal for activating the relief cell is transmitted to the relief cell. As a result, the redundant Y-select lines are activated when the address is selected. Simultaneously with this, a signal for inactivating the faulty address is inputted to the decoder connected with the normal cell. Thus, at the address, the redundant Y-select lines are selected in place of the normal Y-select lines of the address containing the faulty cell.

The redundancy circuit is equipped with a fuse for programming the address of the faulty Y-select line containing the faulty cell and is given a function to select the redundant Y-select line when the address is inputted, and a function to inactivate the normal Y-select line of the memory array corresponding to the address.

Figure 3:
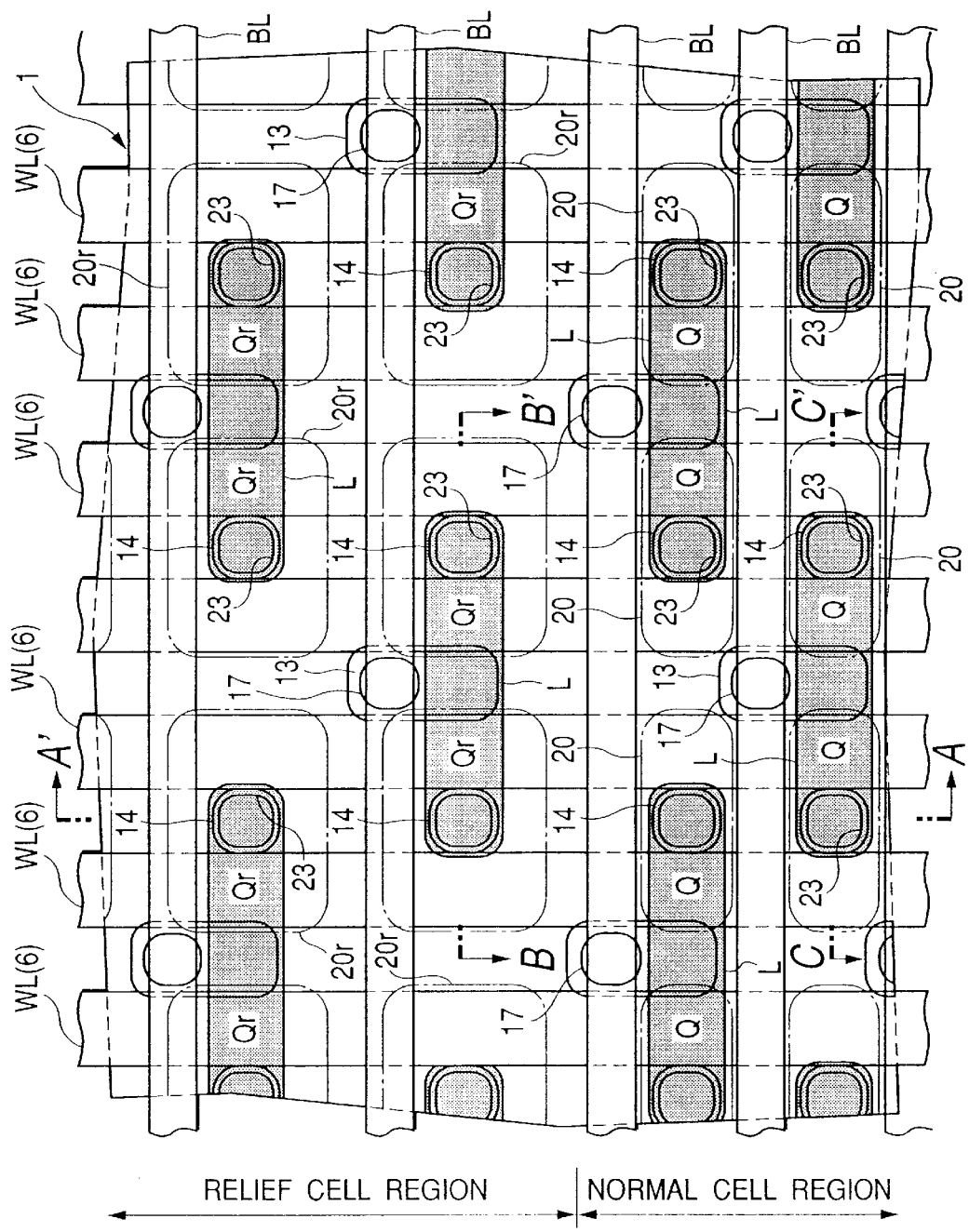
FIG. 3 is a top plan view showing the DRAM of Embodiment 1 of the invention.
Figure 4:
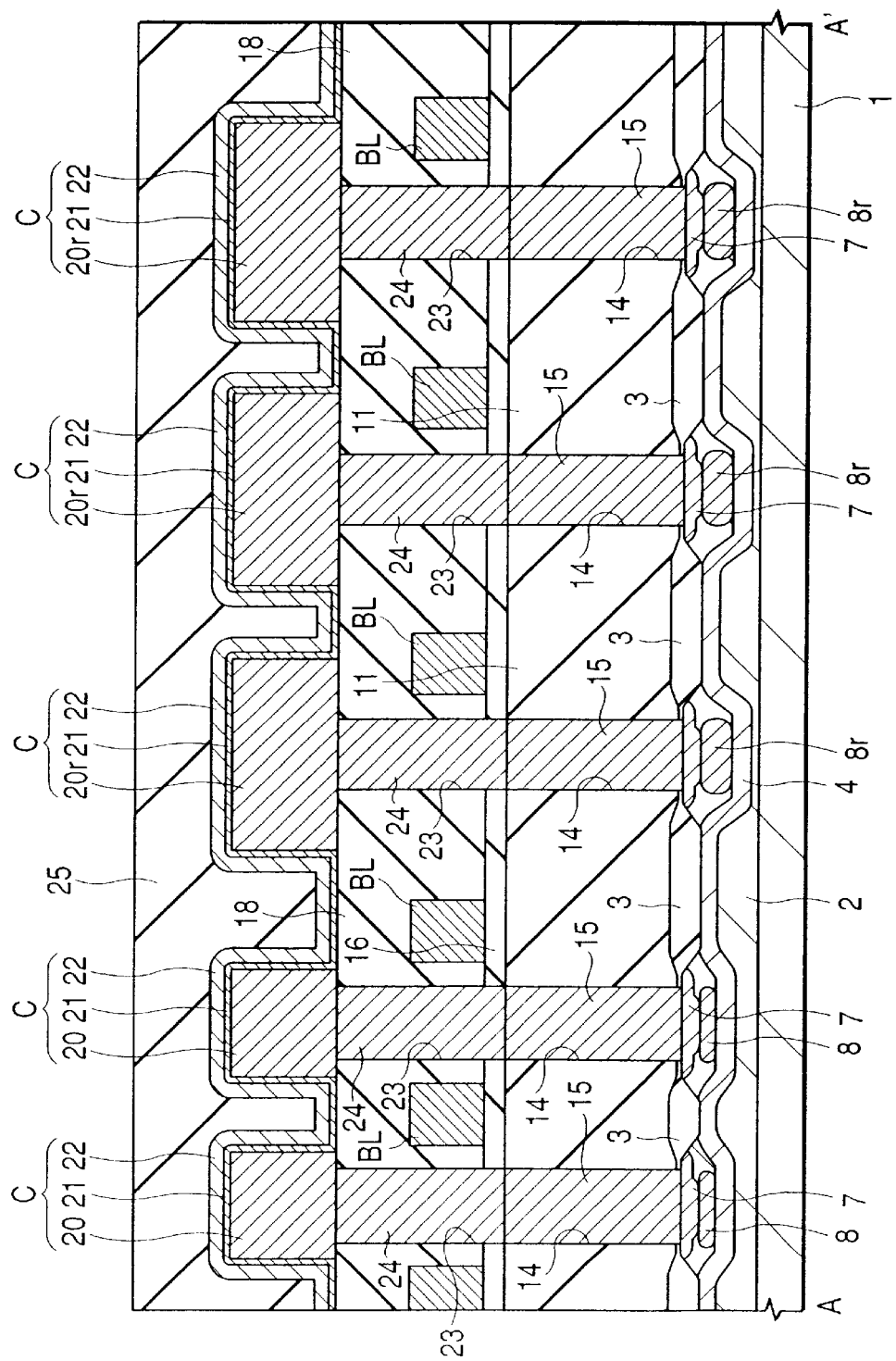
FIG. 4 is a section taken along line A–A' of FIG. 3.
Figure 5:
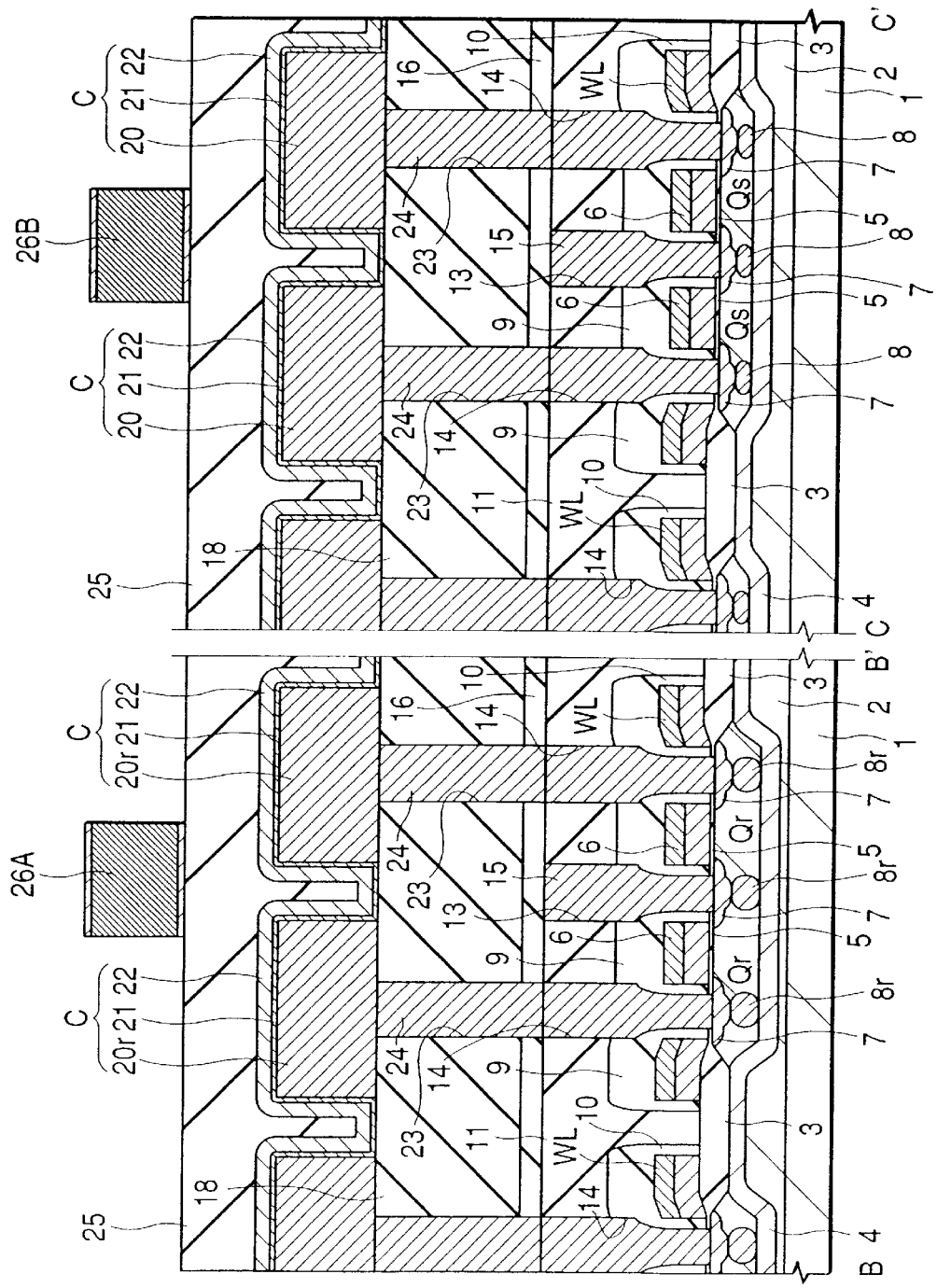
FIG. 5 is a section taken along line B–B' of FIG. 3.

FIG. 3 is a schematic top plan view of a semiconductor substrate showing a portion (the region having the normal memory cells and the region having the relief cells) of the memory array; FIG. 4 is a section taken along line A–A' of FIG. 3; and FIG. 5 is a section taken along line B–B' and line C–C' of the same. FIG. 3 mainly shows a conductive layers (excepting the plate electrode) constituting the memory cells but do not show the insulating film between the conductive layers nor the wires over the memory cells.

The memory cells and the faulty relieving relief cells of this embodiment are formed in an active regions L of p-wells 2 formed over a major face of a p-type semiconductor substrate 1. A memory cell is constructed to include an n-channel type memory cell selecting MISFET Qs and an information storing capacitive element C connected in series with the MISFET Qs, whereas a relief cell is constructed to include an n-channel type memory cell selecting MISFET Qr and an information storing capacitive element C connected in series with the MISFET Qr. As shown in FIG. 3, the active region L is formed of a pattern of a long island shape extending transversely (in the X-direction) of the drawing and is given a size of 1.16 microns in the X-direction and 0.24 microns in the vertical direction (in the Y-direction), for example.

A field oxide film 3 is formed in the element isolating region enclosing the active region L by a well-known local oxidation (LOCOS) method. In the DRAM of this embodiment, as shown in the drawing, the element isolation width of the region (the relief cell region) having the relief cells, that is, the spacings between the active regions L adjoining in the Y-direction or in the extending direction of the word lines WL is larger than the element isolation width of the region (the ordinary cell region) having the normal memory cells. The element isolation width of the normal cell region is, e.g., 0.22 microns whereas the element isolation width of the relief cell region is e.g., 0.44 microns, which is two times as large as the element isolation width of the normal cell region.

Inside the p-well 2 including the portion under the field oxide film 2, there is formed a p-type semiconductor layer 4 for adjusting the substrate concentration. This p-type semiconductor layer (the substrate concentration adjusting layer) 4 is formed, as shown, in the deep region of the p-well 2 under the active region of the relief cells, and in the shallow region under the active region of the normal cells. The impurity concentration of the junction is lowered by forming the p-type semiconductor layer 4 deeply. This allows the relief cells to lower the impurity concentration of the junction simply.

The memory cell selecting MISFET Qs of the memory cell is constructed to mainly include a gate oxide film 5, a gate electrode 6 and a pair of n-type semiconductor regions 7 and 7 constituting the source and the drain. In each active region L formed in the normal cell region, there are formed the two memory cell selecting MISFETs Qs which share one drain and which are adjacent in the X-direction. Likewise, the memory cell selecting MISFET Qr of the relief cell is constructed to mainly include a gate oxide film 5, a gate electrode 6 and a pair of n-type semiconductor regions 7 and 7 constituting the source and the drain. In each active region L formed in the relief cell region, there are formed the two memory cell selecting MISFETs Qs which share one drain and which are adjacent in the X-direction. The memory cell selecting MISFET Qs of the normal cell and the memory cell selecting MISFET Qr of the relief cell have an identical size.

Under the source and drain (the n-type semiconductor regions 7) of the memory cell selecting MISFET Qs, there is formed an n-type semiconductor layer (the field relaxation layer) 8 for relaxing the junction field of those source and drain. Under the source and drain (the n-type semiconductor regions 7) of the memory cell selecting MISFET Qr, there is formed an n-type semiconductor layer (the field relaxation layer) 8r for relaxing the junction field of those source and drain. As shown, the field relaxation layer 8r of the relief cell is formed in a deeper region of the p-well than the field relaxation layer 8 of the normal cell. The depth of the field relaxation layer 8r is about two times as large as that of the field relaxation layer 8. The field relaxation layers (8, 8r) may not be formed on the one, out of the source and drain which is connected with a bit line BL.

The gate electrode 6 of the memory cell selecting MISFET Qs is formed integrally with a word line WL, and extended in the Y-direction with an identical width and with an identical spacing. Likewise, the gate electrode 6 of the memory cell selecting MISFET Qr is formed integrally with the word line WL, and extended in the Y-direction with an identical width and with an identical spacing. The width of the gate electrode 6 (the word line WL), i.e., the gate length is, e.g., 0.24 microns, and the spacing between the two adjoining gate electrodes 6 is, e.g., 0.22 microns.

The gate electrode 6 (the word line WL) is formed of a polycide film which is formed by depositing a $WSi_2$ (tungsten silicide) film over a low-resistance polycrystalline silicon film doped with an n-type impurity such as P (phosphor). The gate electrode 6 (the word line WL) is covered with a silicon nitride film 9, and a side wall spacer 10 of a silicon nitride film is formed on the side walls of the silicon nitride film 9 and the gate electrode 6 (the word line WL). Over the silicon nitride film 9 covering the gate electrode 6 (the word line WL), there is formed a silicon oxide film 11, the surface of which is flattened to a substantially equal level all over the semiconductor substrate 1.

Over the paired n-type semiconductor regions 7 and 7 constituting the source and drain of the memory cell selecting MISFET Qs, Qr, there are formed contact holes 13 and 14 which extend through the silicon oxide film 11 to the n-type semiconductor regions 7. In these contact holes 13 and 14, there are buried plugs 15 which are formed of low-resistance polycrystalline silicon films doped with an n-type impurity (such as P (phosphor)). The contact hole 14 is given equal diameters in the X-direction and in the Y-direction. On the other hand, the other contact hole 13 is formed into a planar pattern of a generally rectangular shape having a larger diameter in the Y-direction than that in the X-direction, and partially extended out of the active region L to a portion over the field oxide film 3.

Over the silicon oxide film 11 having the contact holes 13 and 14, there is formed a silicon oxide film 16, over which there are formed the bit lines BL. These bit lines BL are arranged over the field oxide film 3, and extended to the end portions of the memory array in the X-direction with an identical width and with an identical spacing. The bit lines BL have a common width of 0.14 microns, for example, in both the normal cell region and the relief cell region. Since the element isolation width of the relief cell region is two times as large as that of the normal cell region, as described hereinbefore, the spacing between the bit lines BL formed in the relief cell region is larger than, e.g., about two times as large as that of the bit lines BL formed in the normal cell region.

These bit lines BL are formed of a polycide film which is formed by depositing a $WSi_2$ (tungsten silicide) film over a low-resistance polycrystalline silicon film doped with an n-type impurity, for example. The bit lines BL in the normal cell region are electrically connected with the plugs 15 in the contact holes 13 through through holes 17 formed in the silicon oxide film 16, and further with the n-type semiconductor region 7 (one of the source and the drain) shared by the two memory cell selecting MISFET Qs, through the plugs 15. Likewise, the bit lines BL in the relief cell region are electrically connected with the plugs 15 in the contact holes 13 through the through holes 17 formed in the silicon oxide film 16, and further with the n-type semiconductor region 7 (one of the source and the drain) shared by the two memory cell selecting MISFET Qr, through the plugs 15.

Over the bit lines BL, there is formed a silicon oxide film 18. The surface of this silicon oxide film 18 is planarized to a substantially equal level all over the semiconductor substrate 1. Over the silicon oxide film 18, there are formed the information storing capacitive elements C. Each of these information storing capacitive elements C of the normal cells is constructed to have a stacked structure in which a lower electrode (a storage electrode) 20, a capacitor insulating film 21 and an upper electrode (a plate electrode) 22 are formed in multilayer in order of mention from the lower layer. Likewise, each of the information storing capacitive elements C of the relief cells is constructed to have a stacked structure in which a lower electrode (a storage electrode) 20r, a capacitor insulating film 21 and an upper electrode (a plate electrode) 22 are formed in multilayer. The lower electrodes 20 and 20r and the upper electrode 22 are formed of a low-resistance polycrystalline silicon film doped with P (phosphor), for example, and the capacitor insulating film 21 is formed of a high dielectric film of tantalum oxide ($Ta_2O_5$), for example.

The lower electrodes 20, 20r of the information storing capacitive elements C are formed to have an oblong pattern extending in the X-direction. The lower electrode 20 of the normal cell has a size of 0.77 microns in the X-direction and 0.31 microns in the Y-direction, for example. Moreover, the spacing between the adjoining lower electrodes 20 is 0.15 microns in both the X-direction and the Y-direction, for example. Meanwhile, the lower electrode 20r of the relief cell has a size of 0.77 microns in the X-direction and 0.62 microns in the Y-direction, for example. Moreover, the spacing between the adjoining lower electrodes 20r is 0.15 microns in both the X-direction and the Y-direction, for example. In this case, the area occupied by the lower electrode 20r of the relief cell is larger than, e.g., two times as large as that of the lower electrode 20 of the normal cell.

Under the individual lower electrodes 20, 20r, there are formed through holes 23 which are extended through the silicon oxide films 18 and 16 to the contact holes 14. In these through holes 23, there are buried plugs 24 which are formed of a low-resistance polycrystalline silicon film doped with an n-type impurity (e.g., P (phosphor)). The lower electrodes 20 of the normal cells are electrically connected with the other of the source and drain of the memory cell selecting MISFET Qs through the plugs 24 in the through holes 23 and the plugs 15 in the contact holes 14. Likewise, the lower electrodes 20r of the relief cells are electrically connected with the other of the source and drain of the memory cell selecting MISFET Qr through the plugs 24 in the through holes 23 and the plugs 15 in the contact holes 14.

Over the information storing capacitive elements C, there is formed a silicon oxide film 25, over which metal wires 26A, 26B are formed. These metal wires 26A, 26B are constructed to have a multi-layered structure in which a TiN film, an Al alloy film and a TiN film are formed, for example. Over the metal wires 26A and 26B, there is formed an interlayer insulating film, over which one or two layers of metal wires are formed, although not shown.

One example of the process for manufacturing the memory cell and the relief cell will be described in the order of its steps with reference to FIGS. 6 to 24. In these drawings, all the sections that are denoted at their lower portions by reference symbols A and A' are taken along line A–A' of FIG. 6, and those denoted by reference symbols B and B', and C and C' are taken along lines B–B' and C–C' of FIG. 6.

First of all, a local oxidation (LOCOS) method is used to form the element isolating field oxide film 3 and the island-shaped active regions L enclosed by the former on the surface of the semiconductor substrate 1, as shown in FIGS. 6 and 7. At this time, the element isolation width (i.e., the element isolation width in the extending direction of the word lines WL) of the relief cell region is set to two times (2W) of the element isolation width (W) of the normal cell region. With this setting, the field oxide film 3 of the relief cell region is rather thicker than that of the field oxide film 3 of the normal cell region. This is because the growing rate of the field oxide film in the normal cell region having a smaller element isolation width than that of the relief cell region is lowered by the high compressive stress applied from the silicon nitride film serving as a mask for oxidation during the local oxidation process.

Next, as shown in FIG. 8, the semiconductor substrate 1 is implanted with ions of B (boron), and then subjected to a heat treatment to diffuse the B thereby to form the p-well 2 and the substrate concentration adjusting p-type semiconductor layer 4. The conditions for implanting ions of B to form the p-well 2 are, for example, as follows: an acceleration energy of 300 KeV and a dosage of $1 \times 10^{13}$ atoms/cm$^2$ for the normal cell region; and an acceleration energy of 400 KeV and a dosage of $1 \times 10^{13}$ atoms/cm$^2$ for the relief cell region. Meanwhile, the ion implanting conditions for forming the p-type semiconductor layer 4 are, for example as follows: an acceleration energy of 150 KeV and a dosage of $7 \times 10^{12}$ atoms/cm$^2$, and an acceleration energy of 40 KeV and a dosage of $2 \times 10^{12}$ atoms/cm$^2$ for the normal cell region; and an acceleration energy of 250 KeV and a dosage of $7\times10^{12}$ atoms/cm$^2$, and an acceleration energy of 60 KeV and a dosage of $1\times10^{12}$ atoms/cm$^2$ for the relief cell region. Simultaneously with this, B ion implantation for adjusting a threshold voltage (Vth) of the memory cell selecting MISFETs (Qs, Qr) are conducted under the conditions of an acceleration energy of 10 KeV and a dosage of $5\times10^{12}$ atoms/cm$^2$, for example.

In place of the above-specified ion implanting conditions, the normal cell region and the relief cell region may be doped, first, with ions of B (boron) under the conditions of an acceleration energy of 300 KeV, a dosage of $1\times10^{13}$ atoms/cm$^2$, an acceleration energy of 250 KeV, a dosage of $2\times10^{12}$ atoms/cm$^2$, an acceleration energy of 40 KeV and a dosage of $1\times10^{12}$ atoms/cm$^2$, and then only the normal cell region may be implanted with ions of B under the condition of an acceleration energy of 150 KeV and a dosage of $5\times10^{12}$ atoms/cm$^2$.

Figure 10:
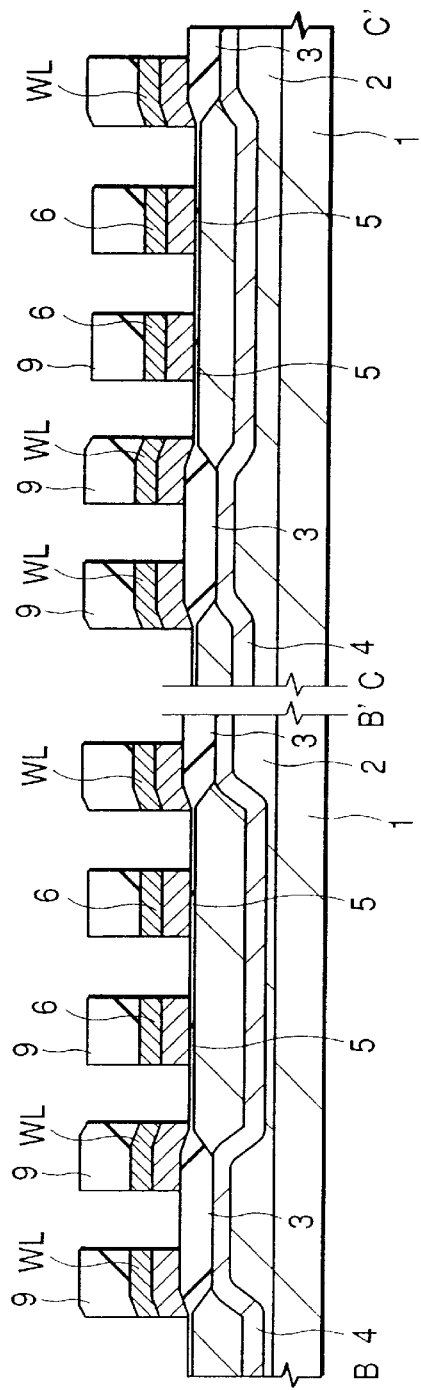

Next, on the surface of the p-wells 2, as shown in FIGS. 9 and 10, there is formed the gate oxide film 5 of the memory cell selecting MISFETs Qs, Qr, over which the gate electrodes 6 (the word lines WL) are formed. The gate oxide film 5 is formed by wet-oxidizing the surface of the p-wells 2 at a temperature of 800 to 900° C. Meanwhile, the gate electrodes 6 (the word lines WL) are formed by depositing the polycrystalline silicon film doped with P (phosphor), the WSi$_2$ (tungsten silicide) film and the silicon nitride film 8 sequentially on the semiconductor substrate 1 by a CVD method, and then by patterning those films by etching using a photoresist film as the mask.

Figure 11:
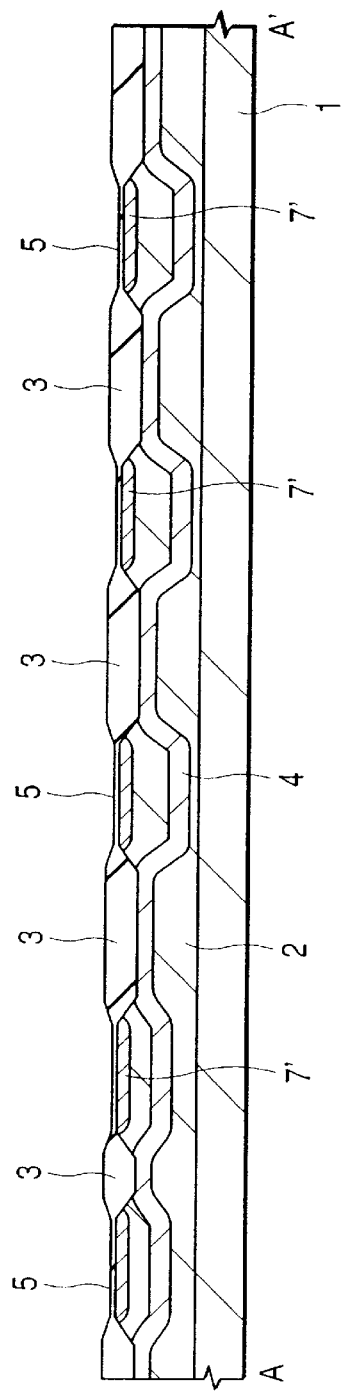
Figure 12:
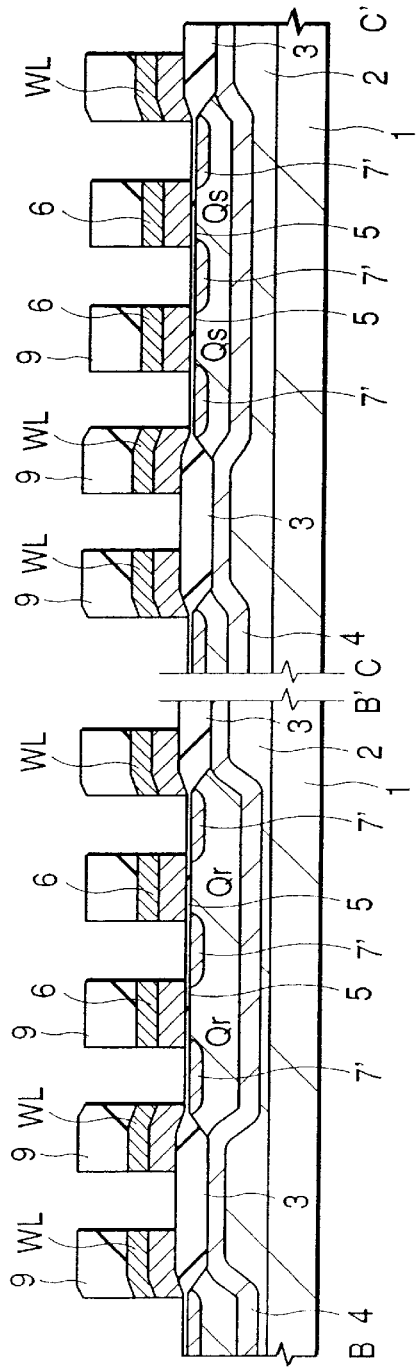

Next, in the p-wells 2, there is formed an n-type semiconductor region 7' (source, drain) of the memory cell selecting MISFETs Qs and Qr, as shown in FIGS. 11 and 12. The n-type semiconductor region 7' is formed by doping the p-wells 2 with P (phosphor) under the conditions of an acceleration energy of 20 KeV and a dosage of $2\times10^{13}$ atoms/cm$^2$, for example.

Figure 13:
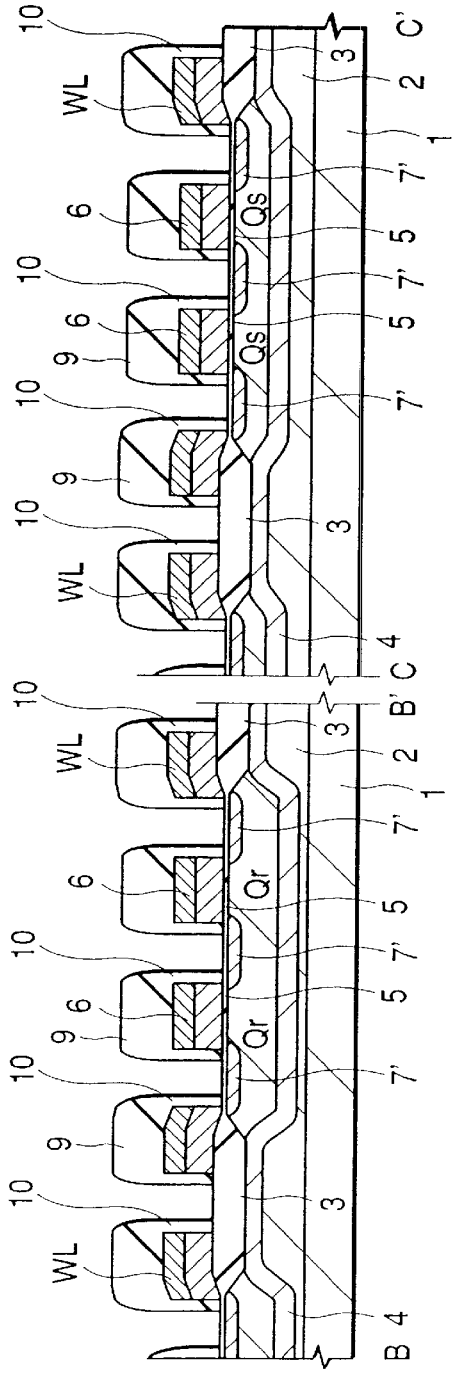

Next, as shown in FIG. 13, there are formed on the side walls of the gate electrodes 6 (the word lines WL) the side wall spacers 10. These side wall spacers 10 are formed by anisotropically etching the silicon nitride film which is deposited on the semiconductor substrate 1 by a CVD method.

Figure 14:
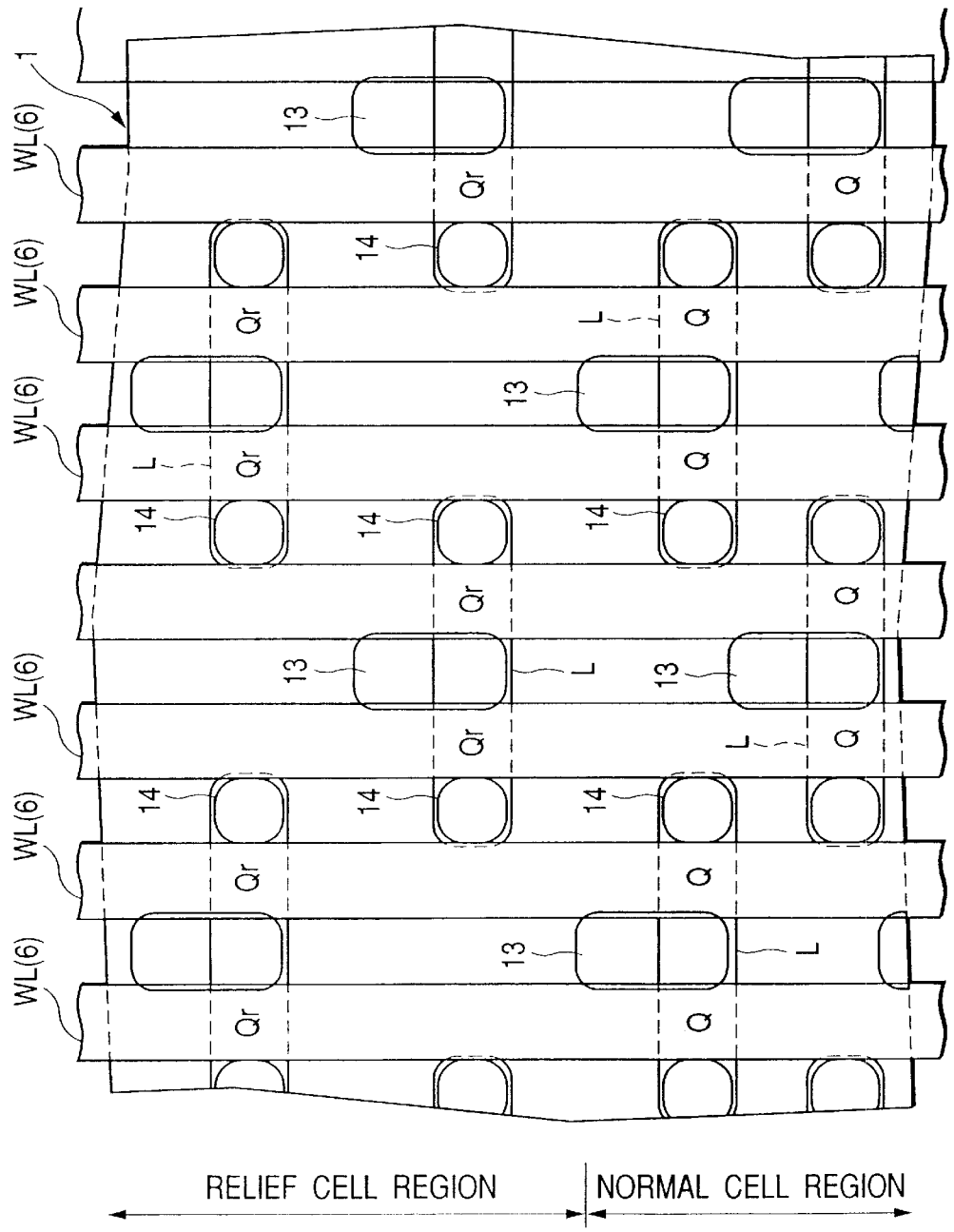
Figure 15:
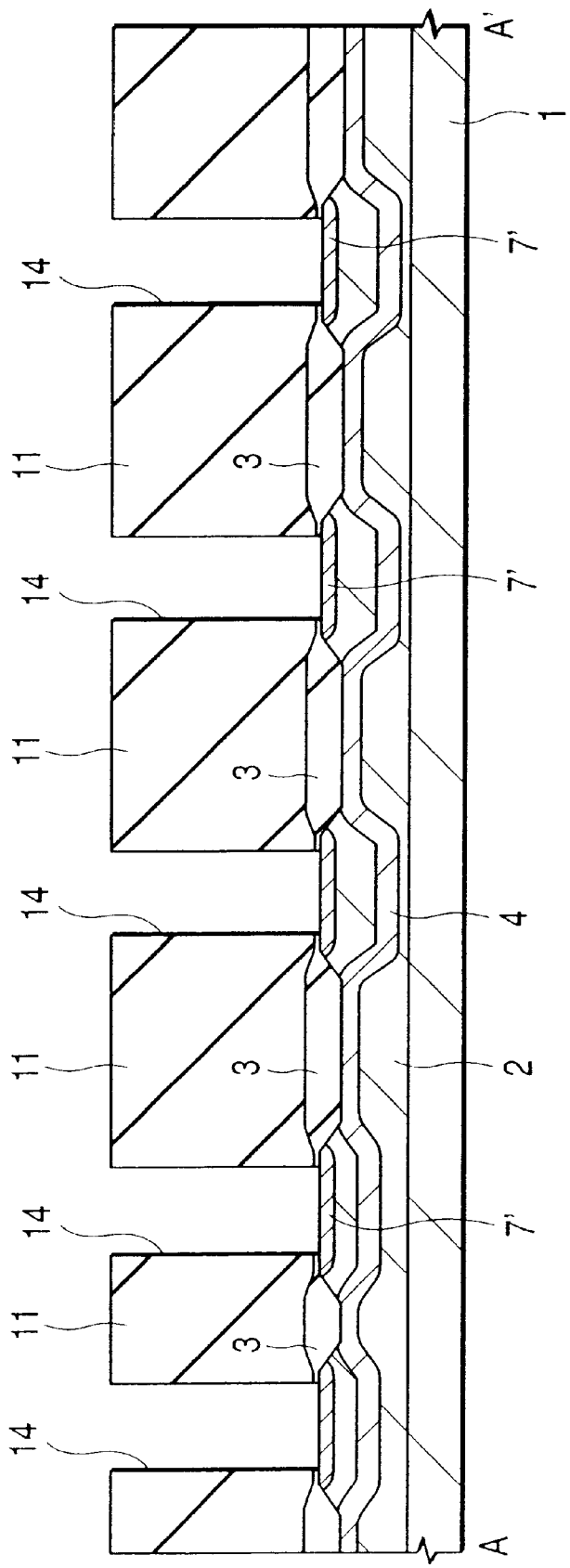
Figure 16:
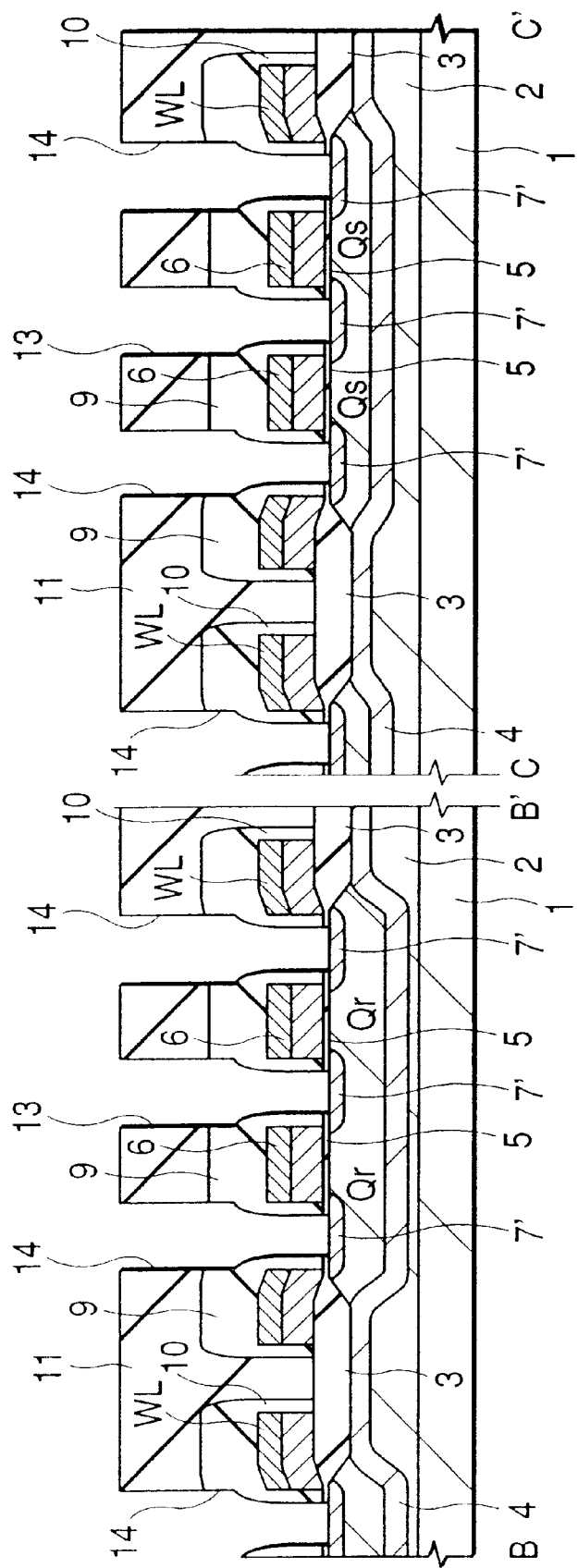

Next, as shown in FIGS. 14 to 16, the contract holes 13 and 14 are formed over the n-type semiconductor region 7' (source, drain) of the memory cell selecting MISFETs Qs, Qr by depositing the silicon oxide film 11 on the semiconductor substrate 1 by a CVD method, planarizing the surface of the silicon oxide film 11 by a chemical-mechanical polishing method, and dry-etching the silicon oxide film 11 by using a photoresist film as the mask. The contract holes 13 are formed by using a generally rectangular mask pattern having a larger diameter in the Y-direction than that in the X-direction, whereas the contact holes 14 are formed by using a generally square mask pattern having substantially equal diameters in the Y-direction and in the X-direction. The silicon oxide film 11 is dry-etched under the condition of a low etching rate of the silicon nitride film so that the silicon nitride film 9 and the side wall spacers 10 on the side walls of the gate electrodes 6 (the word lines WL) may not be deeply etched. As a result, the contact holes 13 and 14 are formed in self-alignment with the gate electrodes 6 (the word lines WL).

Figure 17:
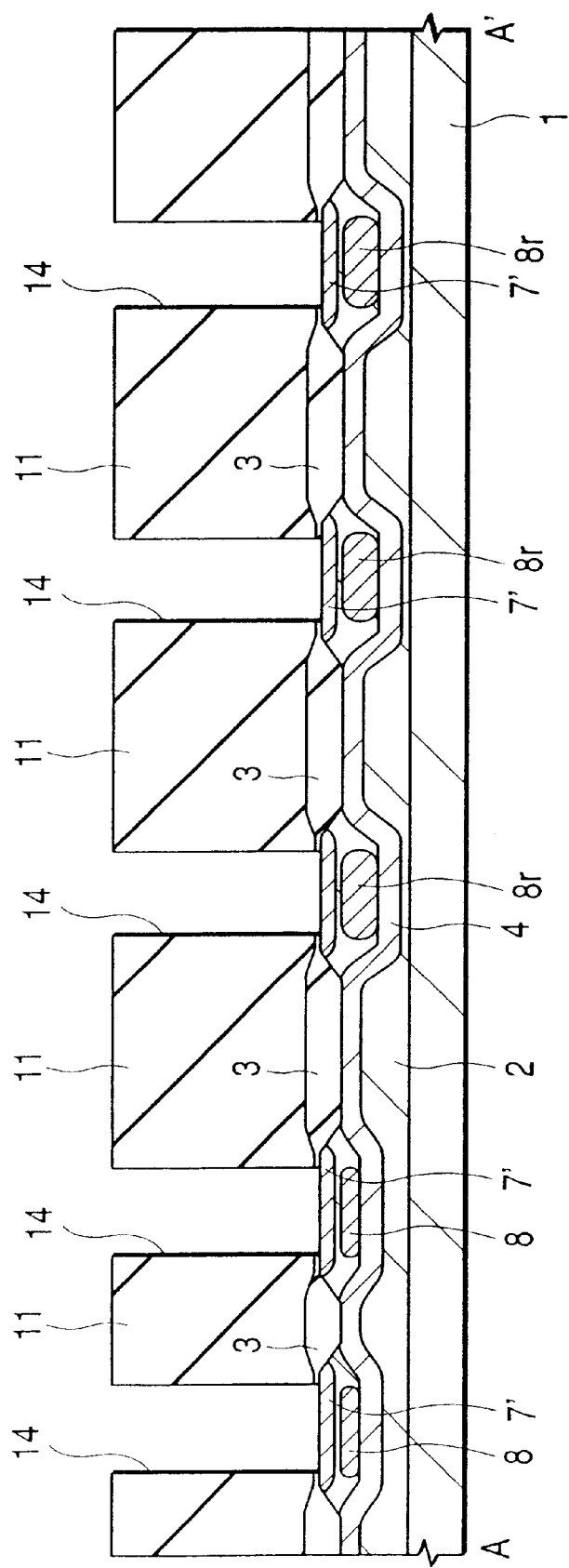
Figure 18:
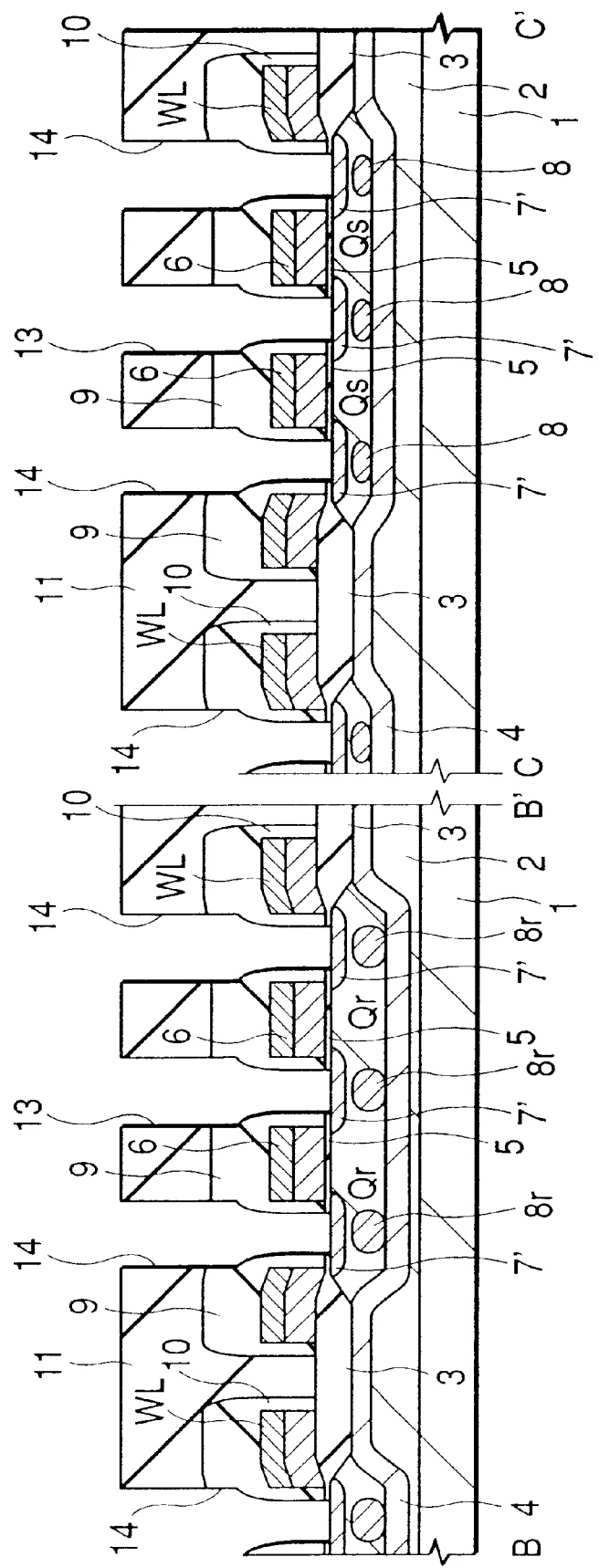

Next, as shown in FIGS. 17 and 18, the p-wells 2 are doped with ions of P (phosphor) through the contact holes 13 and 14, to form the field relaxing n-type semiconductor layer (the field relaxation layer) 8 in the p-wells 2 in the deeper region than that of the n-type semiconductor region 7' (source, drain) of the memory cell selecting MISFET Qs and to form the field relaxing n-type semiconductor layer (the field relaxation layer) 8r in the p-wells 2 in the deeper region than that of the n-type semiconductor region 7' (source, drain) of the memory cell selecting MISFET Qr. At this time, the p-wells 2 of the normal cell region are doped with ions of P (phosphor) under the conditions of an acceleration energy of 100 KeV and a dosage of $2\times10^{13}$ atoms/cm$^2$, for example; and the p-wells 2 of the relief cell region are doped with ions of P (phosphor) under the conditions of an acceleration energy of 150 KeV and a dosage of $1\times10^{13}$ atoms/cm$^2$, to form the n-type semiconductor layer (the field relaxation layer) 8r of the relief cell region deeper by about two times than that of the n-type semiconductor layer (the field relaxation layer) 8 of the normal cell region.

The n-type semiconductor layers (the field relaxation layers) 8, 8r are formed to smoothen the impurity profile between the p-well 2 and the n-type semiconductor region of the high impurity concentration, which is formed by diffusing an n-type impurity (e.g., P (phosphor)) in the polycrystalline silicon film, i.e., the material of the plugs 15 to be buried in the contact holes 13 and 14 at the next step, thereby to relax the electric field between the two.

Figure 19:
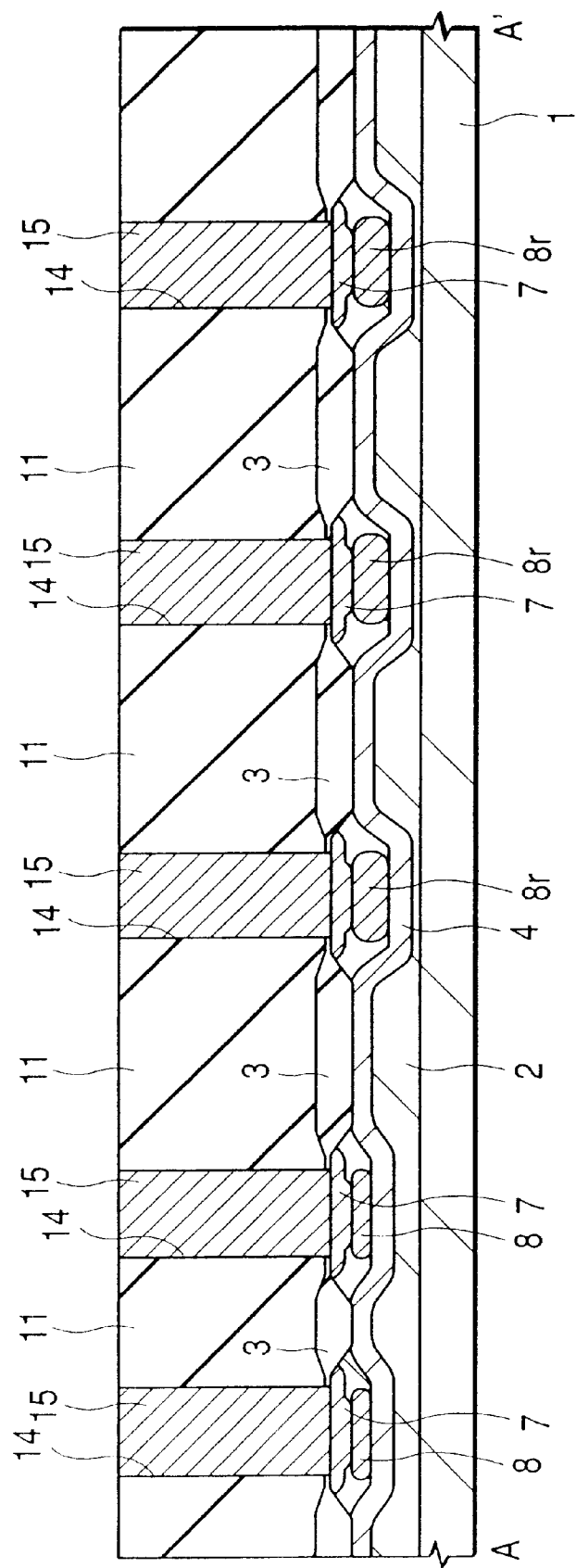
Figure 20:
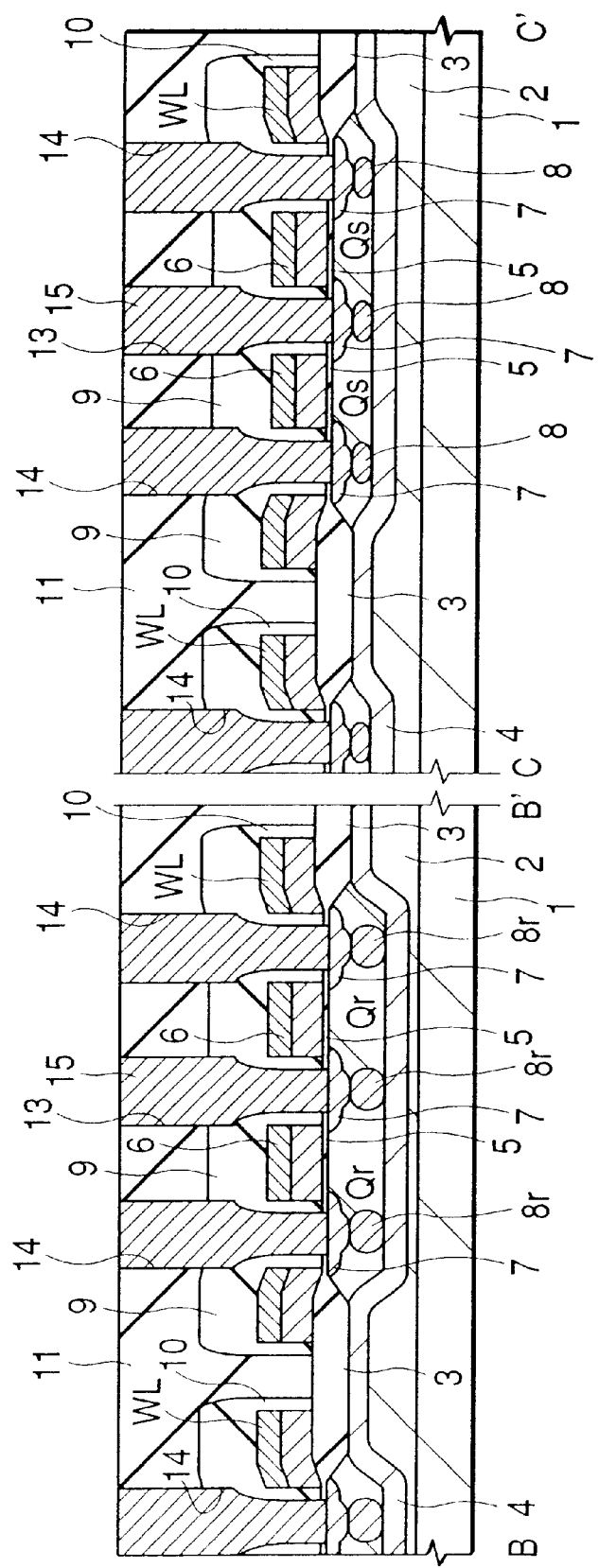

Next, the plugs 15 are formed in the contact holes 13 and 14, as shown in FIGS. 19 and 20. These plugs 15 are formed by depositing a polycrystalline silicon film doped with an n-type impurity (e.g., P (phosphor)), on the silicon oxide film 11 and then by polishing the polycrystalline silicon film by a chemical-mechanical polishing method thereby to leave the polished polycrystalline silicon film in the contact holes 13 and 14. By a subsequent heat treatment at about 850° C., the n-type impurity in the polycrystalline silicon film constituting the plugs 15 is diffused from the bottoms of the contact holes 13 and 14 into the n-type semiconductor regions 7' (the source and drain) to form the n-type semiconductor regions 7 (the source and drain) of a high impurity concentration.

Figure 21:
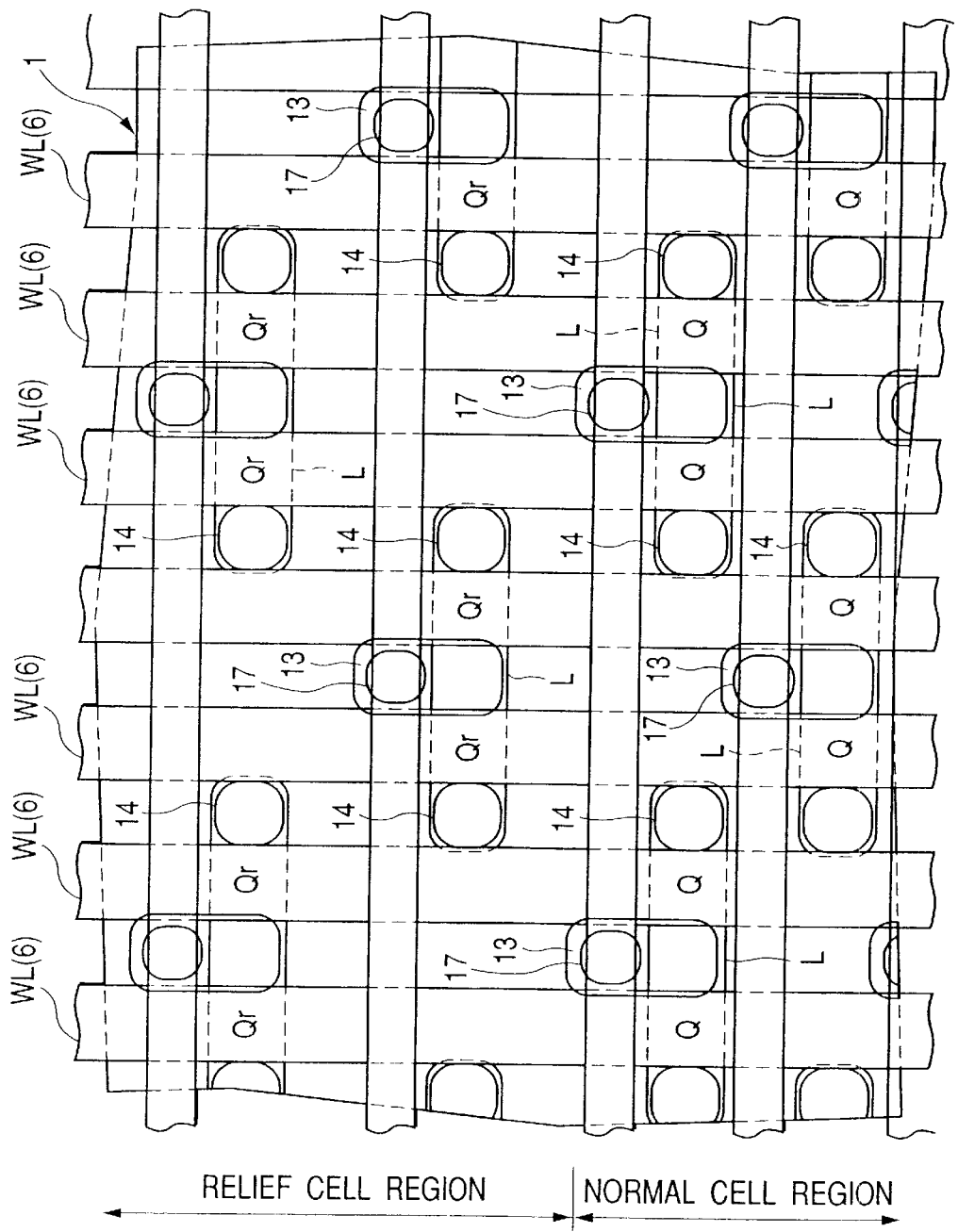
Figure 22:
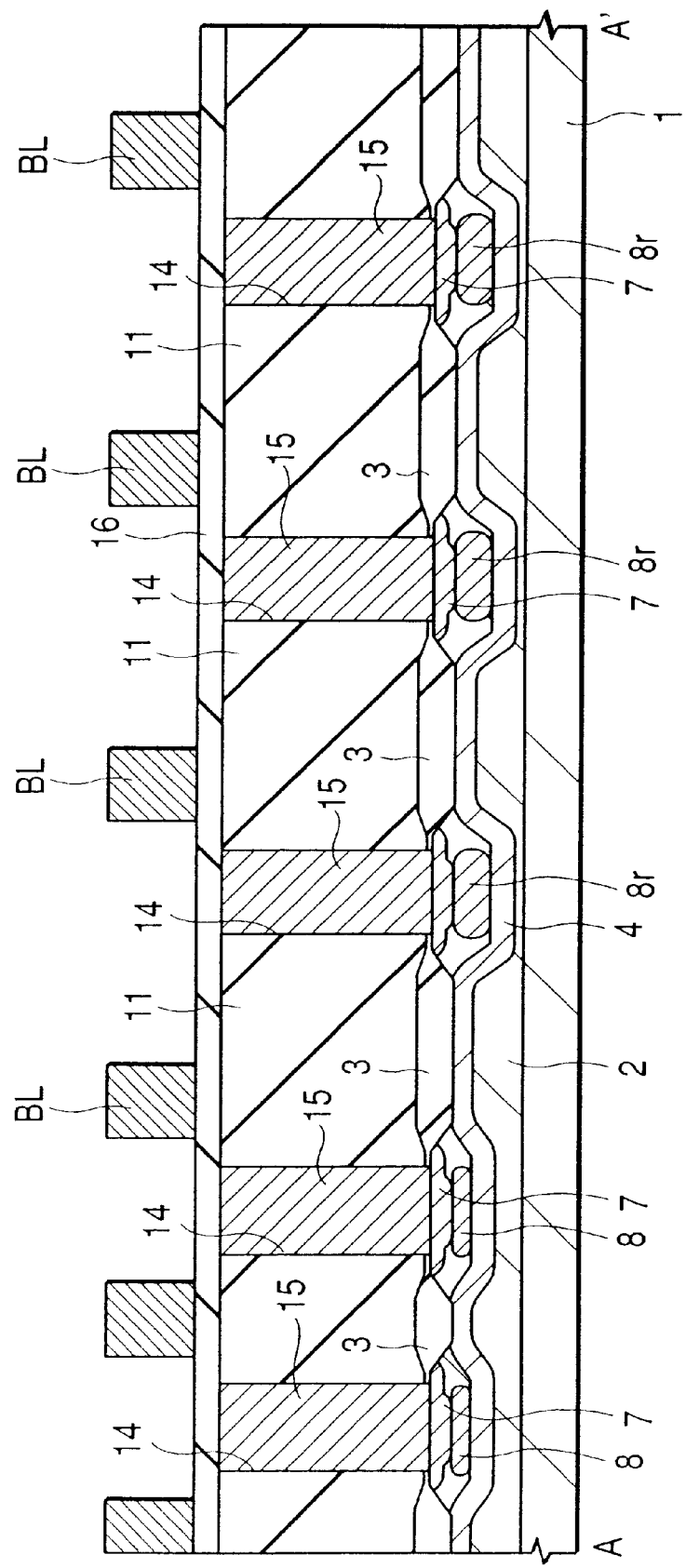

Next, as shown in FIGS. 21 and 22, the silicon oxide film 16 is deposited on the silicon oxide film 11 by a CVD method, and the through holes 17 are formed in the silicon oxide film 16 over the contact holes 13 by a dry-etching method using a photoresist film as the mask. After this, the bit lines BL are formed over the silicon oxide film 16. The bit lines BL of the normal cell region are electrically connected with one of the n-type semiconductor regions 7 (the source and drain) of the memory cell selecting MISFET Qs through the through holes 17 and the contact holes 13 thereunder. The bit lines BL of the relief cell region are electrically connected with one of the n-type semiconductor regions 7 (the source and drain) of the memory cell selecting MISFET Qr through the through holes 17 and the contact holes 13 thereunder.

Figure 23:
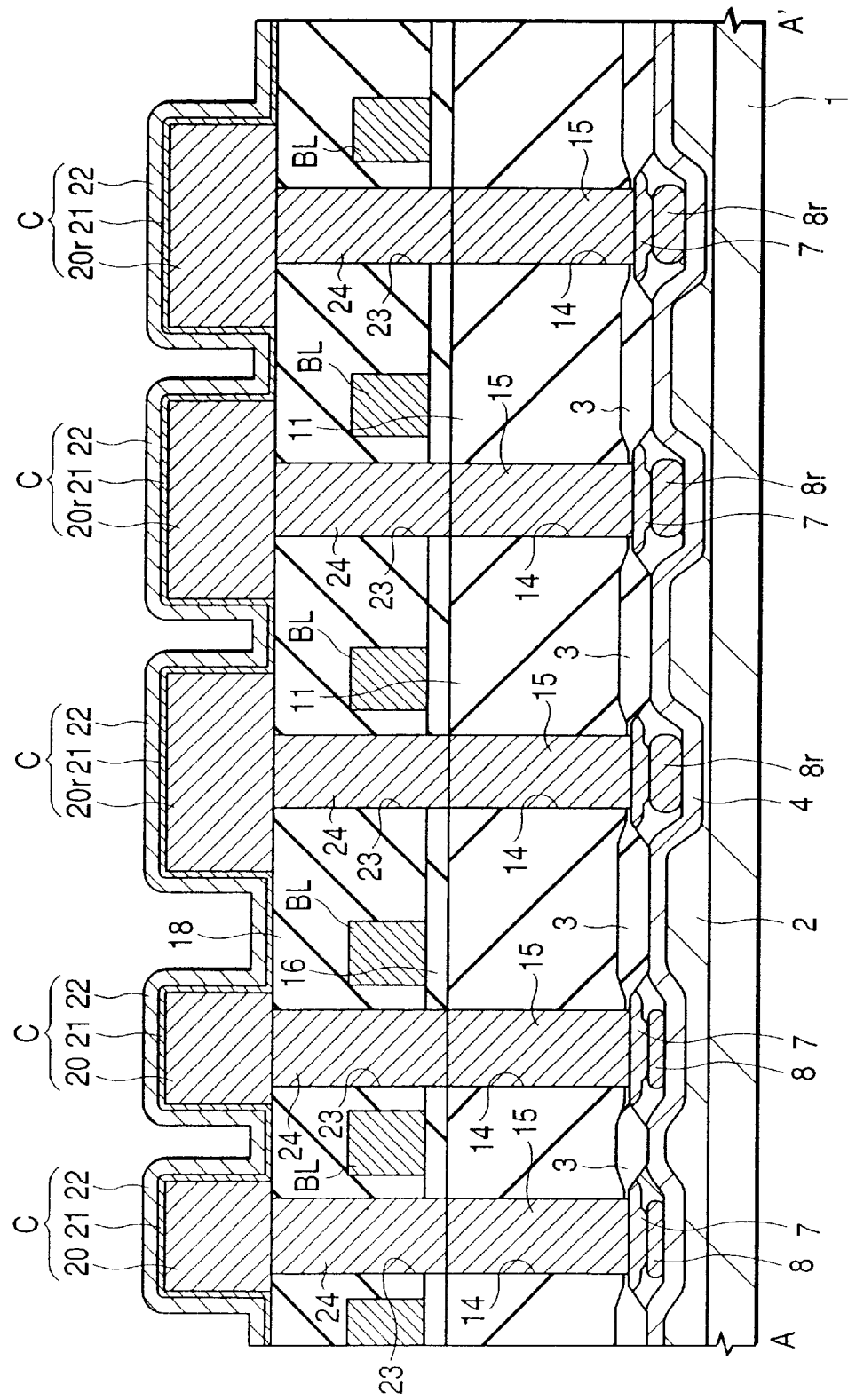
Figure 24:
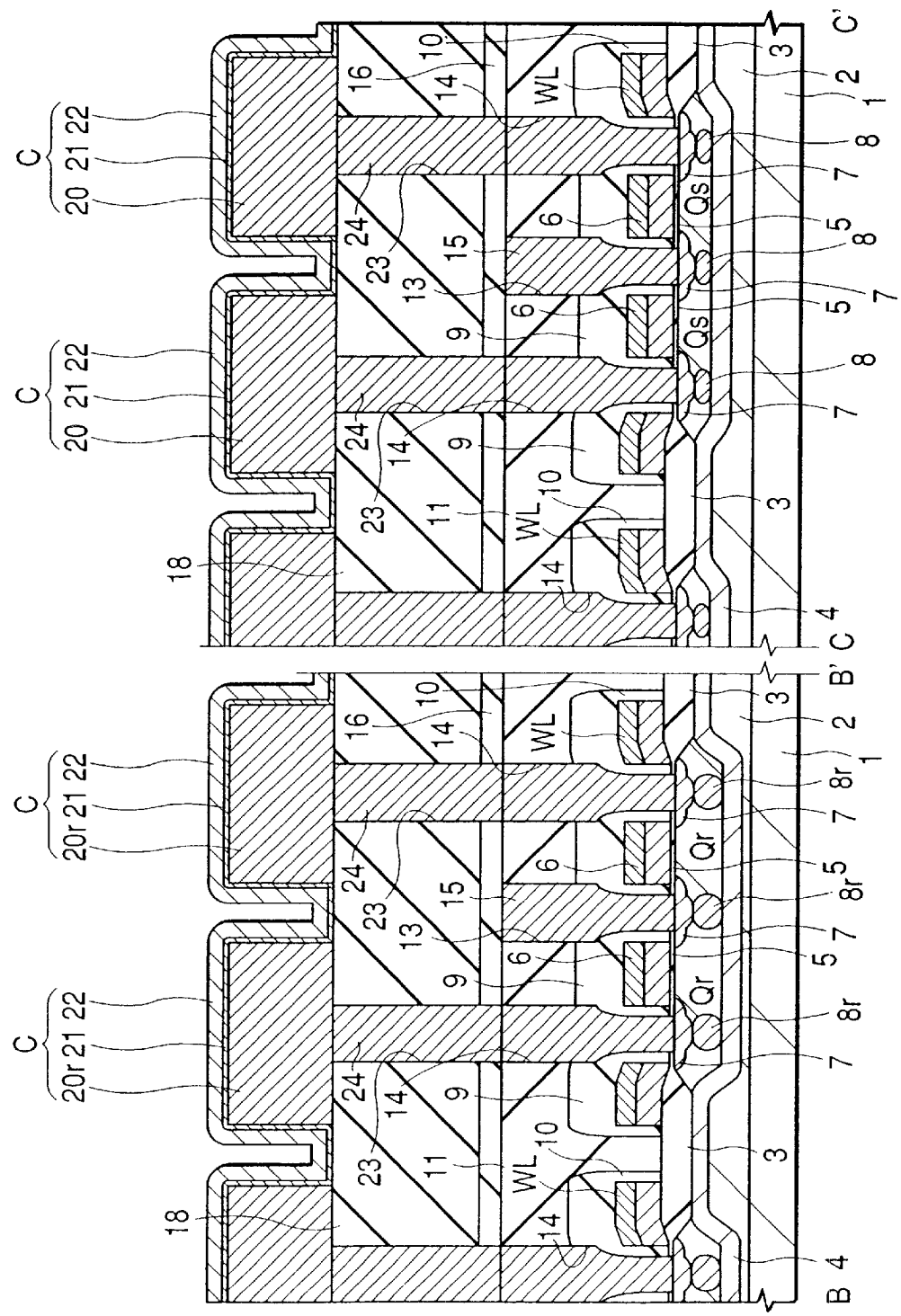

Next, as shown in FIGS. 23 and 24, the silicon oxide film 18 is deposited on the bit lines BL by a CVD method, and the through holes 23 are formed in the silicon oxide film 18 over the contact holes 14 by a dry-etching method using a photoresist film as the mask. Next, the plugs 24 are buried in the through holes 23, and the information storing capacitive elements C are then formed over the silicon oxide film 18. The plugs 24 are formed, for example, by depositing the polycrystalline silicon film doped with an n-type impurity (e.g., P (phosphor)) on the silicon oxide film 18 by a CVD method and then by polishing the polycrystalline silicon film by a chemical-mechanical method to leave the polycrystalline silicon film in the through holes 23. To form the information storing capacitive elements C, the lower electrodes (the storage electrodes) 20 are formed by depositing a low-resistance polycrystalline silicon film doped with P (phosphor), on the silicon oxide film 18 by a CVD method and then by patterning the polycrystalline silicon film by a dry-etching method using a photoresist film as the mask. Next, the tantalum oxide film and the low-resistance polycrystalline silicon film doped with P (phosphor) are deposited on the lower electrodes (the storage electrodes) by a CVD method and are then patterned by a dry-etching method using a photoresist film as the mask to form the capacitor insulating film 21 and the upper electrodes (the plate electrode) 22.

After this, the memory cells (the normal cells and the relief cells), as shown in FIGS. 3 to 5, are completed by depositing the silicon oxide film 25 over the information storing capacitive elements C by a CVD method, by then depositing the TiN film, the Al alloy film and the TiN film sequentially on the silicon oxide film 25 by a sputtering method, and by then patterning those films by a dry-etching method using a photoresist film as the mask to form the metal wires 26A and 26B.

In the thus constructed DRAM of this embodiment, by making the field relaxation layer 8r of the relief cells deeper (about two times, for example) than the field relaxation layer 8 of the relief cells, the depletion layer of the source and drain (the n-type semiconductor regions 7) of the relief cells can be wider (about two times, for example) than that of the source and drain (the n-type semiconductor regions 7) of the normal cells thereby to lower (to about one half, for example) the junction field of the relief cells than that of the normal cells.

As a result, the shortest information holding time was able to be extended to about 500 msec for the relief cells although the shortest information holding time was 100 msec for the normal cells. When 300 bits were to be relieved, the faulty product percentage for the standard of 250 msec of the refresh time was able to be reduced to 0.2% from 10% before the countermeasures were taken. The value 10% of the faulty product percentage cannot be ignored.

In the DRAM of this embodiment, the spacing of the bit lines BL to be connected with the relief cells can be made larger (to about two times, for example) than that of the bit lines BL to be connected with the normal cells, so that the capacitance of the bit lines BL to be connected with the relief cells can be made lower (to about 30%, for example) than that of the bit lines BL to be connected with the normal cells.

In the DRAM of this embodiment, moreover, the area occupied by the lower electrodes 20r of the relief cells can be made larger (to about two times, for example) than that of the lower electrodes 20 of the normal cells, so that the charge storage capacitance of the relief cells can be made larger (to about 1.5 times, for example) than that of the normal cells.

As a result, the shortest information holding time was able to be extended to about 700 msec for the relief cells although the shortest information storage time was 100 msec for the normal cells. When 300 bits were to be relieved, the faulty product percentage for the standard of 250 msec of the refresh time was able to be reduced to 0.1% from 10% before the countermeasures were taken. The value 0.1% of the faulty product percentage can be ignored.

The increase in the chip size of the case in which the element isolation width of the relief cell region is two times as large as that of the normal cell region is about 0.05%, which can be almost ignored.

(Embodiment 2)

Figure 25:
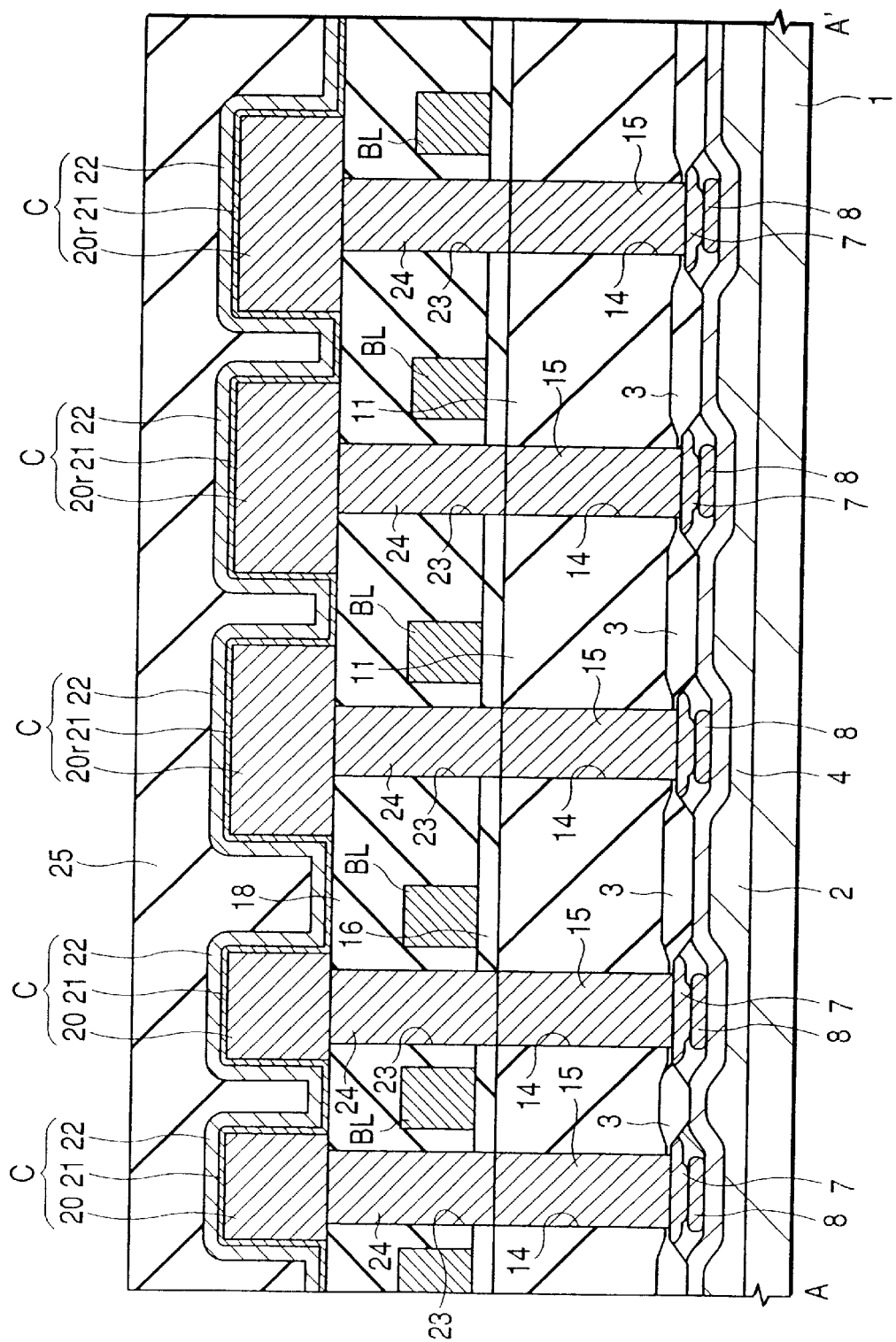
FIG. 25 is a section showing a DRAM of Embodiment 2 of the invention.

FIG. 25 is a section of a semiconductor substrate and shows a portion (the region having the normal memory cells and the region having the relief cells) of the DRAM of this embodiment.

In the DRAM of this embodiment, as in the Embodiment 1, the element isolation width of the relief cell region is made about two times, for example, as large as that of the normal cell region. With this construction, the field oxide film 3 of the relief cell region is rather thicker than the field oxide film 3 of the normal cell region, making it difficult for the parasitic MOS to operate just under the field oxide film 3. When the field oxide film 3 is thickened, more specifically, the element isolation ability hardly degrades even if the impurity concentration of the underlying p-wells 2 is lowered.

In this embodiment, therefore, the depth of the field relaxation layer 8 in the normal cell region is substantially equalized to that in the relief cell region, and the impurity concentration of the p-type semiconductor layer (the substrate concentration adjusting layer) 4 to be formed under the field oxide film 3 of the relief cell region is made lower than that of the p-type semiconductor layer (the substrate concentration adjusting layer) to be formed under the field oxide film 3 of the normal cell region. As a result, the junction field at the end portions of the element isolation region of the relief cells can be relaxed to extend the refresh time of the relief cells.

Figure 26:
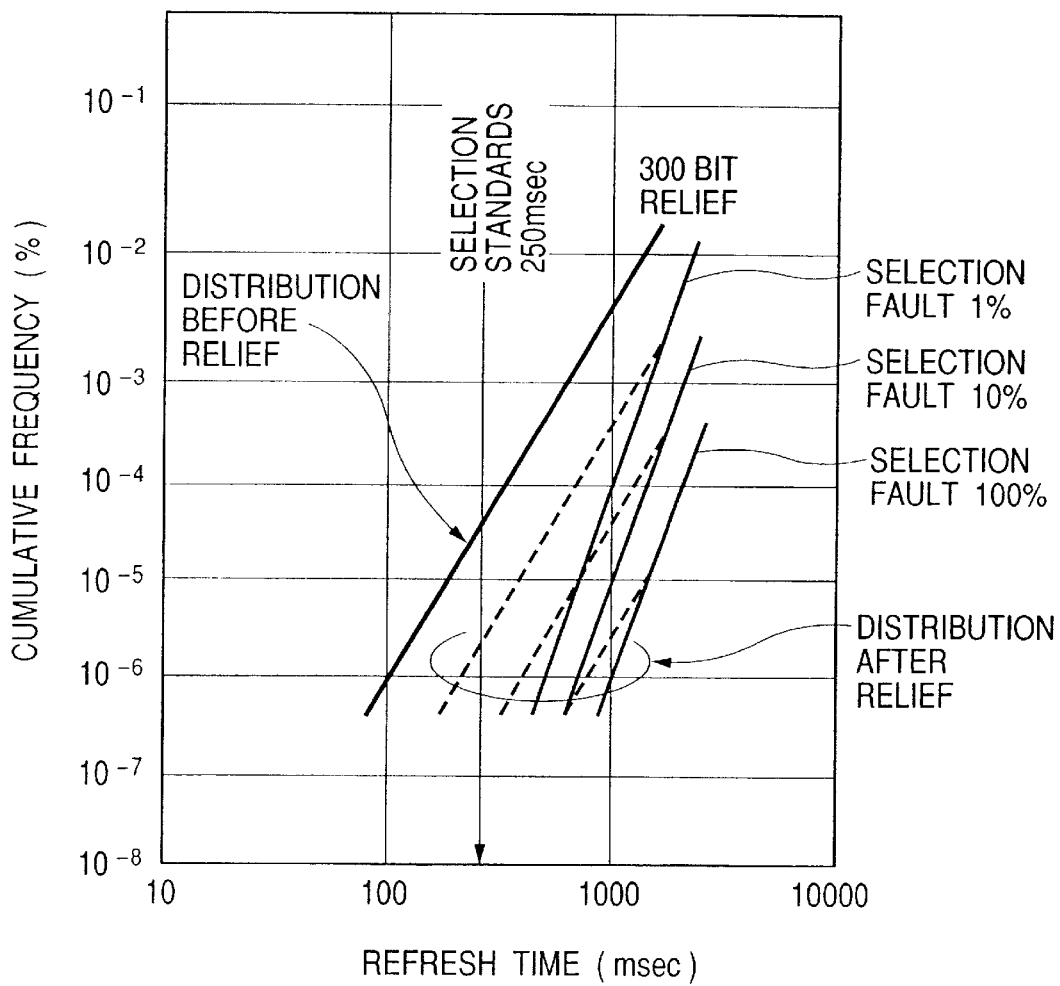
FIG. 26 is a graph for explaining the effects of the DRAM of Embodiment 2 of the invention.

When the impurity concentration under the field oxide film 3 of the relief cell region was set to about one third (the dosage was $2.5 \times 10^{12}$ atoms/cm$^2$) as high as that of the normal cell region, for example, the junction field of the relief cells was able to be reduced to about 40% of that of the normal cells. As a result, the shortest information holding time was able to be extended to about 300 msec for the relief cells although the shortest information holding time was 100 msec for the normal cells. As illustrated in FIG. 26, moreover, when 300 bits were to be relieved, the faulty product percentage for the standard of 250 msec of the refresh time was able to be reduced to 1% or less (about 0.2%) from 1 to 10% (about 5%) before the countermeasures were taken.

(Embodiment 3)

By making the element isolation width of the relief cell region two times as large as that of the normal cell region, in the foregoing Embodiments 1 and 2, the spacing of the bit lines BL to be connected with the relief cells is made about two times as large as that of the bit lines BL to be connected with the normal cells, and the area occupied by of the lower electrodes 20r of the relief cells is made two times as large as that of the lower electrodes 20 of the normal cells.

Thus, in the lithography process for manufacturing the relief cells, the optimization conditions for the pattern to form the desired structure are in a very narrow range to reduce the process margins. When the element isolation width of the relief cell region is made closer to that of the normal cell region, on the contrary, the optimization conditions for the pattern to form the desired structure can be widened to increase the process margins.

Figure 27:
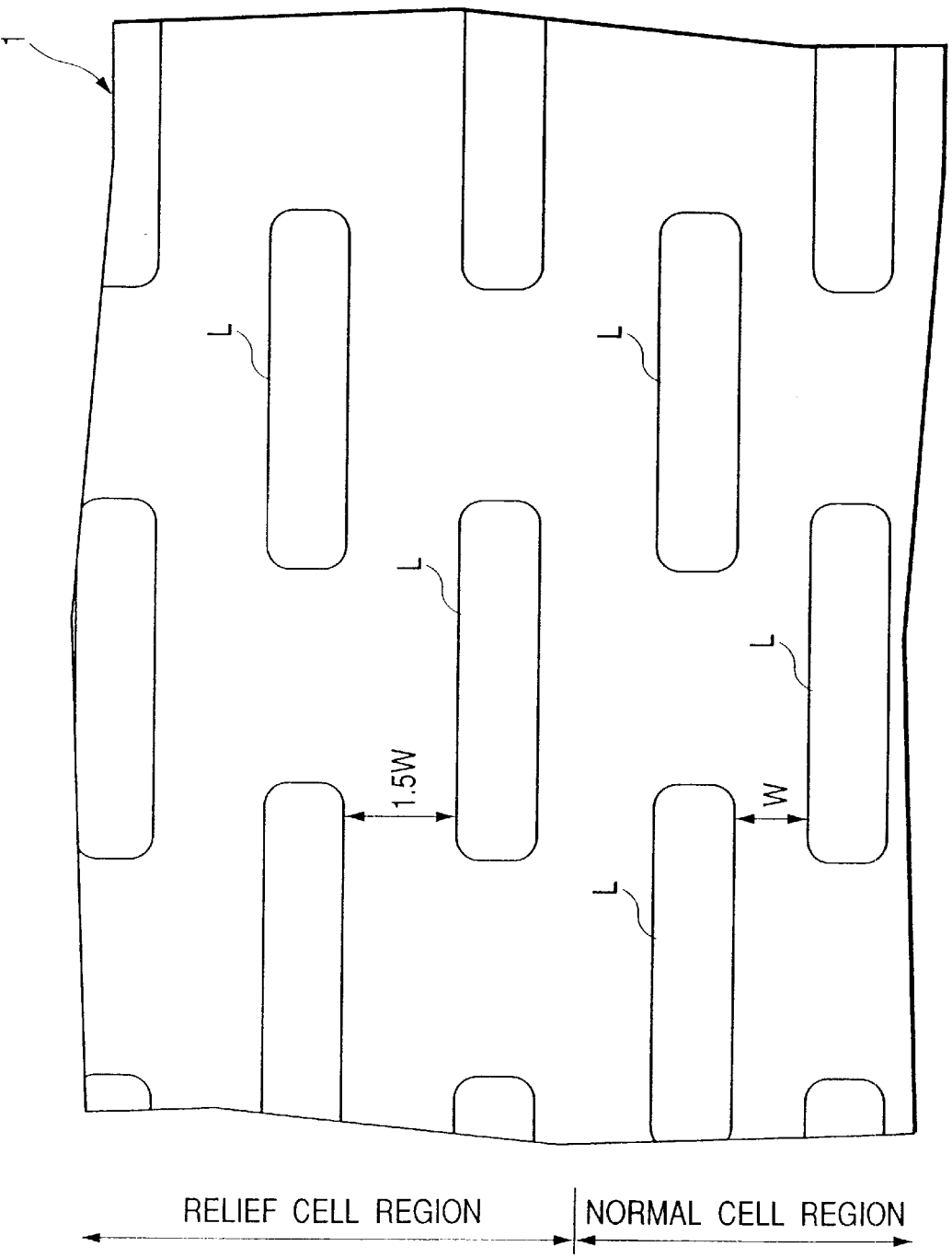
FIG. 27 is a top plan view showing an element isolation pattern of a DRAM of Embodiment 3 of the invention.

In this embodiment, therefore, the relief cells and the normal cells are manufactured by making the element isolation width of the relief cell region 1.5 times as large as the element isolation width (W) of the normal cell region, as shown in FIG. 27. As a result, when the depth of the field relaxation layer of the relief cells was reduced to 1.5 times from about two times of Embodiment 1 as large as that of the normal cells thereby to reduce the junction field to about 70% of the normal cells, the shortest information holding time was able to be extended to about 300 msec for the relief cells although the shortest information holding time was 100 msec for the normal cells. Moreover, the faulty product percentage for the standard of 250 msec was able to be reduced to 0.5%.

When the bit line spacing of the relief cells was reduced to 1.5 times from about two times of the normal cells in Embodiment 1 to reduce the junction field to about 80% of that of the normal cells and when the area occupied by the lower electrodes of the relief cells was reduced to about 1.5 times as large as that of the lower electrodes of the normal cells to set the charge storage capacitance to about 1.2 times as that of the normal cells, the shortest information holding time of the relief cells was able to be extended to about 400 msec. Moreover, the faulty product percentage for the standard of 250 msec was able to be reduced to 0.3%.

When the impurity concentration below the field oxide film 3 of the relief cell region was lowered to one half from one third of the normal cell region in Embodiment 2, moreover, the shortest information holding time of the relief cells was able to be extended to about 250 msec. Moreover, the faulty product percentage for the standards of 250 msec was able to be reduced to 1%.

The increase in the chip size of the case in which the element isolation width of the relief cell region is decreased to 1.5 times as large as that of the normal cell region is about 0.03%, which can be almost ignored.

(Embodiment 4)

Figure 28:
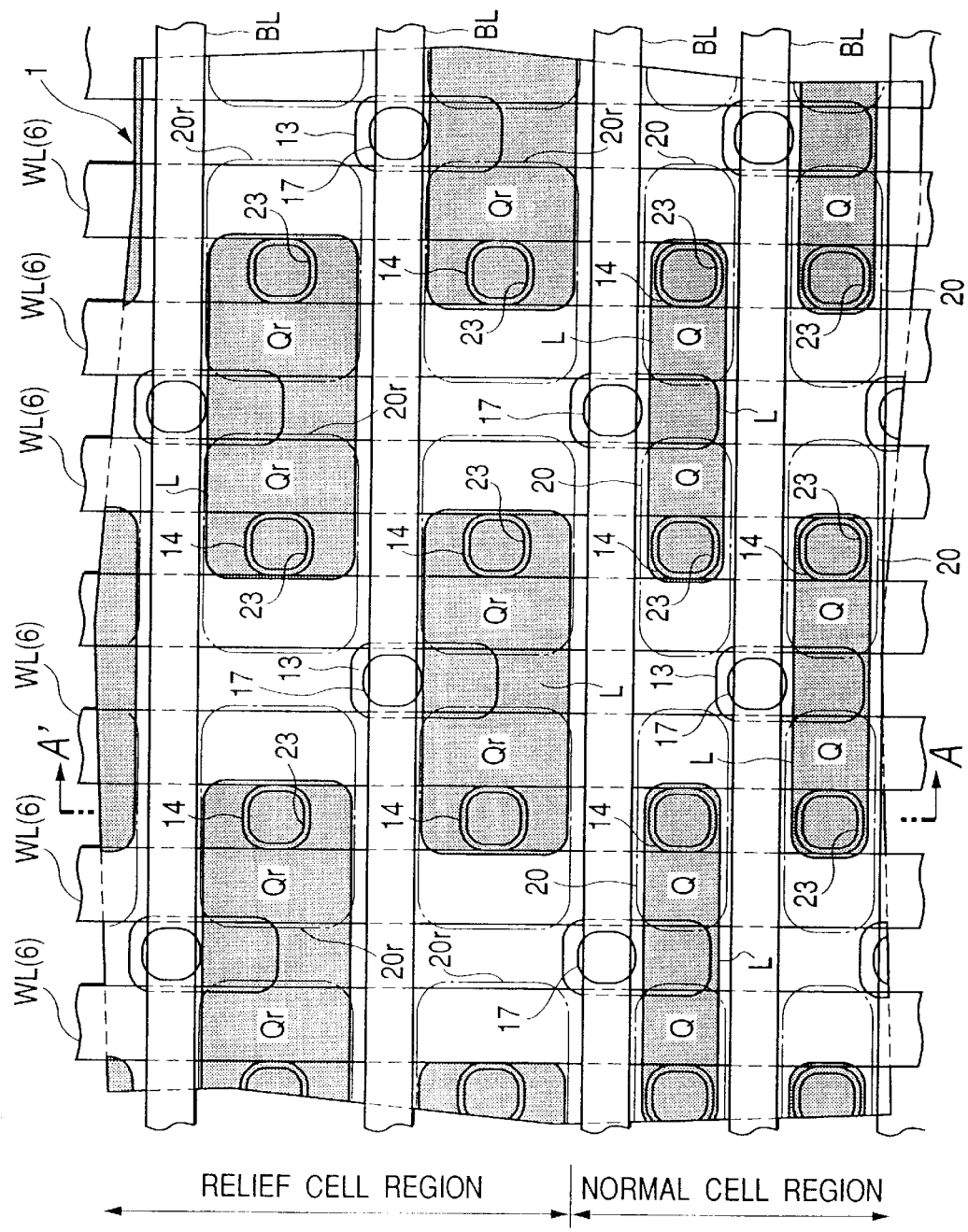
FIG. 28 is a top plan view showing a DRAM of Embodiment 4 of the invention.
Figure 29:
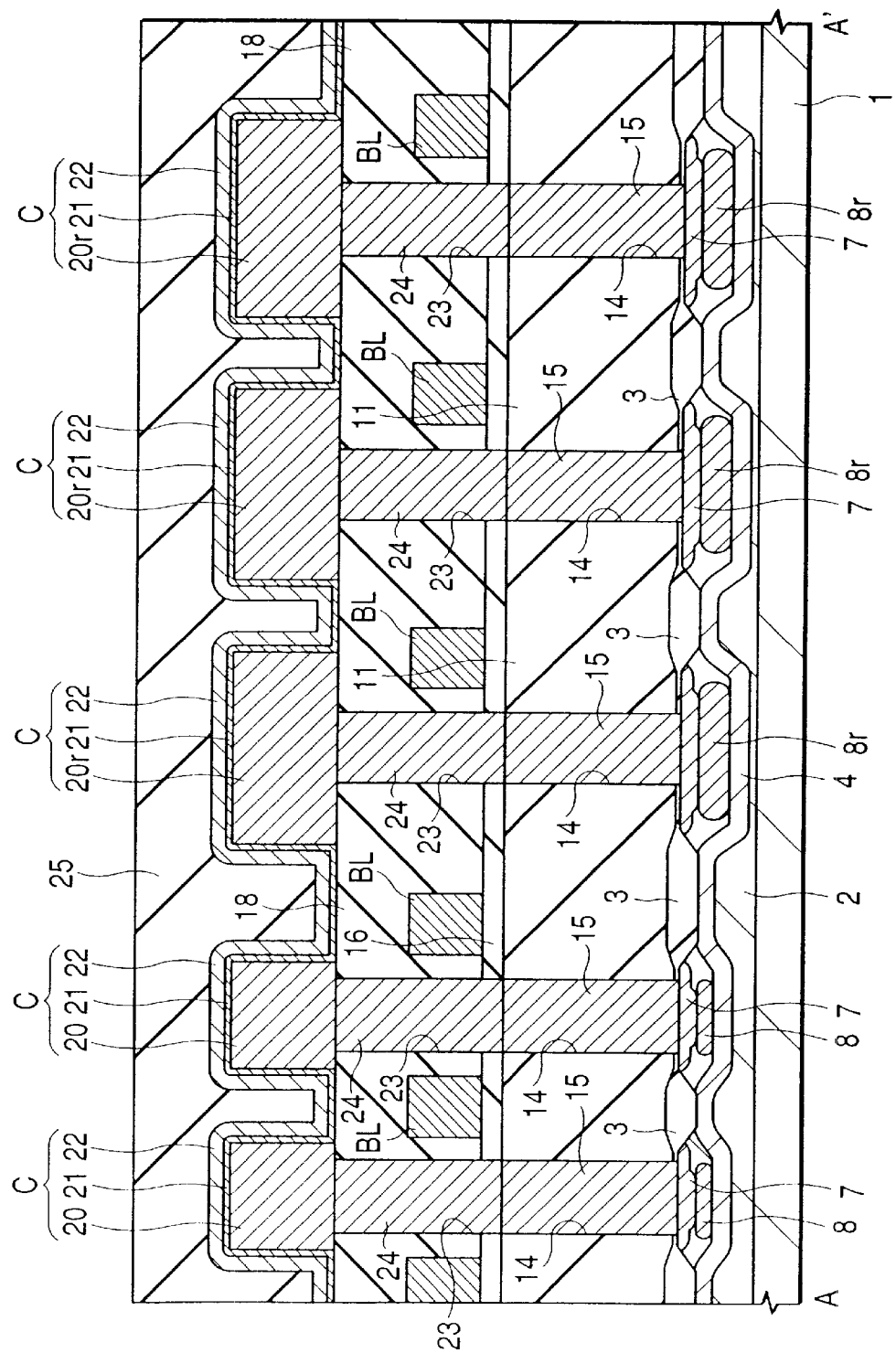
FIG. 29 is a section taken along line A–A' of FIG. 28.

FIG. 28 is a top plan view of a semiconductor substrate and shows a portion (the region having the normal memory cells and the region having the relief cells) of the DRAM of this embodiment, and FIG. 29 is a section taken along line A–A' of FIG. 28.

Figure 30:
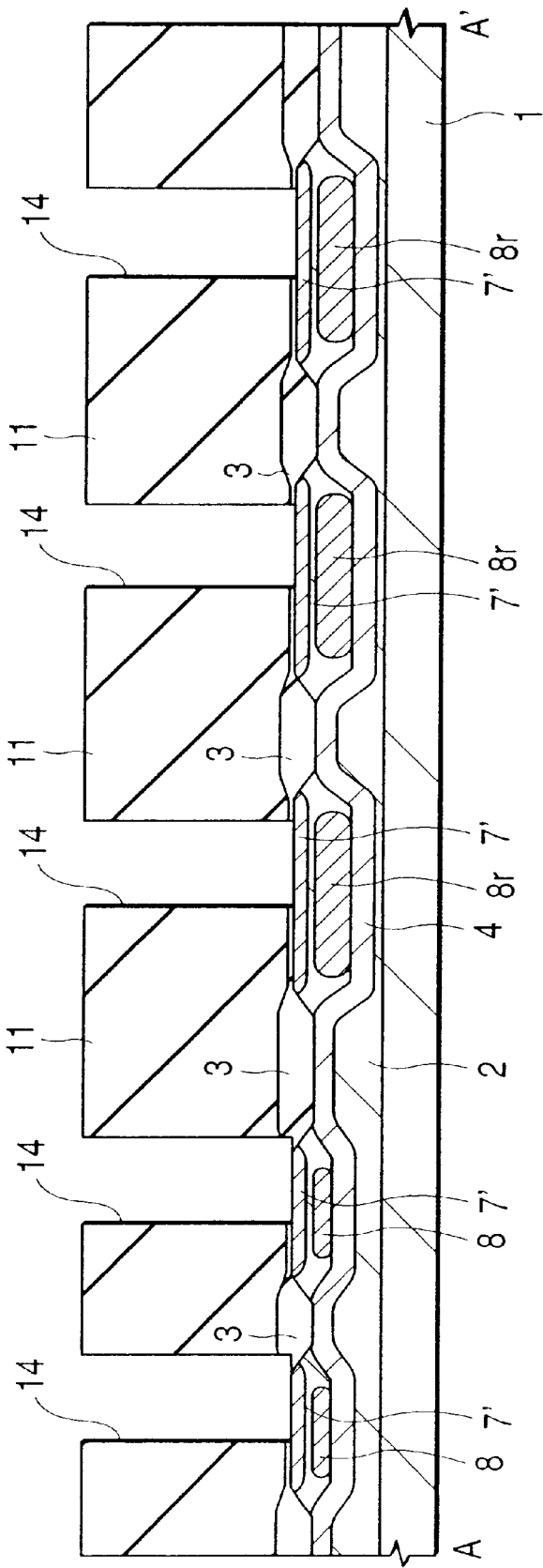
FIG. 30 is a section showing one manufacture step of the DRAM of Embodiment 4 of the invention.

In this embodiment, the active region width (the active region width in the extending direction of the word lines WL) of the relief cells is made larger (to about two times, for example) than that of the normal cells. FIGS. 28 and 29 show the case in which the misalignment of the active region with the contact holes 14 is 0. When the width along the short side of the active region becomes as small as the resolution limit of the lithography, however, the maximum misalignment is about 30% of the width. In this case, the diameter (the diameter in the extending direction of the word lines WL) of the contact holes 14 is substantially equal to the active region width, so that the field oxide film 3 is removed in the vicinity of the end portions of the active region, as shown in FIG. 30 when the contact holes 14 are formed. This deepens the n-type semiconductor regions 7 of a high impurity concentration, which is formed by the impurity diffusion from the plugs 15 of the polycrystalline silicon buried in the contract holes 14. As a result, the element isolation characteristics have to be kept by increasing the impurity concentration of the p-type semiconductor layer 4 under the field oxide film 3, so that the junction field of the active region end portions is strengthened.

In the DRAM of this embodiment, the field oxide film 3 is not removed partially in the vicinity of the active region end portions by making the active region width of the relief cells larger than that of the normal cells even when misalignment of the active region with the contact holes 14 occurs, so that the n-type semiconductor regions 7 of the high impurity concentration can be formed shallowly. As a result, the distance from the p-type semiconductor layer 4 under the field oxide film 3 can be sufficiently ensured even for a miniaturized cell size, so that the refresh time of the relief cells can be extended by weakening the junction field at the end portions of the n-type semiconductor regions 7.

When the impurity concentration of the p-type semiconductor layer 4 formed below the field oxide film of the relief cell region, and the depth of the n-type semiconductor regions 7 were individually reduced to halves of the normal cell regions, the junction field of the relief cells was able to be reduced to about 70% of that of the normal cells. As a result, the shortest information holding time of the relief cells was able to be extended to about 250 msec. Moreover, the faulty product percentage of the aforementioned standards was able to be reduced to about 1%.

When the size and shape of the contact holes 14 are equalized for the relief cells and the normal cells and when the active region width of the relief cells is made larger than that of the normal cells, the pitch (the pitch in the extending direction of the word lines WL) of the contact holes 14 in the relief cell region becomes different from that in the normal cell region. Therefore, at the lithography process for forming the contact holes 14, the optimization conditions for achieving the desired size and shape are restricted to a narrow range, and the diameter of the contact holes 14 of the relief cell region may become larger than that of the normal cell region. As a result, in the relief cell region, the field oxide film 3 in the vicinity of the active region-end portions is removed partially to increase the junction field at the end portions of the n-type semiconductor regions 7, as described hereinbefore.

Figure 31:
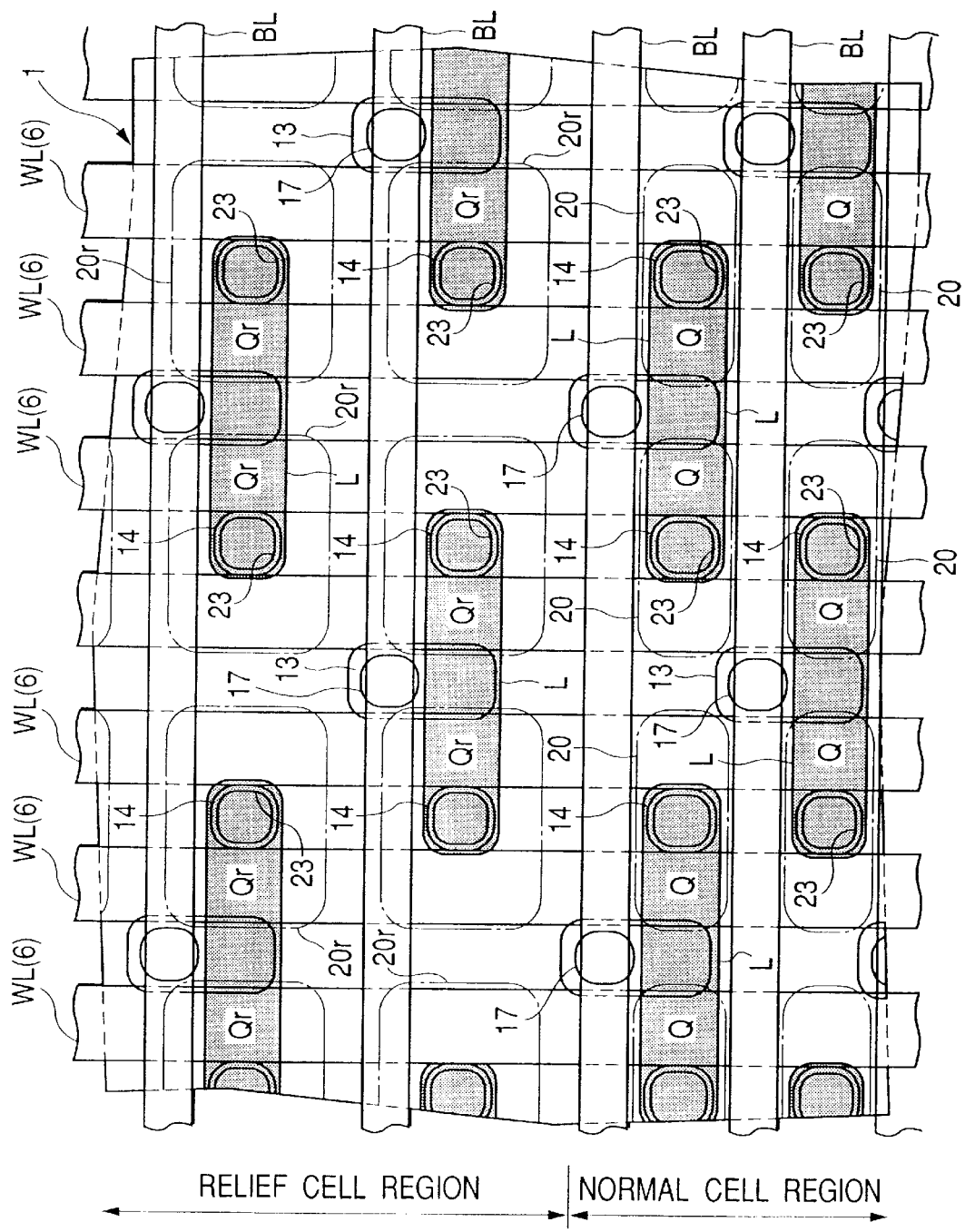
FIG. 31 is a top plan view showing the DRAM of Embodiment 4 of the invention.

For preventing this increase, the contact holes 14 of the relief cells are formed into a generally rectangular mask pattern having a larger diameter in the X-direction (in the extending direction of the bit lines BL) than that in the Y-direction (in the extending direction of the word lines WL), for example, as shown in FIG. 31. As a result, the optimization conditions for the pattern necessary to achieve the desired shape and size are in a wide region, so that the diameter of the contact holes 14 in the Y-direction can be set substantially to the designed size thereby to prevent the aforementioned partial removal of the field oxide film 3.

As a result, the junction field of the relief cells was able to be made lower (to about 35%, for example) than that of the normal cells. Moreover, the shortest information holding time was able to be extended to about 280 msec for the relief cells although the same was 100 msec for the normal cells. When 300 bits were to be relieved, still moreover, the faulty product percentage for the standard of the refresh time of 250 msec was able to be reduced to 0.7 to 0.8% from 10% before the counter-measures were taken.

Contrarily, when the size and shape of the contact holes 14 of the relief cells are equalized to those of the n-type semiconductor and when the active region width of the relief cells is larger than that of the normal cells, the diameter of the contract holes 14 of the relief cell region tends to become smaller than that of the normal cell region. In this case, the dry-etching for forming the contact holes 14 tends to be insufficiently performed to cause the lower electrodes (the storage electrodes) 20 not to be electrically connected with the n-type semiconductor regions 7.

In this embodiment in which the contact holes 14 are formed into the generally rectangular mask pattern having a larger diameter in the X-direction than that in the Y-direction, the optimization conditions for the pattern to achieve the desired shape and size are in a wide range, so that the diameter of the contact holes 14 in the Y-direction can be generally the desired value thereby to prevent the aforementioned partial removal of the field oxide film 3. As a result, the optimization conditions for the pattern to achieve the desired shape and size are in a wide range, so that the probability that the lower electrodes (the storage electrodes) 20 are electrically connected to the n-type semiconductor regions 7 can be reduced to prevent the increase in the faulty product percentage, as might otherwise be caused by the fault factors other than the information holding characteristics.

(Embodiment 5)

Figure 32:
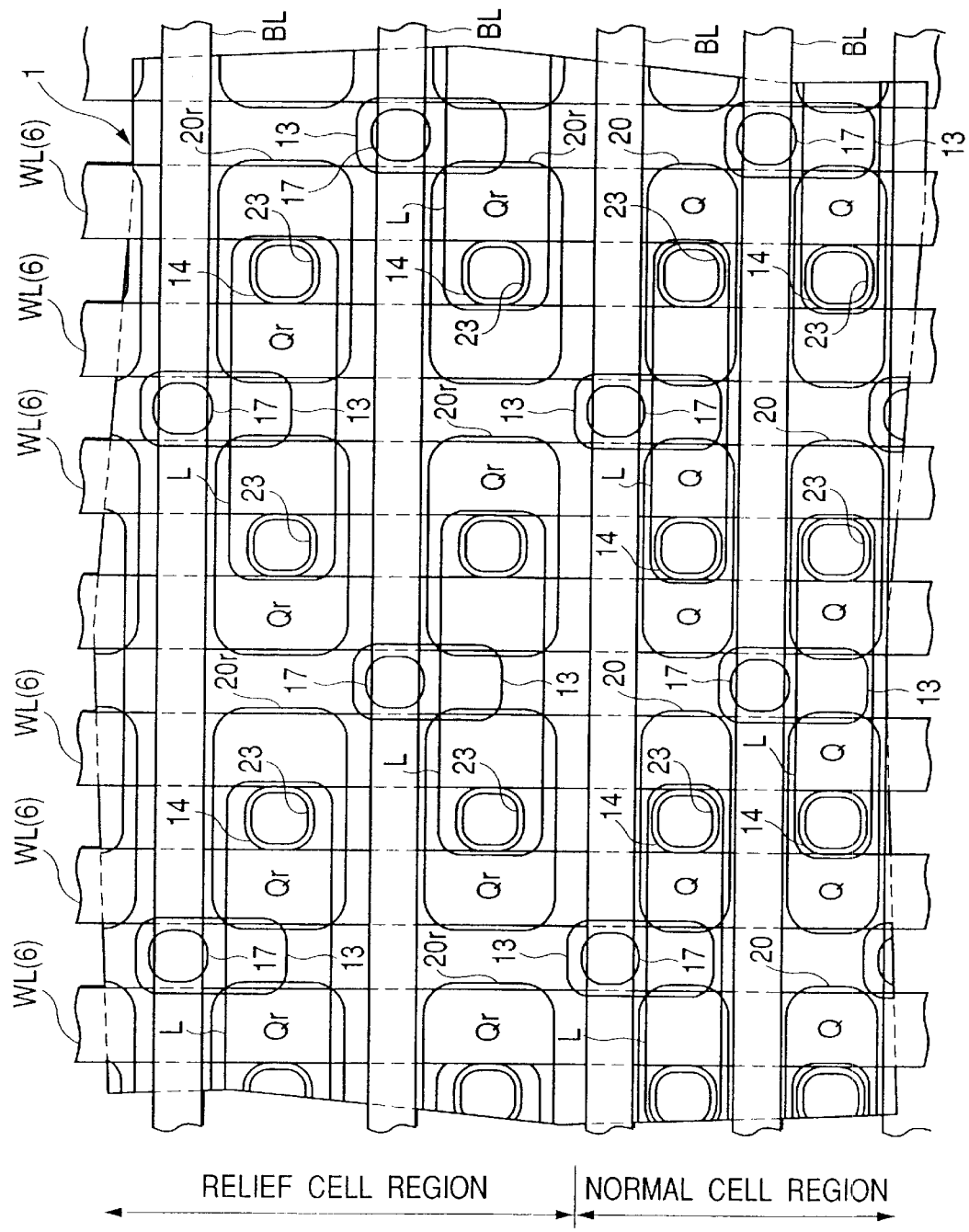
FIG. 32 is a top plan view showing a DRAM of Embodiment 5 of the invention.

FIG. 32 is a top plan view of a semiconductor substrate and shows a portion (i.e., the region having the normal memory cells and the region having the relief cells) of the DRAM of this embodiment.

In this embodiment, the element isolation width (i.e., the width in the extending direction of the word lines WL) of the relief cell region is made 1.5 times as large as that of the normal cell region, and the active region width (i.e., the width in the extending direction of the word lines WL) of the relief cells is made 1.5 times as large as that of the normal cells.

As a result, when the depth of the field relaxation layer of the relief cells is set to about 1.5 times of that of the normal cells, the depth of the n-type semiconductor region (the source and drain) is set to about one half of that of the normal cells, the charge storing capacitance is set to about 1.5 times of that of the normal cells, the bit line capacitance is set to about two thirds of that of the normal cells, and the impurity concentration of the substrate under the field oxide film is set to about one half of that of the normal cells, the shortest information holding time of the relief cells can be extended to about 800 msec. Moreover, the faulty product percentage of the aforementioned standards can be reduced to 0.1% or less.

(Embodiment 6)

In the DRAM of this embodiment, the film thickness of the side wall spacers formed on the side walls of the gate electrodes 6 (the word lines WL) of the memory cell selecting MISFET Qr of the relief cells is made larger than that of the side wall spacers formed on the side walls of the gate electrodes 6 (the word lines WL) of the memory cell selecting MISFET Qs of the normal cells. Moreover, the thickness of the gate oxide film 5 of the memory cell selecting MISFET Qr of the relief cells is made larger than that of the gate oxide film 5 of the memory cell selecting MISFET Qs of the normal cells.

The process for manufacturing the normal cells and the relief cells of this embodiment will be described with reference to FIGS. 33 to 46. In these drawings, (a) indicates sections of the normal cell region, and (b) indicates the sections of the relief cell region.

Figure 33A:
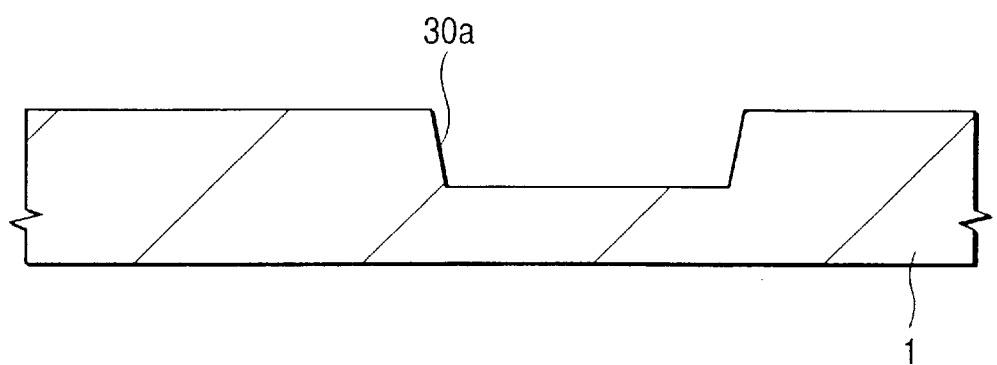
FIGS. 33 to 46 are sections showing a process for manufacturing a DRAM of Embodiment 6 of the invention.
Figure 33B:
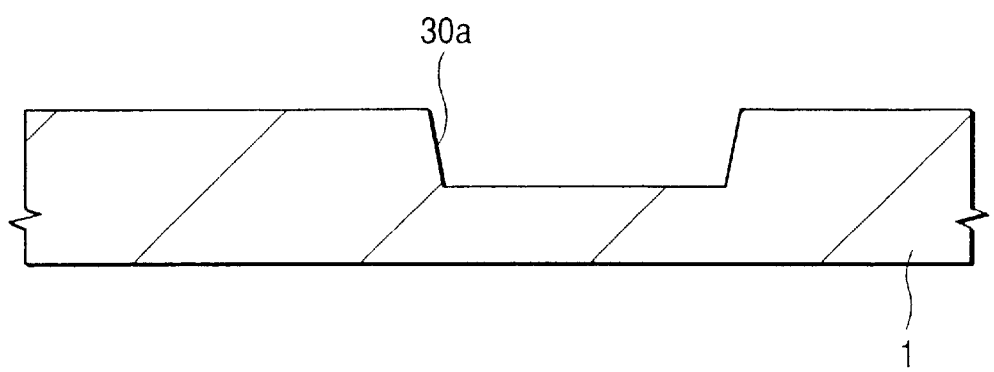
Figure 34A:
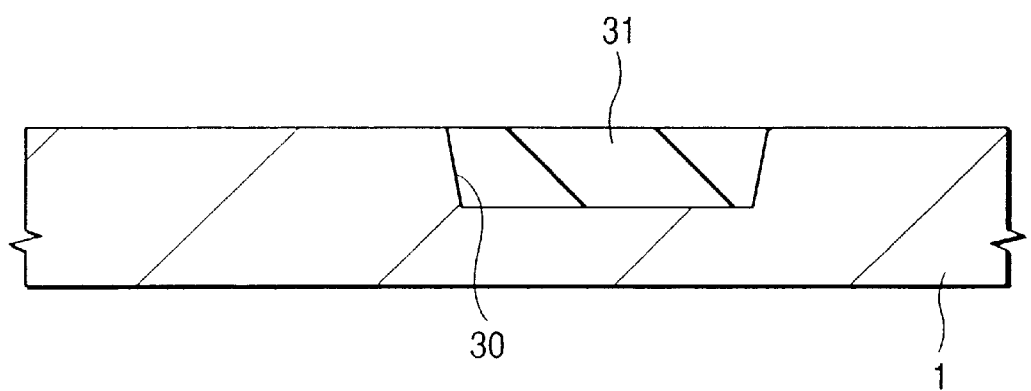
Figure 34B:
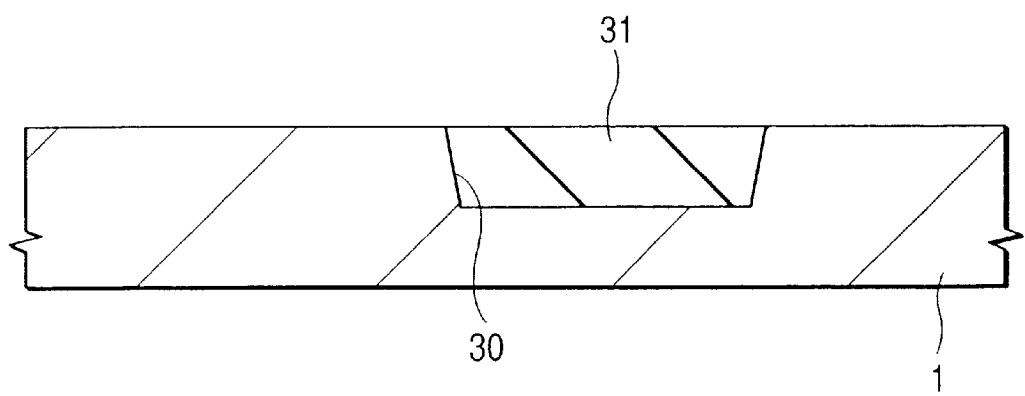

First, the semiconductor substrate 1 is etched to form a groove 30a, as shown in FIG. 33. After this, a silicon oxide film 31 deposited on the semiconductor substrate 1 by a CVD method is polished by a chemical-mechanical polishing method and is left in the groove 30a to form an element isolation groove 30, as shown in FIG. 34.

Figure 35A:
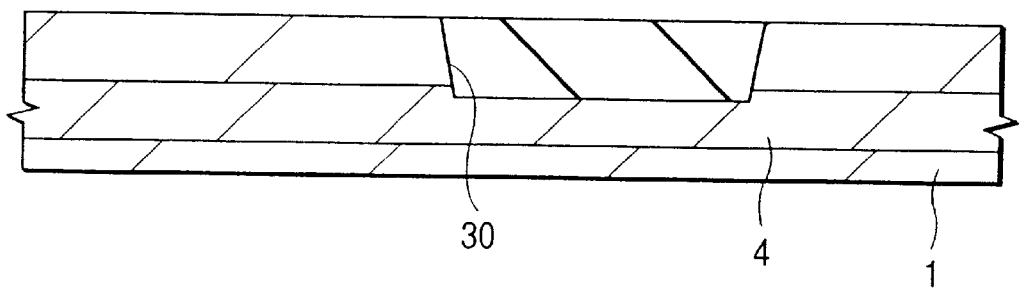
Figure 35B:
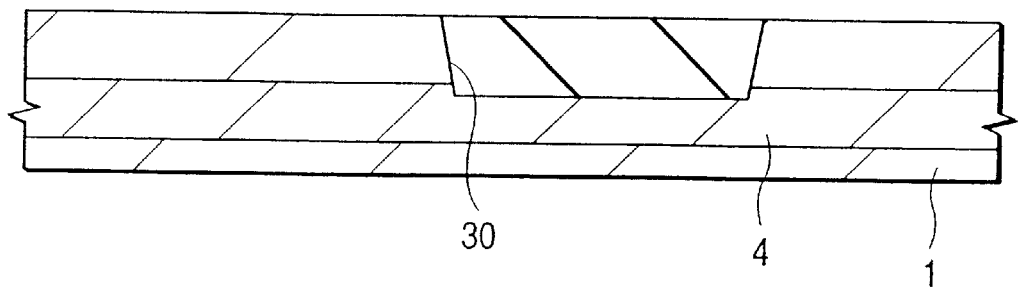
Figure 36A:
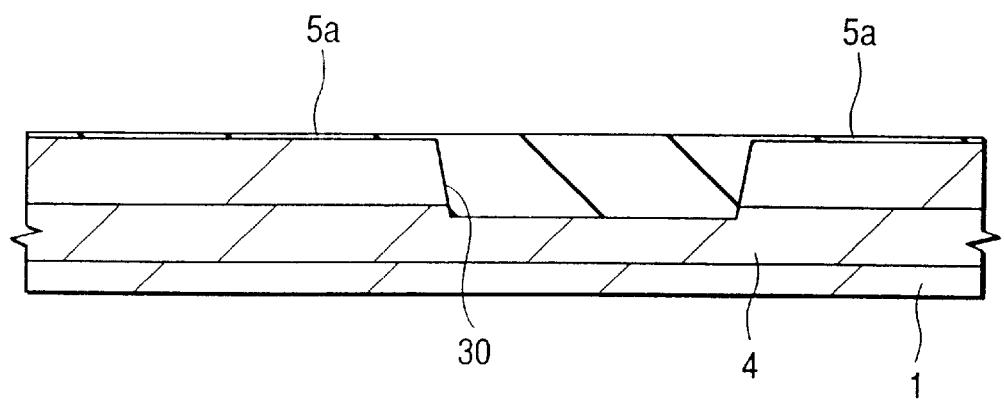
Figure 36B:
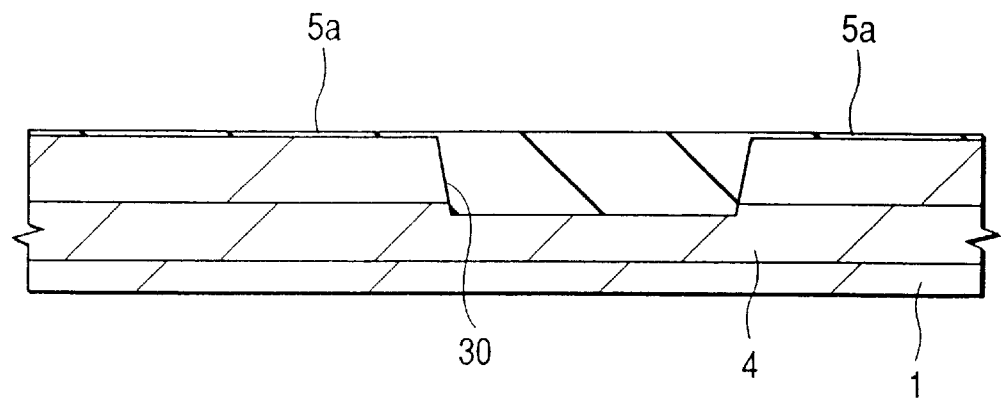

Next, as shown in FIG. 35, the semiconductor substrate 1 is implanted with ions of B (boron) under the conditions of 300 KeV, 1×10$^{13}$ atoms/cm$^2$, 150 KeV, 2×10$^{12}$ atoms/cm$^2$, 40 KeV, 1×10$^{12}$ atoms/cm$^2$, 10 KeV and 5×10$^{12}$ atoms/cm$^2$ to form the p-type semiconductor layer (the substrate concentration layer) 4. After this, as shown in FIG. 36, the semiconductor substrate 1 is wet-oxidized to form a gate oxide film 5a having a thickness of about 10 nm on the surface of the active region.

Figure 37A:
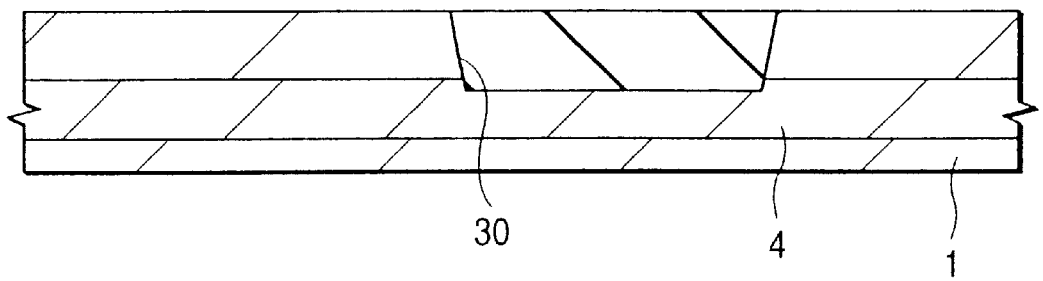
Figure 37B:
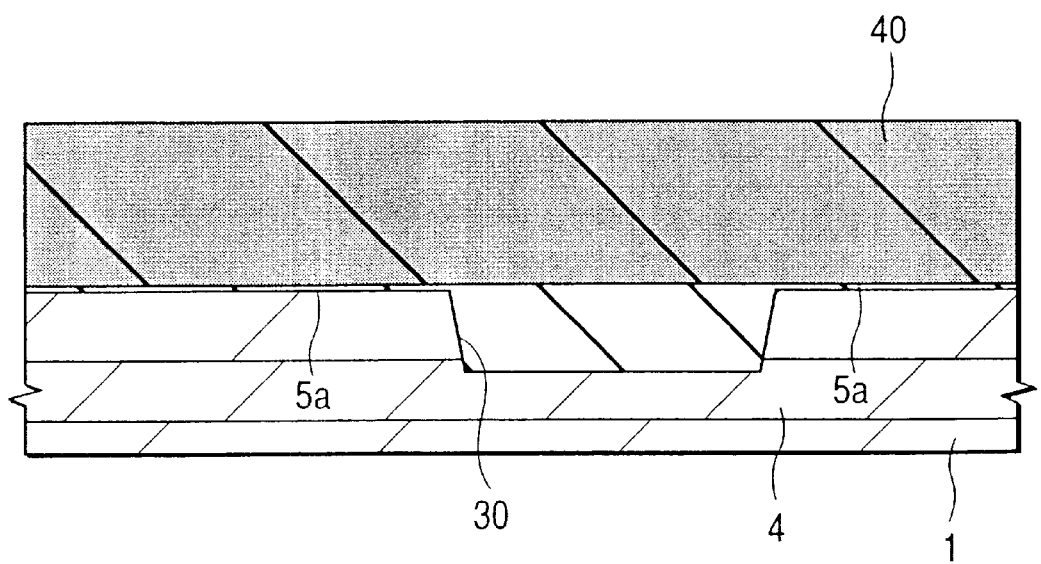
Figure 38A:
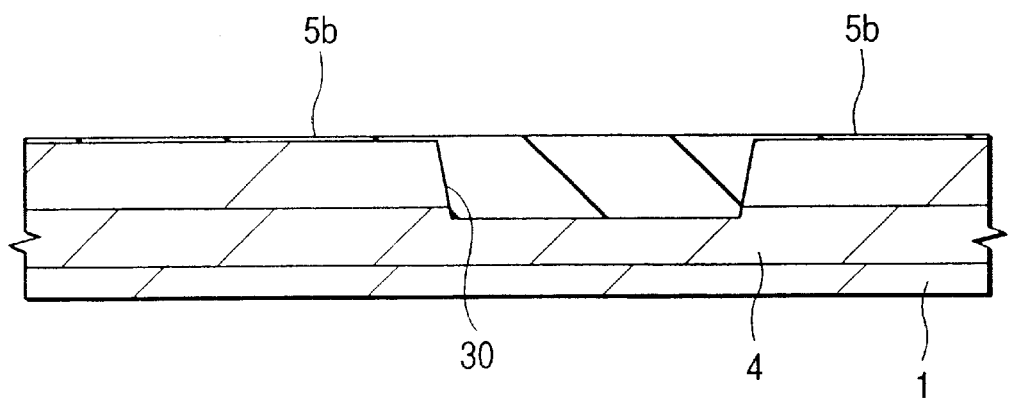
Figure 38B:
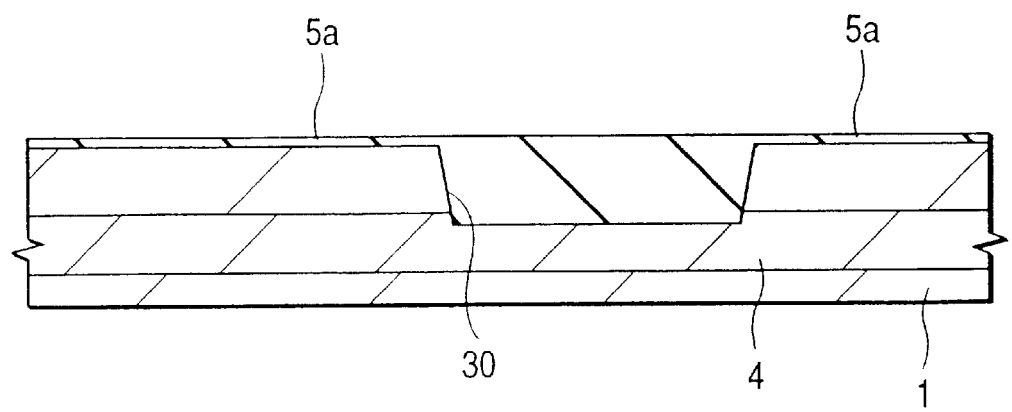

Next, as shown in FIG. 37, the surface of the relief cell region is covered with a photoresist film 40, and the gate oxide film 5a of the normal cell region is wet-etched off. After this, as shown in FIG. 38, the semiconductor substrate 1 is wet-oxidized again to form a gate oxide film 5b having a thickness of about 8 nm in the normal cell region. As a result of this oxidation, the gate oxide film 5a of the relief cell region also grows to have a thickness of about 13 nm. In other words, the gate oxide film 5a of the relief cell region grows thicker than the gate oxide film 5b of the normal cell region.

Figure 39A:
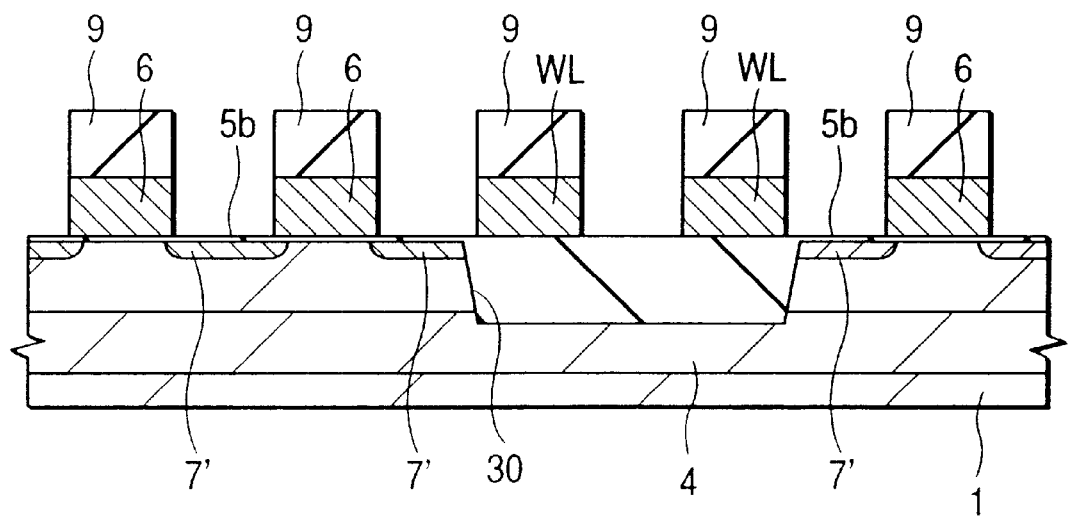
Figure 39B:
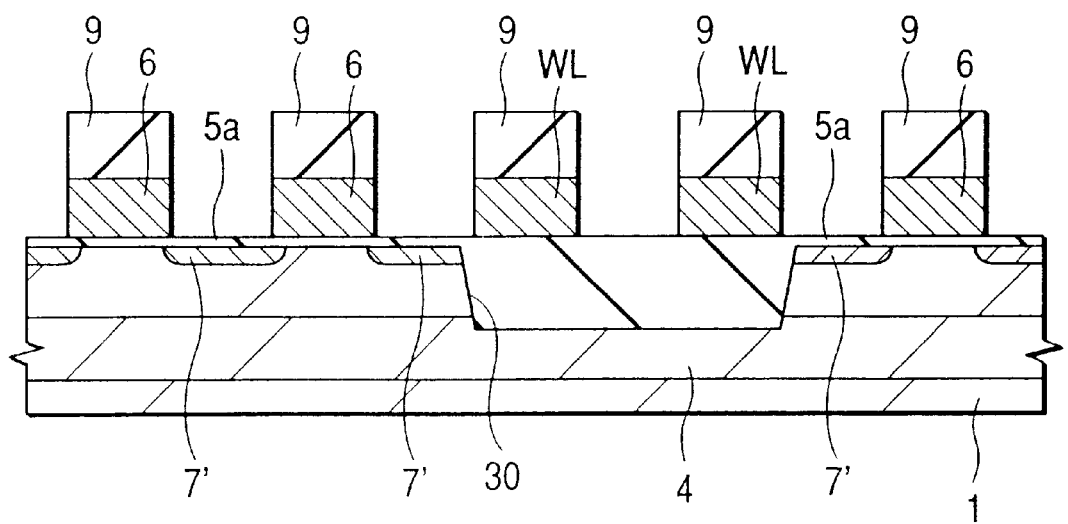

Next, as shown in FIG. 39, the gate electrodes 6 (the word lines WL) of the memory cell selecting MISFETs Qs are formed over the gate oxide film 5b of the normal cell region, and the gate electrodes 6 (the word lines WL) of the memory cell selecting MISFETs Qr are formed over the gate oxide film 5b of the relief cell region. These gate electrodes 6 (the word lines WL) are formed by depositing the polycrystalline silicon film doped with P (phosphor), the WSi$_2$ (tungsten silicide) film and the silicon nitride film 9 sequentially on the semiconductor substrate 1 by a CVD method, and then by patterning those films by a etching method using a photoresist film as the mask. After this, the semiconductor substrate 1 is implanted with ions of P (phosphor) to form the n-type semiconductor regions 7' (the source, drain) of the memory cell selecting MISFETs Qs, Qr.

Figure 40A:
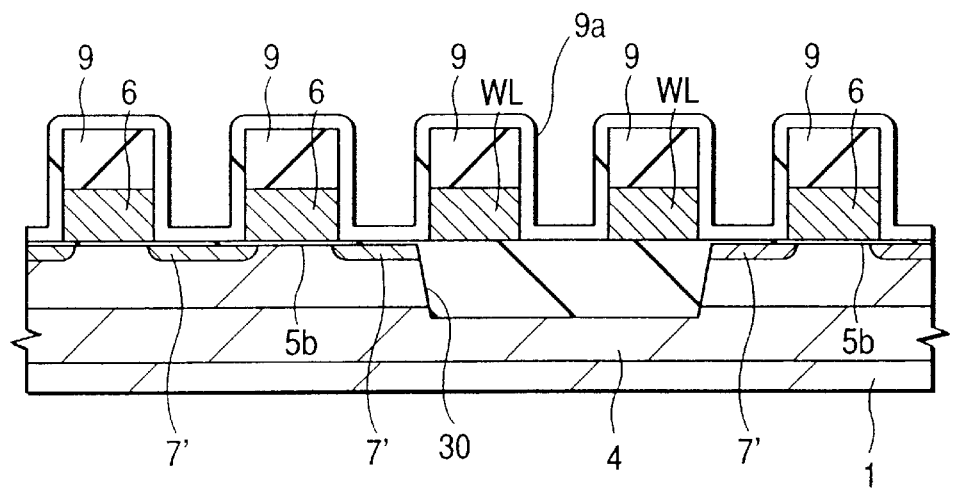
Figure 40B:
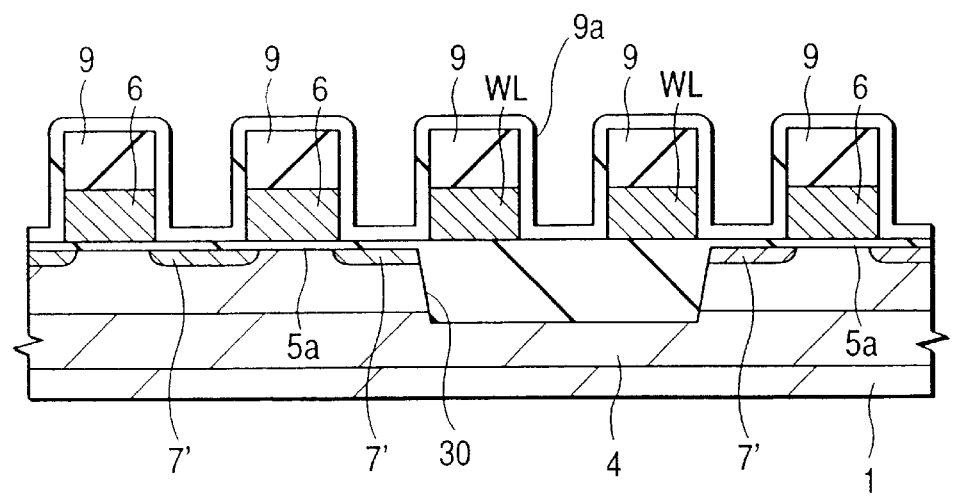
Figure 41A:
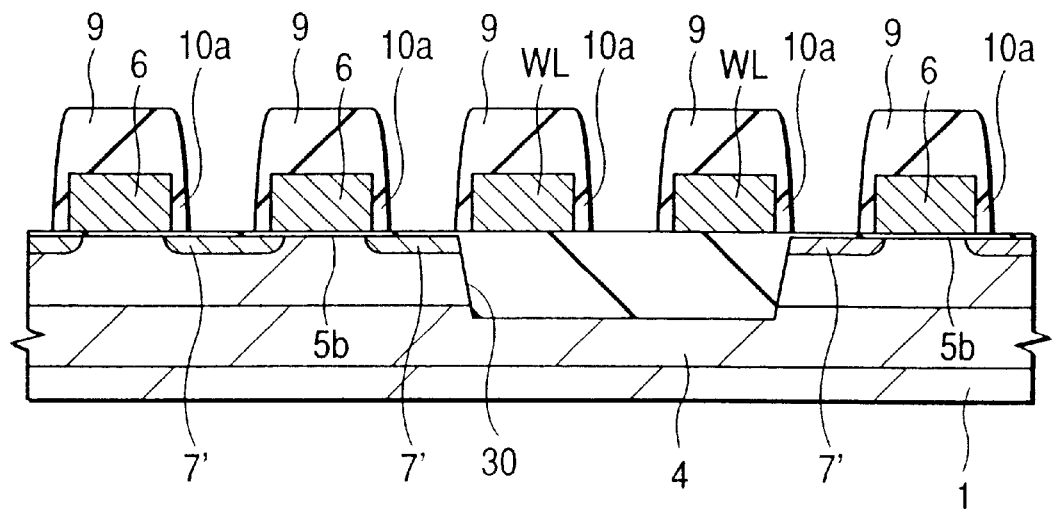
Figure 41B:
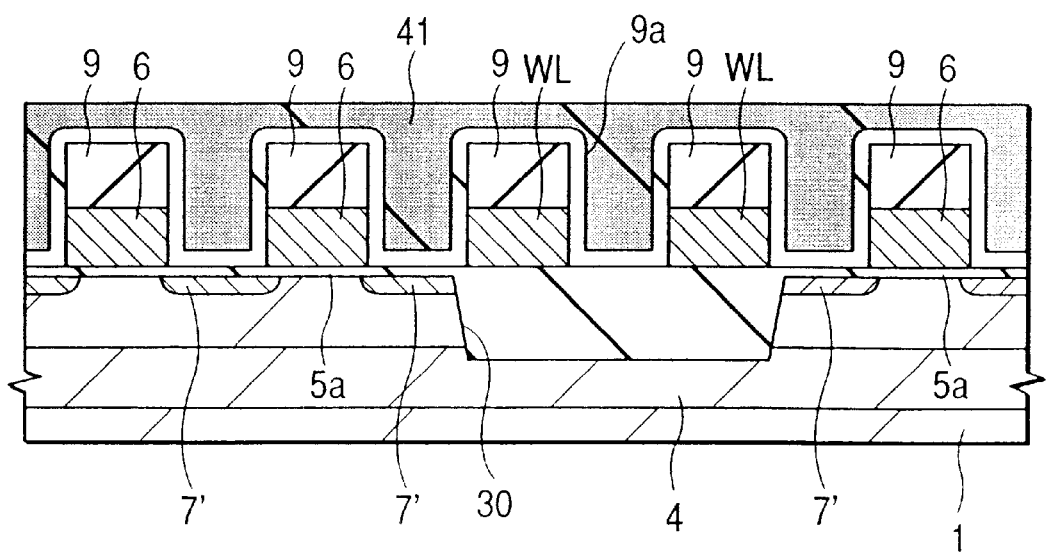

Next, as shown in FIG. 40, a silicon nitride film 9a having a thickness of about 50 nm is deposited on the semiconductor substrate 1 by a CVD method. After this, as shown in FIG. 41, side wall spacers 10a having a film thickness of about 30 nm are formed on the side walls of the gate electrodes 6 (the word lines WL) of the memory cell selecting MISFETs Qs by covering the surface of the relief cell region with a photoresist film 41 to etch the silicon nitride film 9a of the normal cell region anisotropically.

Figure 42A:
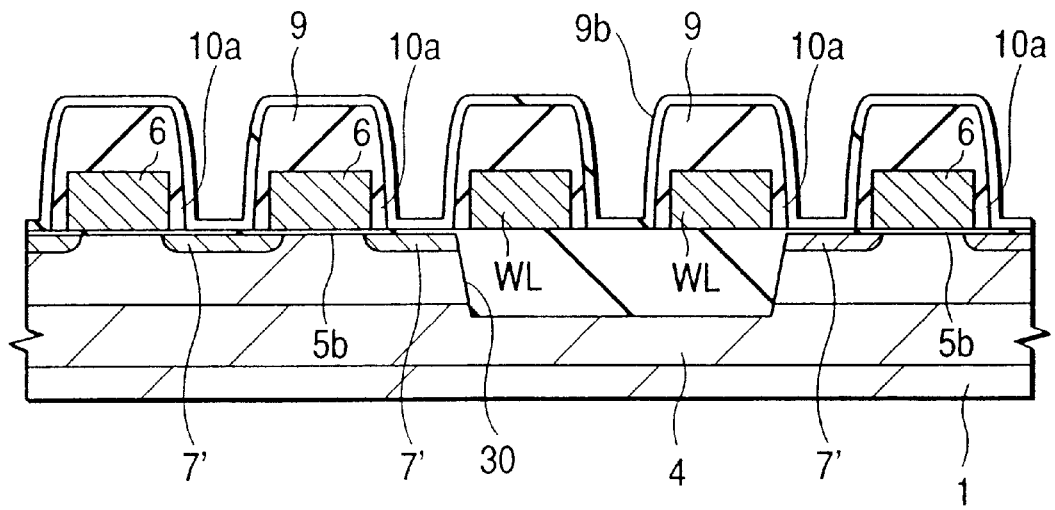
Figure 42B:
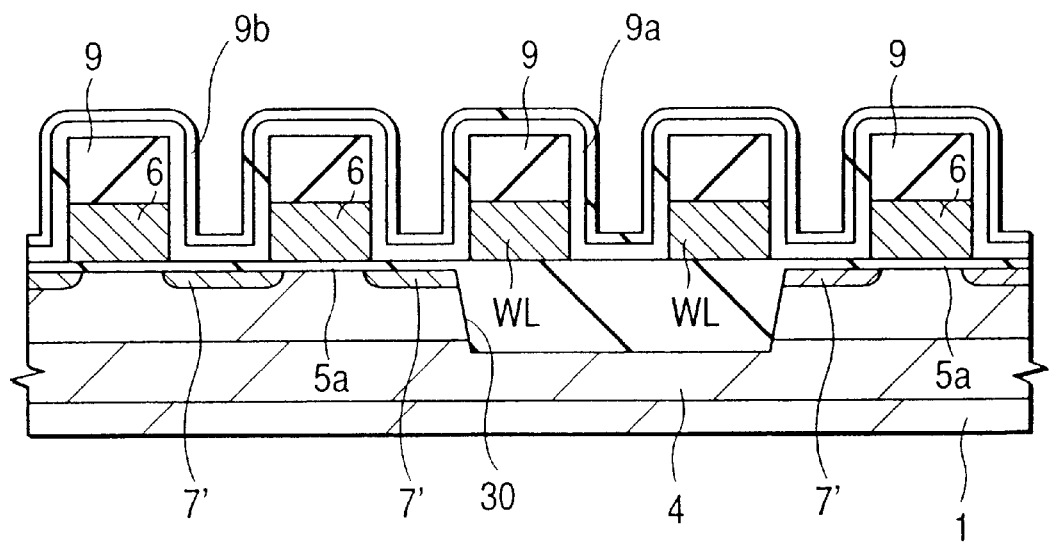
Figure 43A:
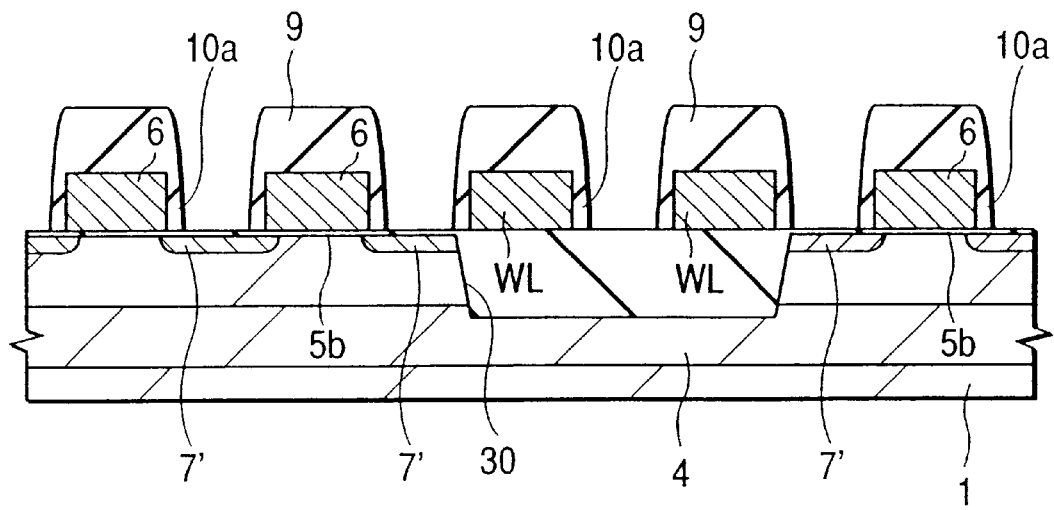
Figure 43B:
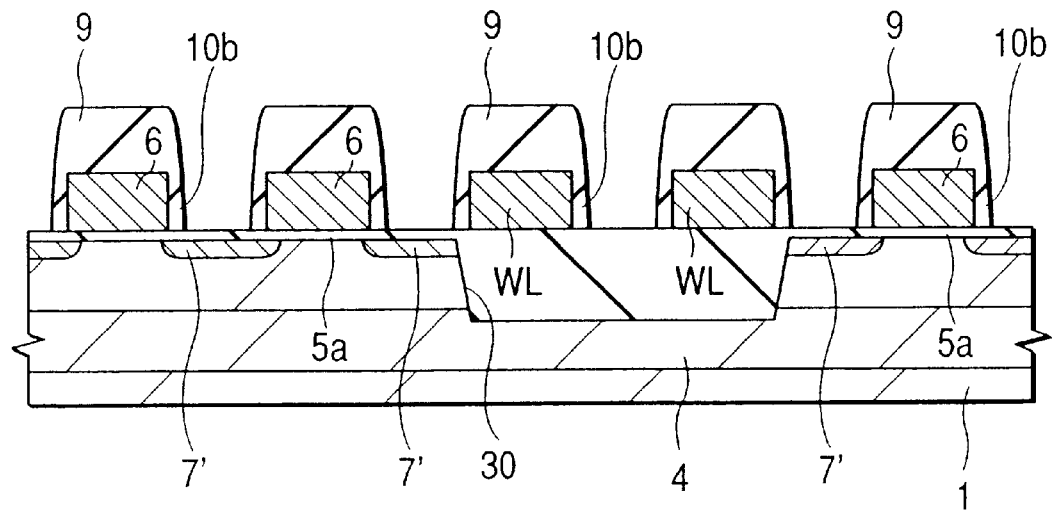

Next, as shown in FIG. 42, the silicon nitride film 9b having a thickness of about 30 nm is deposited on the semiconductor substrate 1. After this, as shown in FIG. 43, side wall spacers 10b having a film thickness of about 70 nm are formed on the side walls of the gate electrodes 6 (the word lines WL) of the memory cell selecting MISFETs Qr by etching the silicon oxide film 9b and the silicon nitride film 9a of the relief cell region anisotropically. At this time, the side wall spacers 10a formed on the side walls of the gate electrodes 6 (the word lines WL) of the normal cells has a film thickness of about 50 nm. In other words, the side wall spacers 10b of the relief cell region is thicker than the side wall spacers 10a of the normal cell region.

Figure 44A:
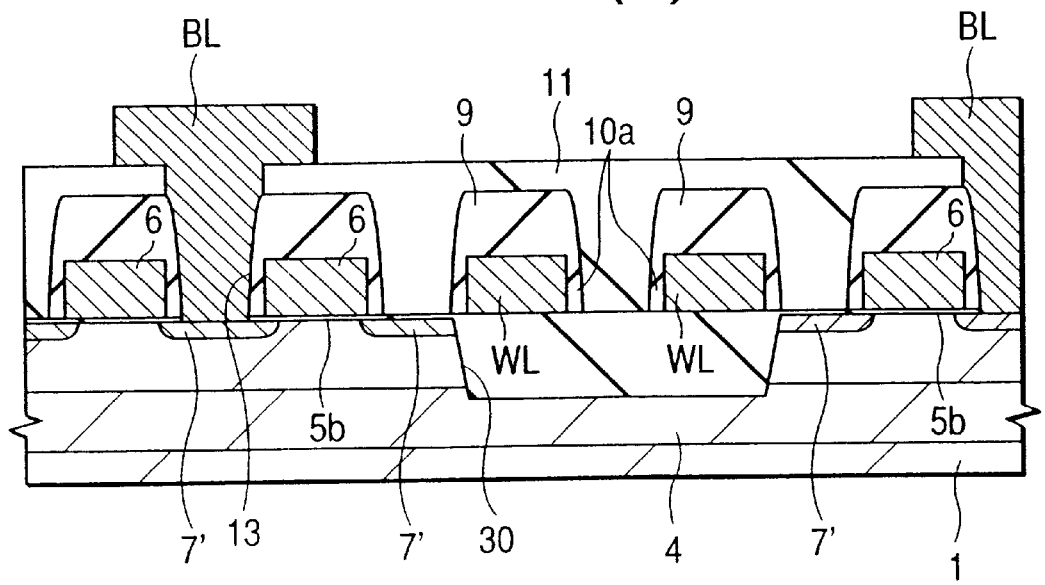
Figure 44B:
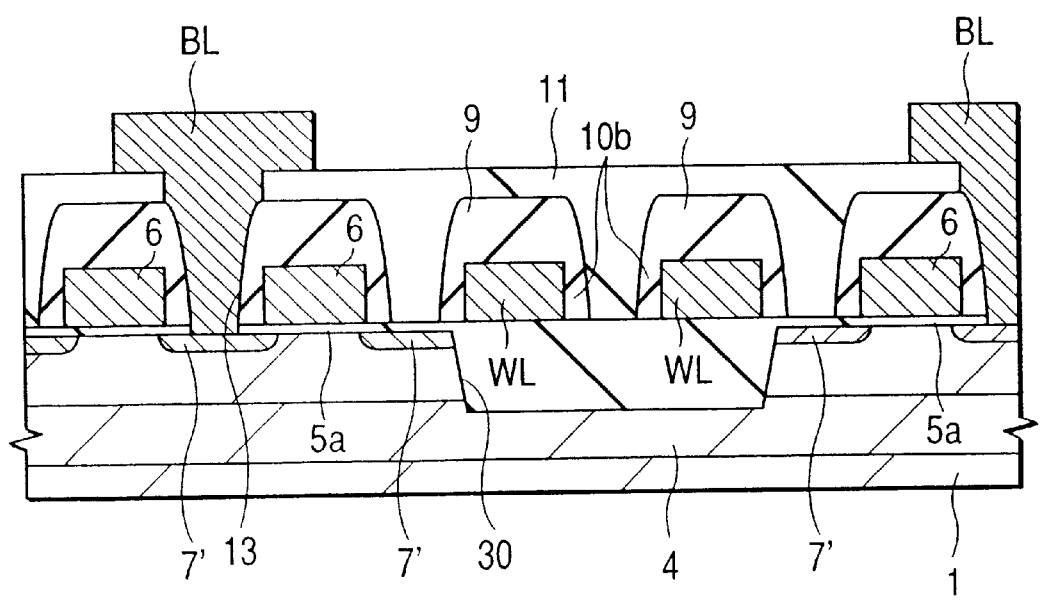

Next, as shown in FIG. 44, the silicon oxide film 11 deposited on the semiconductor substrate 1 by a CVD method is etched to form the contact holes 13. After this, conductive films deposited on the silicon oxide film 11 such as the polycrystalline silicon film doped with P (phosphor) and the WSi$_2$ (tungsten silicide) film are patterned to form the bit lines BL.

Figure 45A:
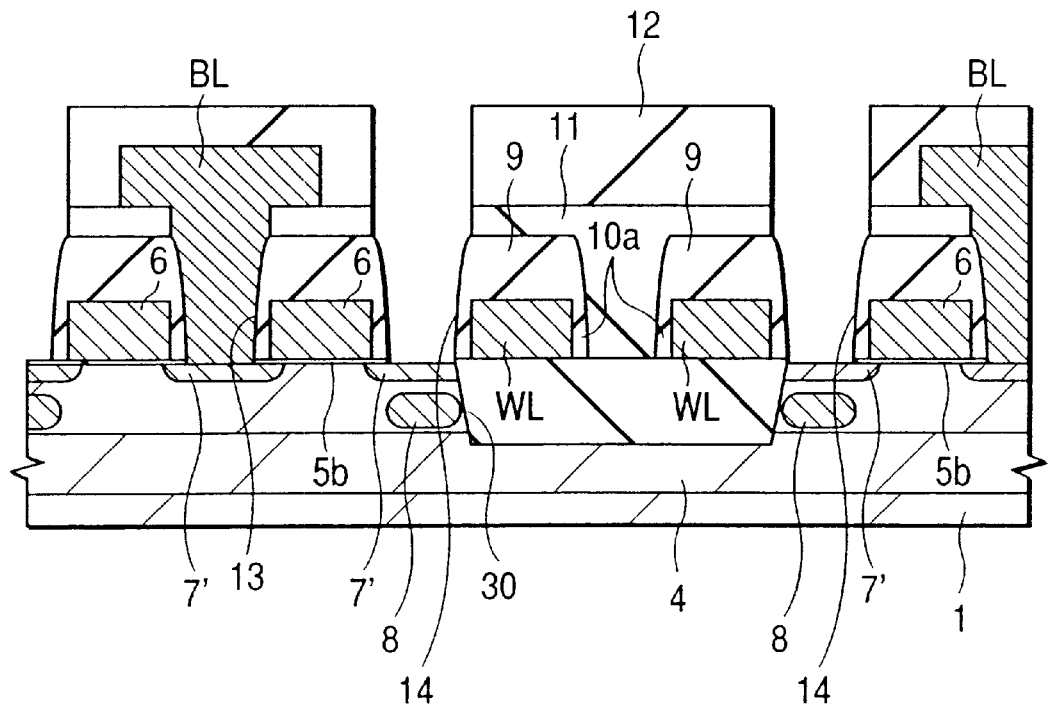
Figure 45B:
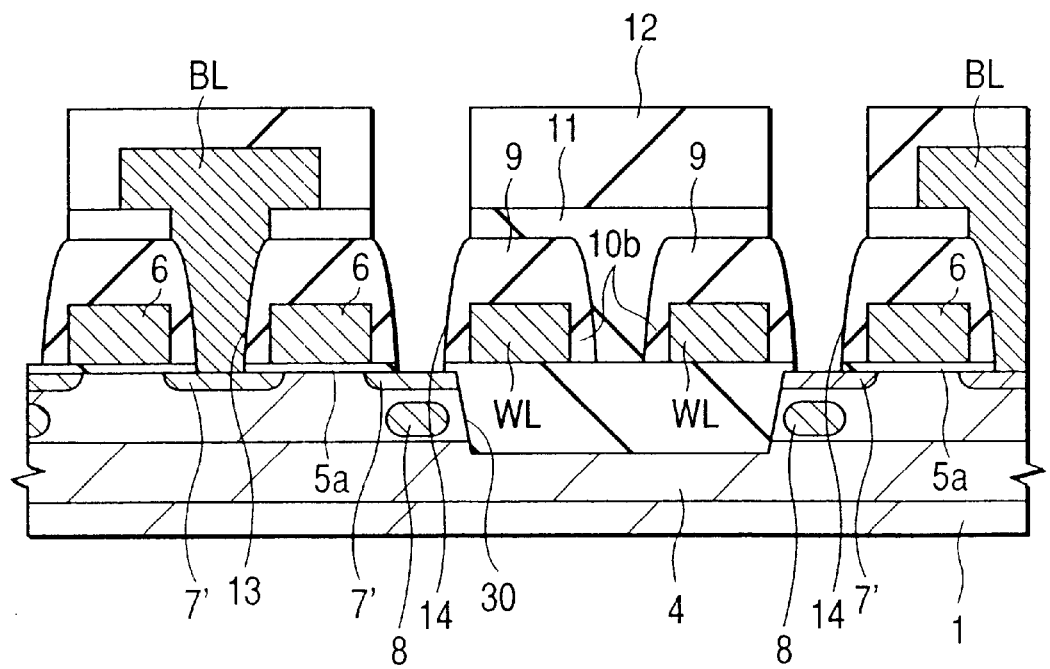

Next, as shown in FIG. 45, a silicon oxide film 12 deposited on the semiconductor substrate 1 by a CVD method, and the underlying silicon oxide film 11 are etched to form the contact holes 14. After this, the field relaxing n-type semiconductor layer (the field relaxation layer) 8 is formed under the individual n-type semiconductor regions 7' (the source, drain) of the memory cell selecting MISFETs Qs, Qr by implanting the semiconductor substrate 1 with ions of P (phosphor) through the contact holes 14.

Figure 46A:
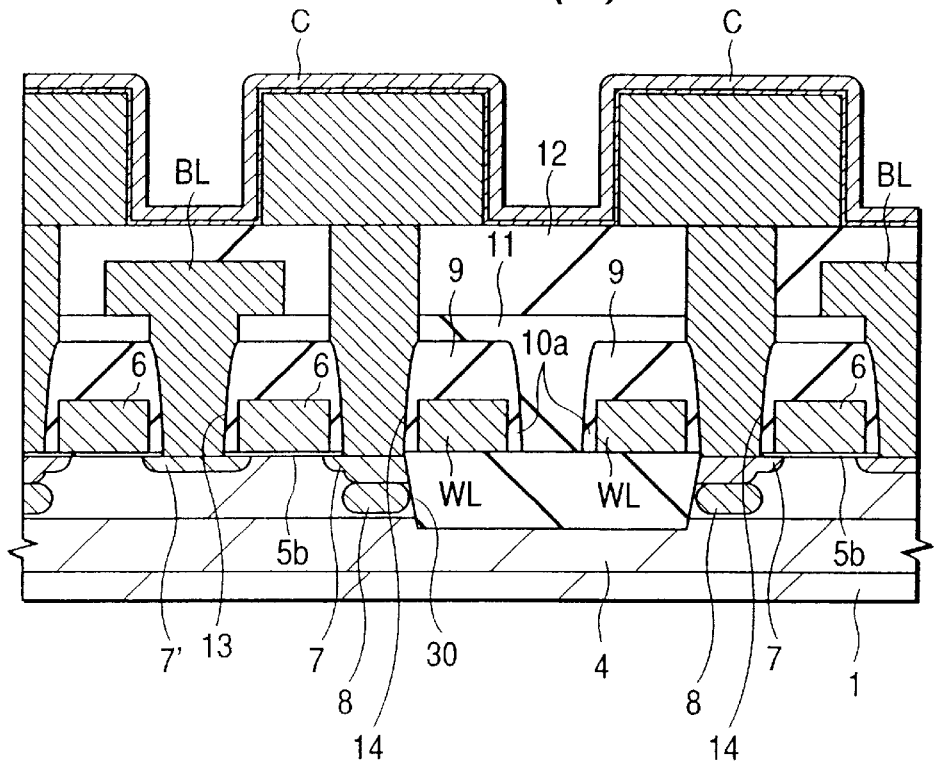
Figure 46B:
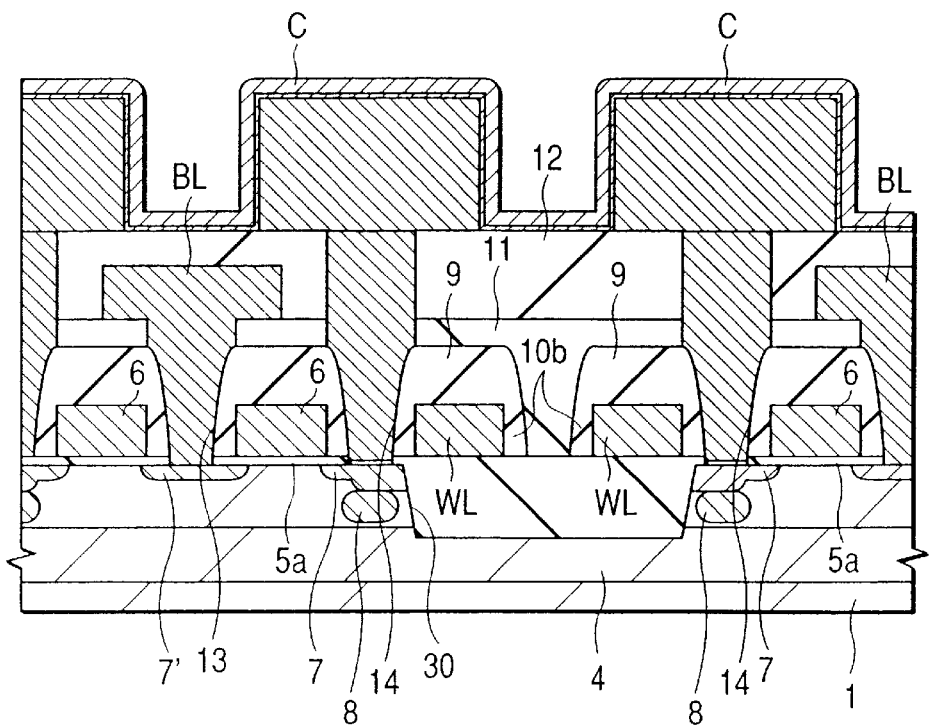

After this, as shown in FIG. 46, the plugs 15 of polycrystalline silicon are formed in the contact holes 14. Next, the semiconductor substrate 1 is subjected to a heat treatment to diffuse the n-type impurity (e.g., P (phosphor)) in the polycrystalline silicon film into the n-type semiconductor regions 7' thereby to form the n-type semiconductor regions 7 (the source, drain) of a high impurity concentration. After this, the information storing capacitive elements C are formed over the plugs 15.

In this embodiment, the side wall spacers 10b on the side walls of the gate electrodes 6 of the relief cells are made thicker than the side wall spacers 10a on the side walls of the gate electrodes 6 of the normal cells. As a result, the spacing between the n-type semiconductor regions 7 of a high impurity concentration, formed by the impurity distribution from the plugs 15 in the contact holes 14, and the gate electrodes 6 (the word lines WL) of the memory cell selecting MISFETs Qr can be enlarged to relax the junction field at the end portions of the gate electrodes 6 thereby to extend the information holding time of the relief cells.

In this embodiment, moreover, the gate oxide film 5a of the memory cell selecting MISFETs Qr of the relief cells is made thicker than the gate oxide film 5b of the memory cell selecting MISFETs Qs of the normal cells. As a result, the p-impurity concentration of the impurity layer (the channel region) necessary to control the threshold voltage (Vth) can be lowered to relax the junction field at the end portions of the gate electrodes 6 thereby to extend the information holding time of the relief cells.

In this embodiment, not only the film thickness of the side wall spacers formed on the side walls of the gate electrodes 6 of the relief cells, but also the film thickness of the gate oxide film are increased. However the effect of extending the information holding time of the relief cells could be achieved by only one of them.

The element isolation structure of this embodiment, in which the silicon oxide film 31 is buried in the grooves 30a formed by etching the semiconductor substrate 1, can also be applied to the DRAMs of the foregoing Embodiments 1 to 5.

(Embodiment 7)

Figure 47:
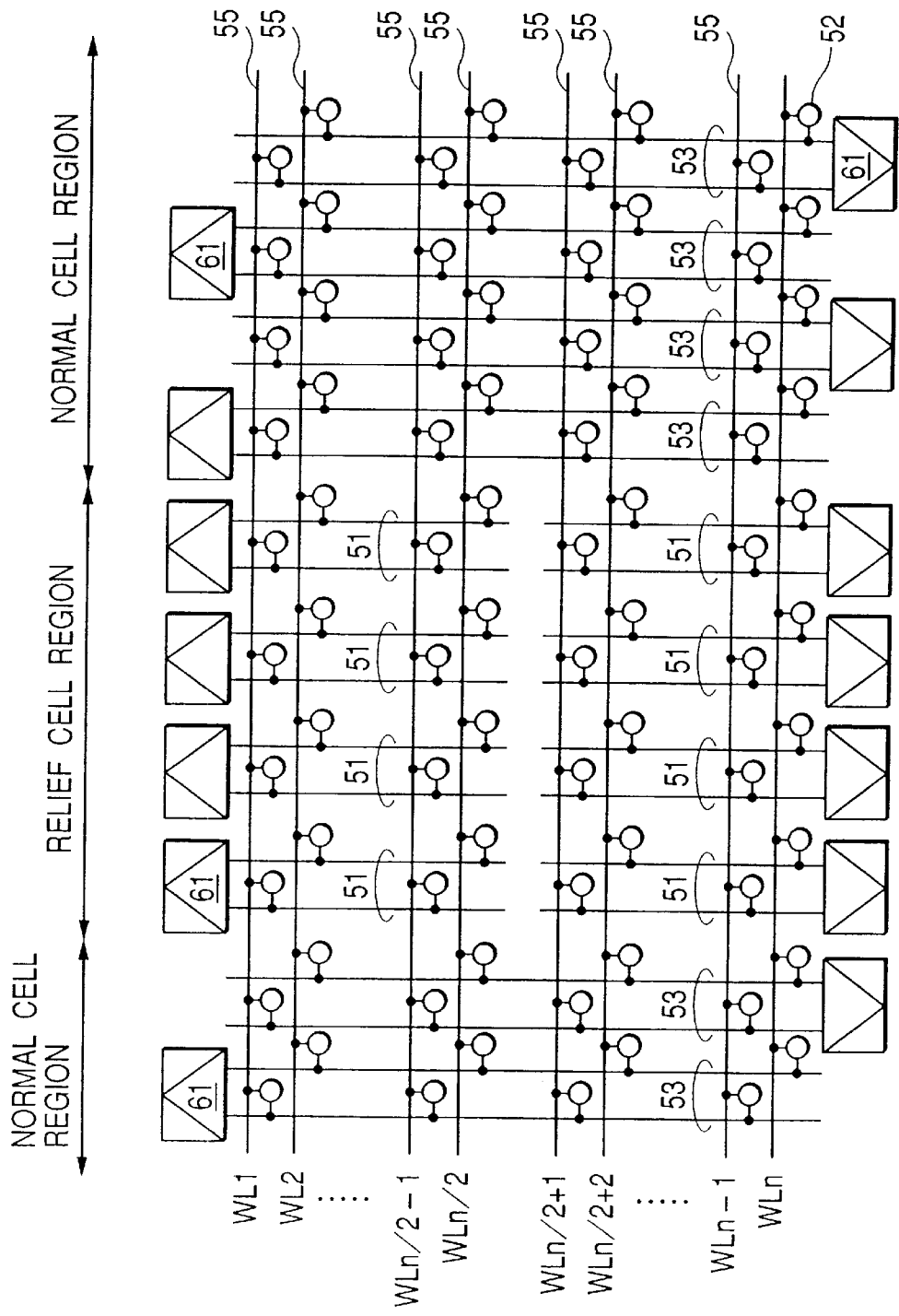
FIG. 47 is a circuit diagram showing a DRAM of Embodiment 7 of the invention.

FIG. 47 is a circuit diagram showing a portion (the region having the normal memory cells and the region having the relief cells) of the DRAM of this embodiment.

In the DRAM of this embodiment, as shown, the number of relief cells connected with one of redundant bit lines 51 to be used for the relief is made smaller than that of the normal cells connected with one of normal bit lines 53. In FIG. 47, reference numerals 55 designate the word lines (WL), and numerals 61 designate the sense amplifiers.

In this embodiment, the signal voltage fall caused by the bit line capacitance can be prevented to extended the information holding time of the relief cells accordingly. As a result, the shortest information holding time of the relief cells can be extended to about 200 msec. Moreover, the faulty product percentage concerning the aforementioned standards can be reduced to about 2%. When the number of normal cells to be connected with the normal bit lines 53 is set to 1, reducing the number of relief cells to be connected with one of the redundant bit lines 51 to ½ or ¼ is convenient in view of the information processing.

Figure 48:
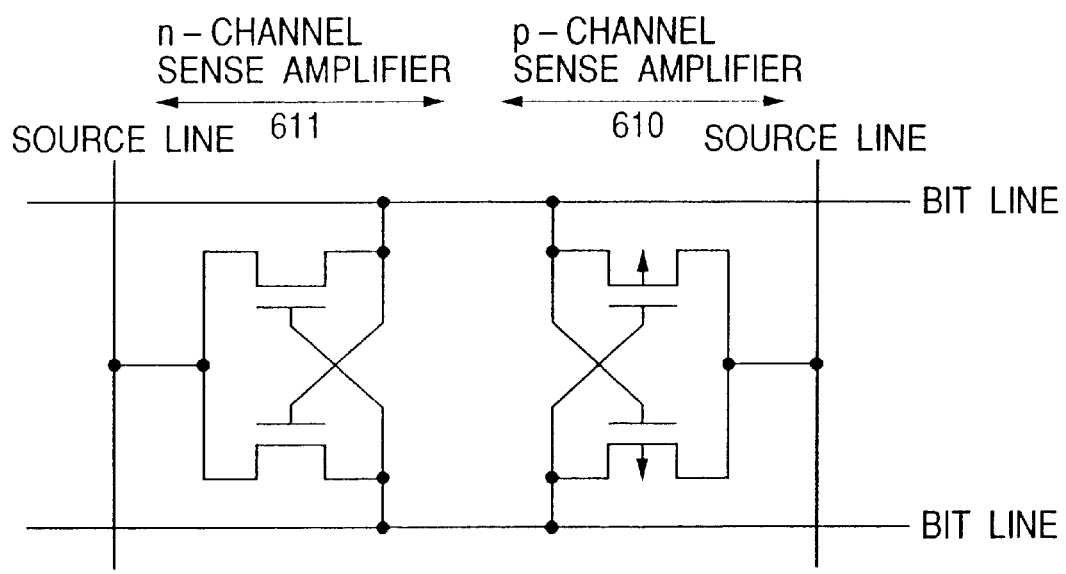
FIG. 48 is a circuit diagram showing a sense amplifier of the DRAM of Embodiment 7 of the invention.
Figure 49:
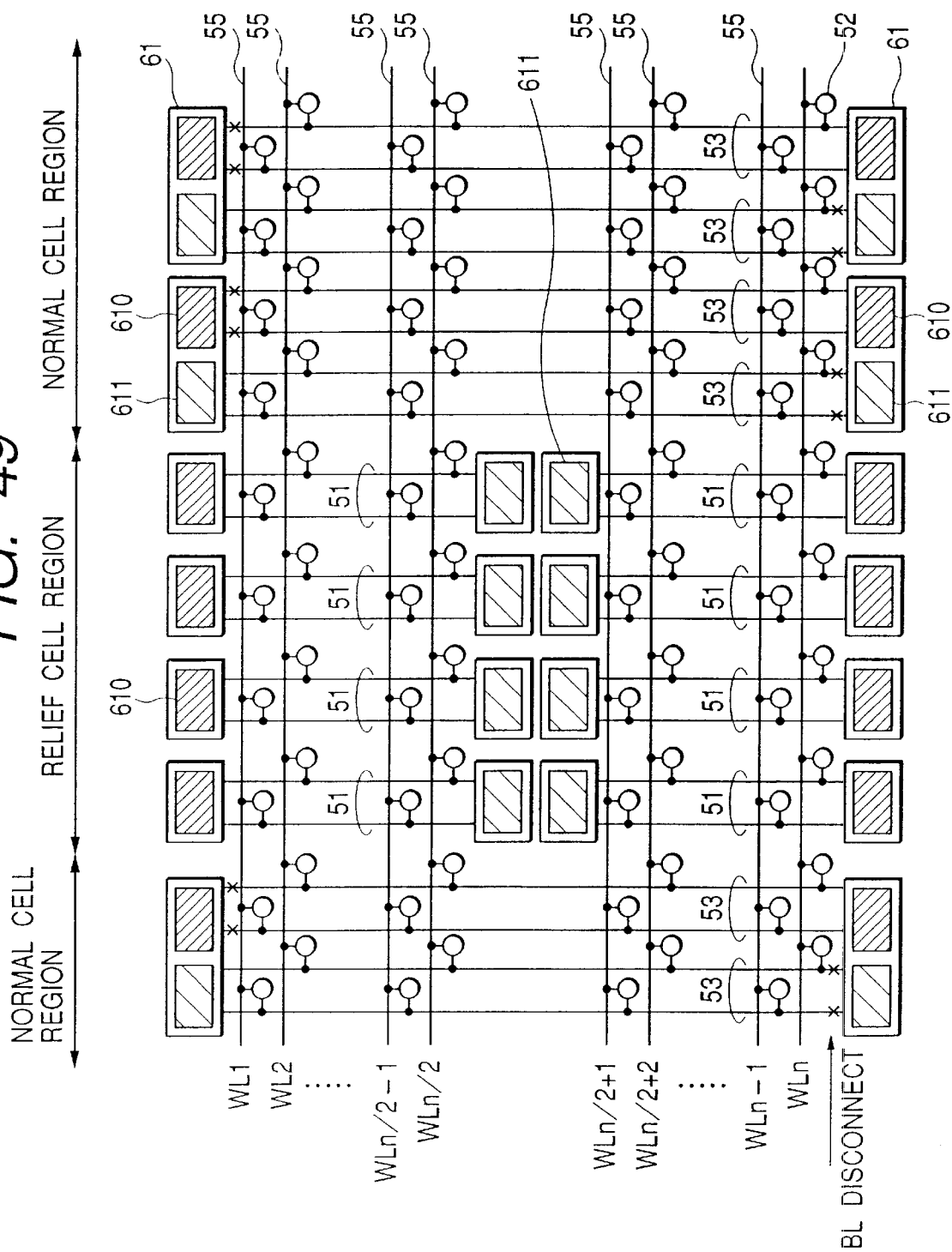
FIG. 49 is a circuit diagram showing the DRAM of Embodiment 7 of the invention.

In this embodiment, a p-channel sense amplifier 610 and an n-channel sense amplifier 611 of the sense amplifier 61 constituted of a circuit shown in FIG. 48, can be arranged as shown in FIG. 49. As a result, the layout pitch of the sense amplifier 61 of the relief cell region can be reduced to one half of the normal cell region, so that the sense amplifier 61 does not obstruct the miniaturization.

(Embodiment 8)

Figure 50:
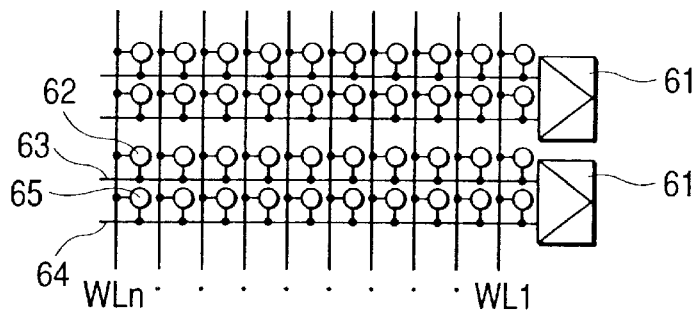
FIG. 50 is a circuit diagram showing a DRAM of Embodiment 8 of the invention.

In the DRAM of this embodiment, as shown in FIG. 50, with the sense amplifier 61 to be used for the relief, there are connected a first bit line 63 or a signal line of the information of a noted bit (e.g., a cell 62) and a second bit line 64 or a signal line of the opposite information to the noted bit, one (e.g., the cell 62) of the two cells to be selected by a predetermined word line is connected with the first bit line 63 whereas the other cell (e.g., a cell 65) is connected with the second bit line 64. In short, the relief cells are so constructed that one piece of information is held by the two cells (e.g., the cell 62 and the cell 65).

Figure 51:
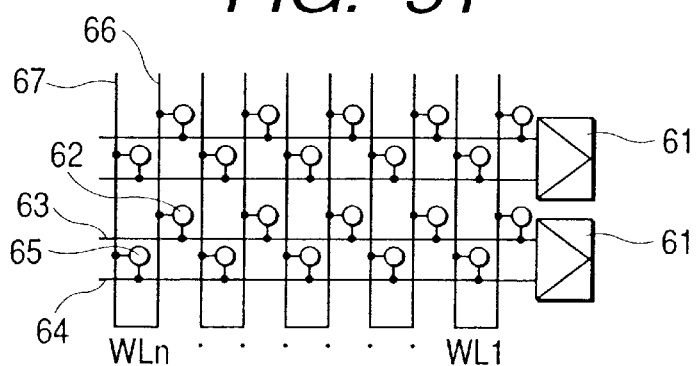
FIG. 51 is a circuit diagram showing the DRAM of Embodiment 8 of the invention.

A specific example of this construction is shown in FIG. 51. In this example, with the sense amplifier 61 to be used for the relief, there are connected the first bit line 63 or the signal line of the information of the noted bit (e.g., the cell 62) and the second bit line 64 or the signal line of the opposite information of the noted bit, so that one of the two word lines to be simultaneously selected selects the cell (e.g., the cell 62) connected with the first bit line 63 whereas the other selects the cell (e.g., the cell 65) connected with the second bit line 64.

Figure 52:
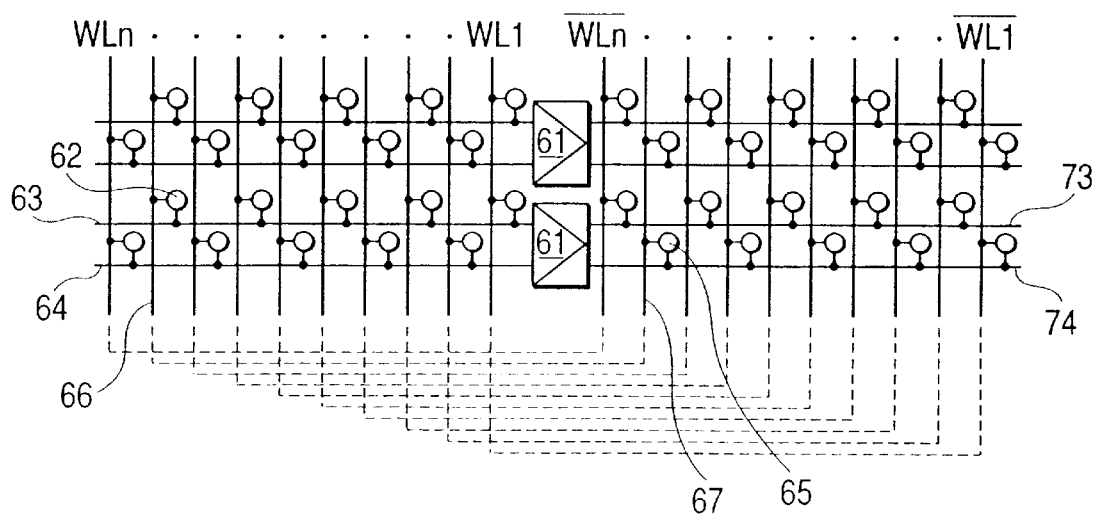
FIG. 52 is a circuit diagram showing the DRAM of Embodiment 8 of the invention.

Another specific example of the aforementioned construction is shown in FIG. 52. In this example, with the sense amplifier 61 to be used for the relief, there are connected four bit lines (e.g., the bit lines 63, 64, 73 and 74). Of these, two bit lines (e.g., the bit lines 63 and 73) are the signal lines of the information of the noted bit (e.g., the cell 62), whereas the other two bit lines (e.g., the bit lines 64 and 74) are the signal lines of the opposite information of the noted bit. Moreover, one (e.g., a word line 66) of the two word lines to be simultaneously selected selects the cell (e.g., the cell 62) which is connected with one (e.g., the bit line 63) of the two bit lines or the signal lines of the information of the noted bit, whereas the other (e.g., a word line 67) selects the cell (e.g., the cell 65) which is connected with one (e.g., the bit line 74) of the two bit lines or the signal lines of the opposite information of the noted bit.

From the examples described above, there can be attained the following effects. In the first case in which the information of the noted bit (e.g., the cell 62) is "1" information (the state in which the storage electrode is charged positively with respect to the plate electrode), the junction reverse bias is so high that the information is broken by the high junction leakage current and capacitor leakage current to shorten the information holding time. In the noted bit (e.g., the cell 62) and the opposite-phase bit (e.g., the cell 65), in which the noted bit and "0" information (the state in which the storage electrode is charged negatively with respect to the plate electrode) are simultaneously written, the information is broken by the capacitor leakage current. However, since the information (charge) is supplied by the junction leakage current, it is not broken unless the capacitor leakage current exceeds the junction leakage current. In other words, in this embodiment in which one information is held by two relief cells (e.g., the cells 62 and 65), the fault percentage of the relief cells can be reduced to one half of the normal cells.

In the aforementioned examples, the junction leakage current for the "1" information is 10 fA/bit, and the junction leakage current causing a fault at a probability of about 10 ppm is 500 fA/bit. The capacitor leakage current for the "1" information is 0.1 fA/bit. As a result, the "1" information is broken substantially by the junction leakage current whether or not a faulty junction leakage exists. Meanwhile, the capacitor leakage current for the "0" information is 0.1 fA/bit, and the junction leakage current is 5 fA/bit. When the noted bit (or the cell 62) is the "1" information, therefore, the information is broken by the junction leakage, so that even if the potential of the bit line 63 cannot be amplified, the "0" information in the opposite phase to the noted bit (the cell 65) is not broken, and hence the potentials at the bit lines 64 and 74 can be amplified to the "0" information. As a result, the bit lines 63 and 73 are set to the potential of the "1" information opposit to that of the bit lines 64 and 74. In other words, the "1" information of the noted bit (the cell 62) is resultantly amplified to the "1" information, so that no information is broken. In the case of the "0" information, however, the capacitor leakage current may exceed the junction leakage current at a probability of about 1 ppm. Hence, it cannot be said that the "0" information is not broken.

In the foregoing examples, the fault of the "1" information occurring at a probability of about 10 ppm is compensated with the "0" information, and the fault of the "0" information occurring at a probability of about 1 ppm is compensated with the "1" information, so that the information breakage does not occur unless the two faults occur simultaneously. The probability of the simultaneous occurrence of the two faults is about $1 \times 10^{-10}$ so that the faulty product percentage after the relief is about $1 \times 10^{-4}$ (0.01%) even if the fault of 300 bits is relieved by 300 Kbits.

Here, the size of the relief cells was equalized to that of the normal cells. Then, the increase in the chip area was about 0.1%. Even if the standard for the refresh time is set to 500 msec to relieve the fault of 10,000 bits, it is expected that the faulty product percentage after the relief is about 1%. It can be said that the future problem that the number of relief bits will increase with the increase in the degree of integration can be solved substantially completely by this embodiment.

Figure 53:
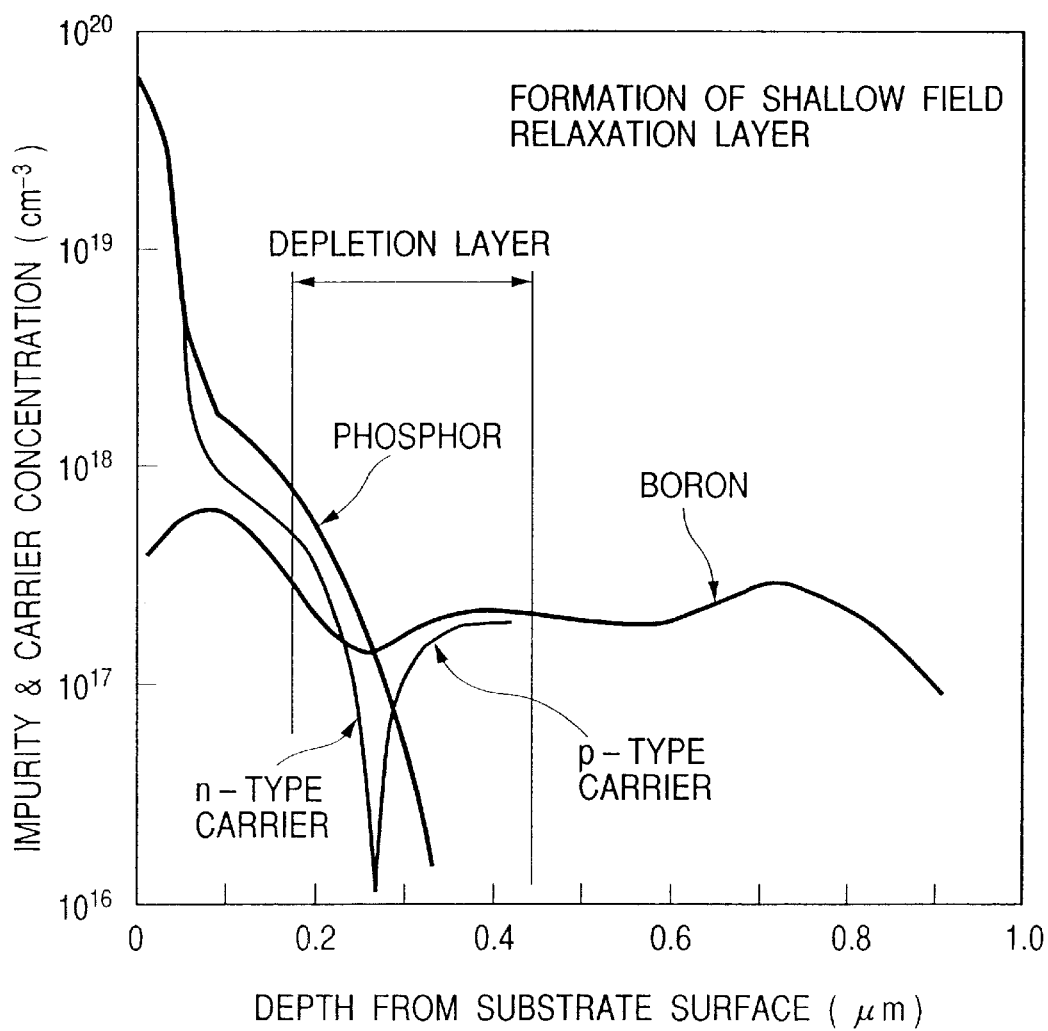
FIG. 53 is a graph illustrating the impurity concentration profile of a storage node part of a normal cell.
Figure 54:
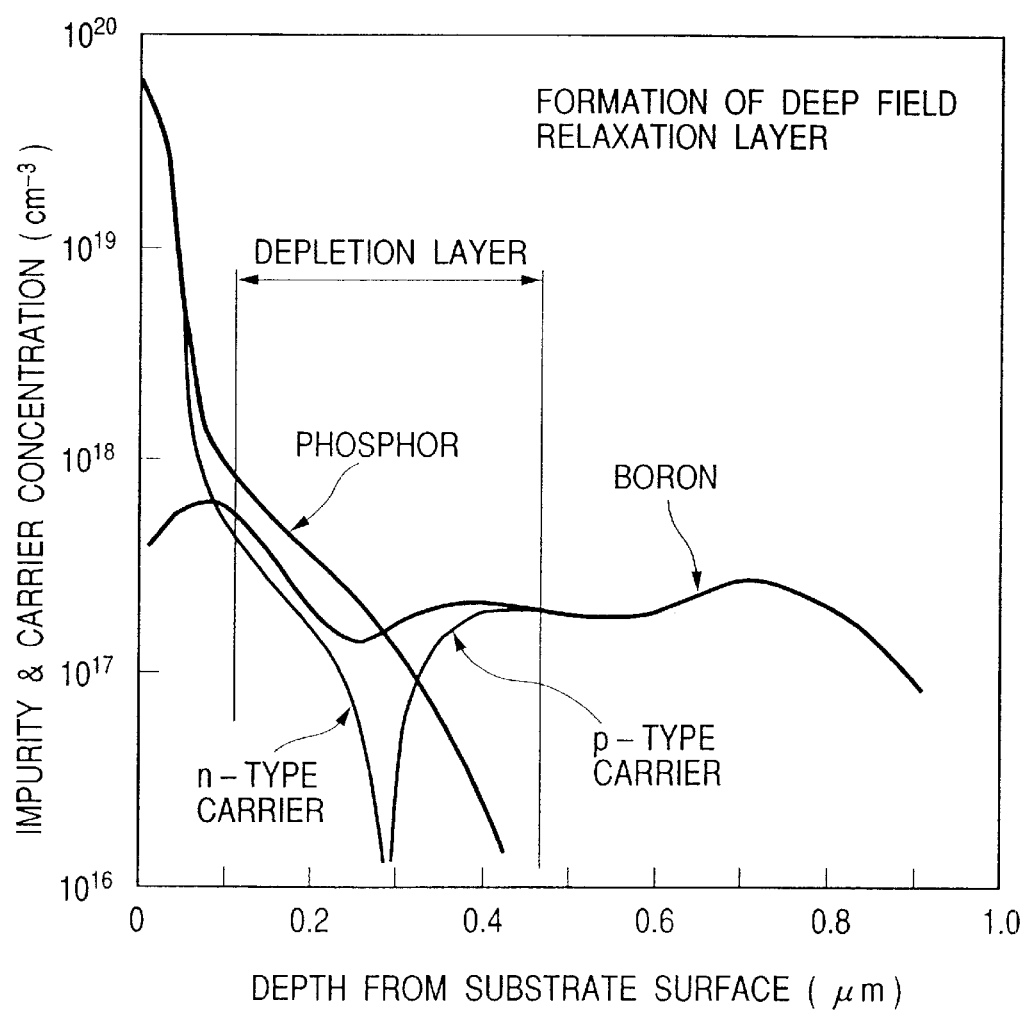
FIG. 54 is a graph illustrating the impurity concentration profile of a storage node part of a relief cell.

FIG. 53 is a graph showing the impurity concentration profiles of the storage node portion of the normal cells, and FIG. 54 is a graph illustrating the impurity concentration profiles of the storage node portion of the relief cells. Here is illustrated the case in which the depth of the field relaxation layers of the relief cells is made 1.5 times as large as that of the normal cells.

In the relief cells where the field relaxation layer formed by the implantation of ions of P (phosphor) is made deeper and less doped than the normal cells, as illustrated in FIG. 54, the phosphor concentration distribution is gentle, and the gradients of the n-type carrier distribution and the p-type carrier distribution at the junction are gentle. As a result, the extension of the depletion layer at the same reverse voltage increases to about 1.5 times, so that the electric field is reduced by about 30%. The field lowering effect is about 10% for the gentle gradient of the carrier distribution and about 20% for the extension of the depletion layer.

Although the invention made by the present inventor has been specifically described in connection with its embodiments, it should not be limited thereto but could naturally be modified in various manners without departing from the gist thereof.

It goes without saying that embodiments which are combinations of the constructions of Embodiments 1 to 8 properly should be included in the invention.

The effects to be obtained by representatives of the aspects of the invention disclosed herein will be briefly described in the following.

According to the invention, the refresh time of the relief cells of the DRAM can be extended without inviting any large increase in the chip area and any complexity in the process, so that the faulty product percentage after the relief can be reduced.

What is claimed is:

1. A semiconductor integrated circuit device comprising a DRAM having a plurality of memory cells formed in a memory array and including relief cells, wherein a sense amplifier to be used for relief is connected with a first bit line or a first signal line of the information of a noted bit and a second bit line or a second signal line of the opposite information of said noted bit, and wherein one of two cells to be selected by a predetermined word line is connected with said first bit line whereas the other cell is connected with said second bit line.

2. A semiconductor integrated circuit device comprising a DRAM having a plurality of memory cells formed in a memory array and including relief cells, wherein a sense amplifier to be used for relief is connected with a first bit line or a first signal line of the information of a noted bit and a second bit line or a second signal line of the opposite information of said noted bit, and wherein one of two word lines to be simultaneously selected selects the cell connected with said first bit line whereas the other selects the cell connected with said second bit line.

3. A semiconductor integrated circuit device comprising a DRAM having a plurality of memory cells formed in a memory array and including relief cells, wherein a sense amplifier to be used for a relief is connected with two first bit lines or first signal lines of the information of a noted bit and two second bit lines or second signal lines of the opposite information of said noted bit, and wherein one of two word lines to be simultaneously selected selects the cell connected with one of said two first bit lines whereas the other selects the cell connected with one of said two second bit lines.

* * * * *